US012810923B2

(12) United States Patent
Roy

(10) Patent No.: US 12,810,923 B2
(45) Date of Patent: Nov. 24, 2026

(54) SINGLE-ENDED SENSE AMPLIFIERS AND METHODS FOR OPERATING SAME

(71) Applicant: Atomera Incorporated, Los Gatos, CA (US)

(72) Inventor: Richard S. Roy, Lago Vista, TX (US)

(73) Assignee: Atomera Incorporated, Los Gatos, CA (US)

( * ) Notice: Subject to any disclaimer, the term of this patent is extended or adjusted under 35 U.S.C. 154(b) by 54 days.

(21) Appl. No.: 19/002,313

(22) Filed: Dec. 26, 2024

(65) Prior Publication Data

US 2025/0124971 A1 Apr. 17, 2025

Related U.S. Application Data

(63) Continuation-in-part of application No. 18/399,579, filed on Dec. 28, 2023.

(Continued)

(51) Int. Cl.
*G11C 16/04* (2006.01)
*G11C 5/06* (2006.01)
(Continued)

(52) U.S. Cl.
CPC .......... *G11C 11/4091* (2013.01); *G11C 5/063* (2013.01); *G11C 11/4097* (2013.01)

(58) Field of Classification Search
CPC .. G11C 11/4091; G11C 11/4097; G11C 5/063
See application file for complete search history.

(56) References Cited

U.S. PATENT DOCUMENTS 5,438,543 A 8/1995 Yoon
5,712,825 A 1/1998 Hadderman et al.
(Continued)

FOREIGN PATENT DOCUMENTS

CN 112771669 A 5/2021
CN 115335908 A 11/2022
(Continued)

OTHER PUBLICATIONS

Emilio, Maurizio Di Paolo, "Quantum-Engineered Material Boosts Transistor Performance" https://www.eetrimes.com/quantum-engineered-material-boosts-transistor-performance/# EE Times; retrieved from Internet Feb. 10, 2022, 3 pages.
(Continued)

*Primary Examiner* — Pho M Luu
(74) *Attorney, Agent, or Firm* — Bever, Hoffman & Harms, LLP

(57) ABSTRACT

A bit line is pre-charged to ground. First and second nodes of a latch are coupled to ground and a reference voltage, respectively. A DRAM bitcell is activated, thereby coupling a DRAM cell capacitor to the bit line, and developing a read voltage on the bit line. The bit line is isolated from the latch when the DRAM bitcell is activated. The first node is decoupled from ground, and the bit line is then coupled to the first node, thereby developing the read voltage on the first node. Then, the second node is de-coupled from the reference voltage, and the bit line is isolated from the first node. The latch is activated, amplifying the voltage difference between the first and second nodes, resulting in a read data voltage on the first node. The bit line is recoupled to the first node, applying the read data voltage to the bit line.

30 Claims, 35 Drawing Sheets

Related U.S. Application Data

(60) Provisional application No. 63/708,219, filed on Oct. 16, 2024, provisional application No. 63/685,629, filed on Aug. 21, 2024, provisional application No. 63/477,942, filed on Dec. 30, 2022.

(51) Int. Cl.
*G11C 11/4091* (2006.01)
*G11C 11/4097* (2006.01)

(56) References Cited

U.S. PATENT DOCUMENTS

| | | | | |
|---|---|---|---|---|
| 5,822,264 | A | 10/1998 | Tomishima et al. | |
| 6,058,061 | A | 5/2000 | Ooishi | |
| 6,111,803 | A | 8/2000 | Derner et al. | |
| 6,226,754 | B1 | 5/2001 | Ware et al. | |
| 6,570,781 | B1 | 5/2003 | Lee et al. | |
| 6,636,454 | B2 | 10/2003 | Fujino et al. | |
| 7,454,593 | B2 | 11/2008 | Kirsch | |
| 7,570,531 | B2 | 8/2009 | Nakamura et al. | |
| 7,768,321 | B2 * | 8/2010 | Chang | G11C 7/067 327/51 |
| 7,848,166 | B2 | 12/2010 | Hsu et al. | |
| 7,929,367 | B2 | 4/2011 | Yoo et al. | |
| 8,164,941 | B2 | 4/2012 | Kang et al. | |
| 8,243,486 | B2 | 8/2012 | Riho | |
| 8,320,208 | B2 * | 11/2012 | Kajigaya | G11C 7/06 365/207 |
| 8,605,532 | B2 | 12/2013 | Kajigaya et al. | |
| 9,281,023 | B2 * | 3/2016 | Arsovski | G11C 7/067 |
| 10,324,760 | B2 | 6/2019 | Meswani | |
| 10,622,057 | B2 | 4/2020 | Kawamura et al. | |
| 11,094,355 | B1 | 8/2021 | Simon et al. | |
| 11,699,695 | B2 | 7/2023 | Lee | |
| 11,750,196 | B1 | 9/2023 | Kandukuri et al. | |
| 11,822,617 | B2 | 11/2023 | Zheng | |
| 12,250,807 | B2 | 3/2025 | Kim et al. | |
| 2001/0012214 | A1 | 8/2001 | Akita et al. | |
| 2002/0110016 | A1 | 8/2002 | Ooishi et al. | |
| 2002/0181307 | A1 | 12/2002 | Fifield et al. | |
| 2004/0190362 | A1 | 9/2004 | Hosokawa et al. | |
| 2006/0243963 | A1 | 11/2006 | Kreps et al. | |
| 2008/0025113 | A1 | 1/2008 | Kitagawa | |
| 2009/0251948 | A1 | 10/2009 | Kajigaya et al. | |
| 2011/0063891 | A1 | 3/2011 | Kajigaya | |
| 2011/0248697 | A1 | 10/2011 | Kajigaya et al. | |
| 2012/0099389 | A1 | 4/2012 | Park et al. | |
| 2013/0240744 | A1 | 9/2013 | Hurst, Jr. et al. | |
| 2013/0270422 | A1 | 10/2013 | Grinberg et al. | |
| 2014/0063992 | A1 | 3/2014 | Yoshida | |
| 2014/0085959 | A1 | 3/2014 | Saraswat et al. | |
| 2014/0169069 | A1 | 6/2014 | Oh | |
| 2014/0293715 | A1 | 10/2014 | Barth, Jr. et al. | |
| 2015/0206556 | A1 | 7/2015 | Song et al. | |
| 2015/0357002 | A1 | 12/2015 | Ware et al. | |
| 2017/0301679 | A1 | 10/2017 | Masuoka et al. | |
| 2018/0358059 | A1 | 12/2018 | Manning et al. | |
| 2019/0043869 | A1 | 2/2019 | Masuoka et al. | |
| 2019/0157166 | A1 | 5/2019 | Masuoka et al. | |
| 2019/0187930 | A1 | 6/2019 | Chinnakkonda Vidyapoornachary et al. | |
| 2019/0267074 | A1 | 8/2019 | Fishburn et al. | |
| 2020/0176420 | A1 | 6/2020 | Or-Bach et al. | |
| 2020/0258897 | A1 | 8/2020 | Yan et al. | |
| 2021/0011645 | A1 | 1/2021 | Martinelli et al. | |
| 2021/0193245 | A1 | 6/2021 | Ryu et al. | |
| 2021/0382804 | A1 | 12/2021 | Alrod et al. | |
| 2022/0100404 | A1 | 3/2022 | Martinelli et al. | |
| 2022/0285367 | A1 | 9/2022 | Fackenthal | |
| 2022/0326958 | A1 | 10/2022 | Ganguly et al. | |
| 2022/0335283 | A1 | 10/2022 | Woo et al. | |
| 2023/0079504 | A1 | 3/2023 | Manning | |
| 2023/0130696 | A1 | 4/2023 | Sollie et al. | |
| 2023/0130969 | A1 | 4/2023 | Dutu et al. | |
| 2023/0223088 | A1 | 7/2023 | Lee et al. | |
| 2023/0259283 | A1 | 8/2023 | Kim et al. | |
| 2023/0363150 | A1 | 11/2023 | Roy et al. | |
| 2024/0221823 | A1 | 7/2024 | Roy | |

FOREIGN PATENT DOCUMENTS

| | | | |
|---|---|---|---|
| GB | 2347520 | A | 9/2000 |
| TW | I277983 | B | 4/2007 |
| TW | 200816373 | A | 4/2008 |
| TW | I398875 | B | 6/2013 |
| TW | I585774 | B | 6/2017 |

OTHER PUBLICATIONS

Jedec Standard—High Bandwidth Memory DRAM (HBM3), JESD238A (Revision of JESD238, Jan. 2022), Jan. 2023, JEDEC Solid State Technology Association, 270 pages.
Luo et al., "Chemical Design of Direct-Gap Light-Emitting Silicon" published in Physical Review Letters, vol. 89, No. 7; Aug. 12, 2002, 4 pages.
Mears et al., "Simultaneous Carrier Transport Enhancement and variability reduction in Si MOSFETs by insertion of partial Monolayers of oxygen" IEEE Silicon Nanoelectronics Workshop (2012); Conference Date Jun. 10-11, 2012, 2 pages.
Novikov et al. "Silicon-based Optoelectronics" 1999-2003, pp. 1-6.
Tsu, R. "Si Based Green ELD: Si-Oxygen Superlattice" ysiwyg://I/http://www3.interscience,wiley.com/cgi-bin/abstract/72512946/start: published online Jul. 21, 2000; 2 pages, Abstract Only.
Tsu, R. "Phenomena in silicon nanostructure device" published online Sep. 6, 2000 by Applied Physics and Materials Science Processing, pp. 391-402.
Xu et al. "Effectiveness of Quasi-Confinement Technology for Improving P-channel Si and Ge MOSFET Performance" Department of Electrical Engineering and Computer Science, University of California, Berkeley, 2012, 2 pages, mearstech.net; retrieved from Internet Jan. 18, 201.
Xu et al., "Extension of planar bulk n-channel MOSFET scaling with oxygen insertion technology" IEEE Transactions on Electron Devices, vol. 61, No. 9; Sep. 2014, pp. 3345-3349.
Xu et al., "MOSFET performance and scalability enhancement by insertion of oxygen layers", Department of Electrical Engineering and Computer Science, University of California, Berkeley, 2012, pp. 1-4.

* cited by examiner

SINGLE-ENDED SENSE AMPLIFIERS AND METHODS FOR OPERATING SAME

PRIORITY APPLICATIONS

This application is a continuation-in-part of U.S. patent application Ser. No. 18/399,579 entitled "Dynamic Random Access Memory System Including Single-Ended Sense Amplifiers And Methods For Operating Same", filed Dec. 28, 2023, by Richard S. Roy, and claims priority to U.S. Provisional Patent Application 63/685,629 entitled "Multi-Threaded Dynamic Random Access Memory Systems And Methods Of Operating Same", filed by Richard S. Roy on Aug. 21, 2024, and also claims priority to U.S. Provisional Patent Application 63/708,219 entitled "Single-Ended Sense Amplifier Structures And Methods For Operating Same", by Richard S. Roy on Oct. 16, 2024.

FIELD OF THE INVENTION

The present invention relates to dynamic random access memory (DRAM) systems. More specifically, the present invention relates to single-ended sense amplifiers for use in DRAM systems, and methods for operating such single-ended sense amplifiers.

BACKGROUND

DRAM has been used in many system configurations to provide data storage for applications such as machine learning. As these applications become more complicated, it becomes more difficult to provide DRAM systems capable of handling all of the access requirements of these applications (e.g., random access bandwidth, latency, power, random access ability, memory capacity and density, refresh). JEDEC standard No. 238A describes specifications for a high bandwidth memory (HBM3) DRAM, which is coupled to a host computer die with a distributed interface. The HBM3 DRAM uses a wide-interface architecture in an attempt to achieve high-speed, low power operation. However, there is a need to have an improved DRAM system that exhibits an increased random access bandwidth, reduced access latency, reduced operating/standby power, improved random access capability, increased memory capacity capabilities, higher memory density, and an improved refresh scheme. Current HBM architectures focus on extending the current paradigm by increasing the data bandwidth for large data block accesses (with a significant power penalty for the analog circuits required to achieve data rates approaching 10 Gb/sec/pin) with very low ability to apply random (or nearly random) addresses at a high rate. It would therefore be desirable to have an improved DRAM system capable of overcoming the above-described deficiencies of conventional DRAM systems.

SUMMARY

Accordingly, the present invention focuses on single-ended sense amplifiers for use in a DRAM system. Such single-ended sense amplifiers advantageously reduce operating voltages, power consumption and required layout area of the DRAM system.

In accordance with one embodiment, the present invention includes a method for operating a single-ended sense amplifier coupled to a bit line of an array of DRAM bit cells. The method includes pre-charging the bit line to ground, coupling a first internal node of a latch circuit to ground, and coupling a second internal node of the latch circuit to a reference voltage (Vref). A word line voltage applied to the gate of an access transistor of a DRAM bit cell is activated, thereby coupling a cell capacitor of the DRAM bit cell to the bit line, thereby developing a read voltage on the bit line. The bit line is isolated from the latch circuit when the word line voltage is initially activated.

The first internal node of the latch circuit is decoupled from ground, and then the bit line is coupled to the first internal node of the latch circuit, wherein the read voltage developed on the bit line is applied to the first internal node of the latch circuit. Then, the second internal node of the latch circuit is de-coupled from the reference voltage, and the bit line is isolated from the first internal node of the latch circuit.

The latch circuit is then activated, wherein the activated latch circuit amplifies a difference between the read voltage on the first internal node of the latch circuit and the reference voltage on the second internal node of the latch circuit, resulting in a read data voltage being stored on the first internal node of the latch circuit. The bit line is then recoupled to the first internal node of the latch circuit, wherein the read data voltage on the first internal node of the latch circuit is applied to the bit line.

In one embodiment, the latch circuit includes: a first transistor having a source coupled to a first voltage supply node, a gate coupled to the first internal node, and a drain coupled to the second internal node, a second transistor having a source coupled to the first voltage supply node, a gate coupled to the second internal node, and a drain coupled to the first internal node, a third transistor having a source coupled to a second voltage supply node, a gate coupled to the first internal node, and a drain coupled to the second internal node, and a fourth transistor having a source coupled to the second voltage supply node, a gate coupled to the second internal node, and a drain coupled to the first internal node. In this embodiment, activating the latch circuit includes increasing a first supply voltage applied to the first voltage supply node from ground to a positive bit cell voltage. In one variation of this embodiment, the second voltage supply node is held at ground. In another variation, a second supply voltage applied to the second voltage supply node transitions between ground and a negative voltage.

In accordance with another embodiment, the reference voltage is a positive voltage. In variations of this embodiment, the reference voltage is a positive voltage less than or equal to 109 millivolts (mV), a positive voltage less than or equal to 54 mV, or a positive voltage less than or equal to 27 mV. These relatively low reference voltages result in significant power savings within the single-ended sense amplifier.

In accordance with another embodiment, the reference voltage is ground.

In accordance with another embodiment, the method includes applying a negative kick voltage to the bit line after coupling the bit line to the first internal node of the latch circuit, but before activating the latch circuit. In different variations of this embodiment, the reference voltage is a positive voltage or ground.

In accordance with another embodiment, the read data voltage is lower than a conventional Vdd supply voltage (e.g., 1.1 V). In different variations of this embodiment, the read data voltage is a positive voltage less than or equal to 985 mV, a positive voltage less than or equal to 488 mV, or a positive voltage less than or equal to 331 mV.

In another embodiment, the DRAM bit cell has a logic low bit cell voltage of 0 Volts, and the read voltage developed on the bit line has a maximum logic low voltage specified by the logic low bit cell voltage of 0 Volts plus a positive voltage coupling of the bit line with one or more adjacent bit lines when the DRAM bit cell has a logic low bit cell voltage. In addition, the reference voltage is selected such that the latch circuit reliably pulls the first internal node to ground when the first internal node is at the maximum logic low voltage and the second internal node is at the reference voltage.

In one variation, the difference between the maximum logic low voltage and the reference voltage is equal to a first voltage difference, and the DRAM bit cell has a logic high bit cell voltage corresponding with the read data voltage. The read data voltage is selected such that the read voltage developed on the bit line has a minimum logic high voltage equal to or greater than the reference voltage plus the first voltage difference when the DRAM bit cell has a logic high bit cell voltage. The latch circuit reliably pulls the first internal node to the read data voltage when the first internal node is at the minimum logic high voltage and the second internal node is at the reference voltage.

In accordance with a second embodiment of the present invention, a single-ended sense amplifier includes a latch circuit that includes: a first transistor having a source coupled to a first voltage supply node, a gate coupled to a first internal node, and a drain coupled to a second internal node; a second transistor having a source coupled to the first voltage supply node, a gate coupled to the second internal node, and a drain coupled to the first internal node; a third transistor having a source coupled to a second voltage supply node, a gate coupled to the first internal node, and a drain coupled to the second internal node; and a fourth transistor having a source coupled to the second voltage supply node, a gate coupled to the second internal node, and a drain coupled to the first internal node.

The single-ended sense amplifier further includes: a first pre-charge transistor having a drain coupled to the first internal node, a source coupled to receive a ground supply voltage and a gate coupled to receive a first pre-charge control signal; a second pre-charge transistor having a drain coupled to the second internal node, a source coupled to receive a reference voltage, and a gate coupled to receive a second pre-charge control signal, different than the first pre-charge control signal; and a first isolation transistor coupling the first internal node to a first bit line, wherein the first bit line is further coupled to a first dynamic random access memory (DRAM) cell in a first DRAM array.

In one embodiment, the second voltage supply node pulls the sources of the third and fourth transistors to ground. In another embodiment, a control voltage applied to the second voltage supply node transitions between ground and a negative voltage.

In another embodiment, the reference voltage is a positive voltage. In one variation, the reference voltage is a positive voltage less than or equal to 109 mV. In another embodiment, the reference voltage is ground.

In another embodiment, a control voltage applied to the first voltage supply node transitions from ground to 985 mV or less during a read access to the DRAM cell.

In another embodiment, the latch circuit, the first pre-charge transistor, the second pre-charge transistor and the isolation transistor are the only circuit elements used to sense, amplify and latch a read voltage developed on the first bit line.

In another embodiment, a second isolation transistor couples the first internal node to a second bit line, wherein the second bit line is further coupled to a second DRAM cell in a second DRAM array, wherein the first and second isolation transistors are never turned on at the same time.

In another embodiment, the first, second, third and fourth transistors of the latch circuit each include a superlattice channel extending between source and drain regions of these transistors.

In another embodiment, a switched kick capacitor is coupled to the first bit line. In one variation, the switched kick capacitor is activated to kick down a read voltage on the first bit line during a read access to the first DRAM cell. In another variation, the read voltage on the first bit line is negative if the first DRAM cell stores a logic low data value, and positive if the first DRAM cell stores a logic high data value. In yet another variation, the reference voltage is ground and the first DRAM cell has a negative bit cell voltage when storing a logic low data value.

The present invention will be more fully understood in view of the following description and drawings.

DETAILED DESCRIPTION

Figure 1:
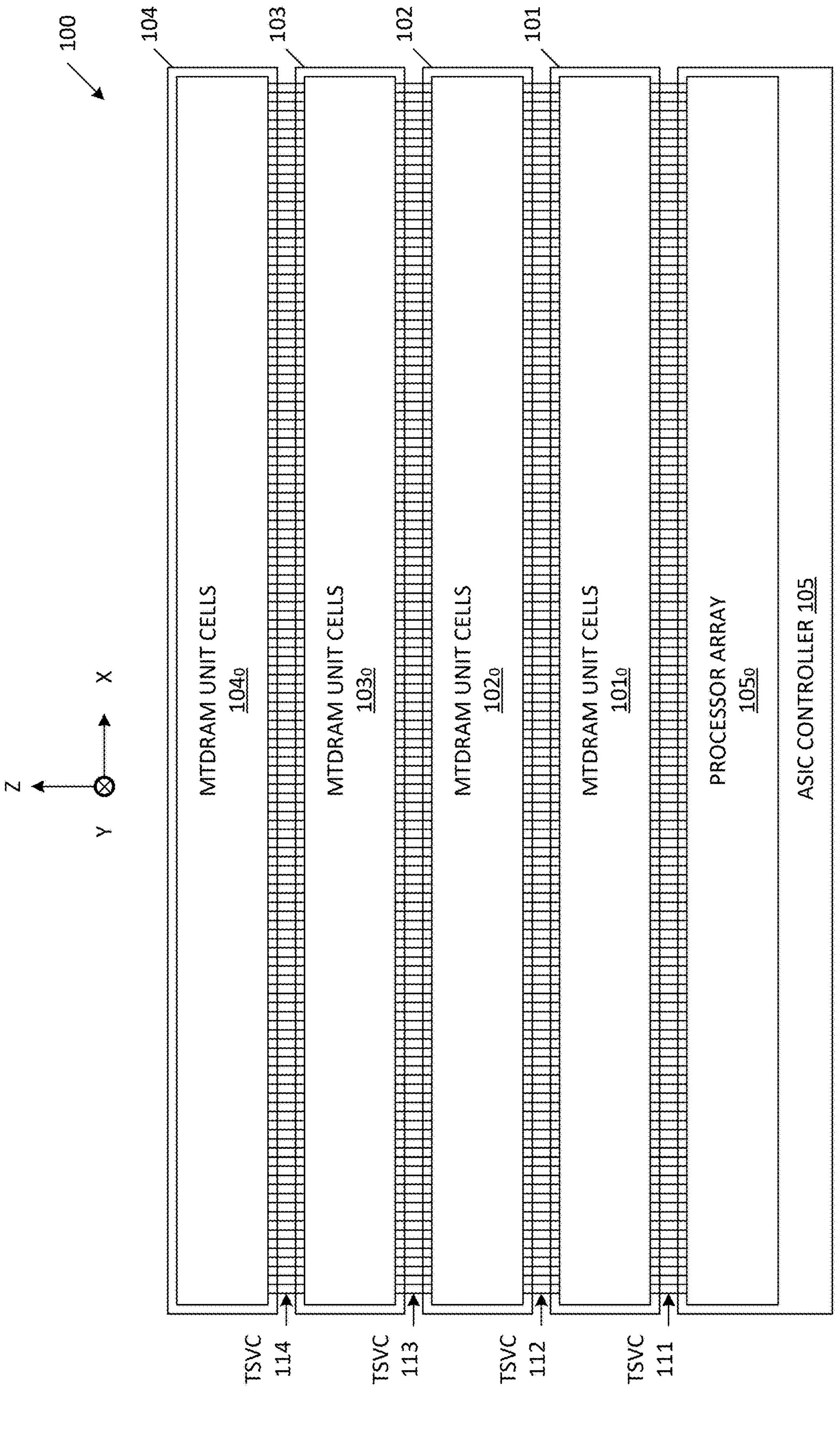
FIG. 1 is a diagram illustrating a multi-threaded dynamic random access memory (MTDRAM) system, in accordance with one embodiment of the present invention.

FIG. 1 is block diagram illustrating a multi-threaded dynamic random access memory (MTDRAM) processor system 100, in accordance with one embodiment of the present invention. MTDRAM processor system 100 includes four MTDRAM chips 101-104 and an ASIC controller chip 105, which are connected in a stack as illustrated. Each of the MTDRAM chips 101-104 includes a corresponding plurality of MTDRAM unit cells $\mathbf{101}_0$-$\mathbf{104}_0$ and a plurality of through silicon vias (TSVs) (not shown in FIG. 1), which are described in more detail below. The TSVs of MTDRAM chip 101 are connected to a processor array $\mathbf{105}_0$ of ASIC controller chip 105 with a first plurality of TSV connectors (TSVC) 111. The TSVs of MTDRAM chip 101 are also connected to the TSVs of MTDRAM chip 102 using a second plurality of TSV connectors 112. Similarly, the TSVs of MTDRAM chip 102 are also connected to the TSVs of MTDRAM chip 103 using a third plurality of TSV connectors 113, and the TSVs of MTDRAM chip 103 also connected to the TSVs of MTDRAM chip 104 using a fourth plurality of TSV connectors 114. In this manner, MTDRAM chips 101-104 are connected in a stacked configuration.

In the first embodiment described herein, each of the MTDRAM chips 101-104 includes 2048 independent MTDRAM unit cells, each having a storage capacity of 18 Mbits, such that each of the MTDRAM chips 101-104 has a storage capacity of 32 Gbits. In accordance with the following description, it is understood that the MTDRAM chips can be modified to include other numbers of MTDRAM unit cells having other capacities in other embodiments. FIG. 1 also illustrates X, Y and Z axes, which are consistently used throughout the drawings to more clearly define the MTDRAM system 100.

Figure 2:
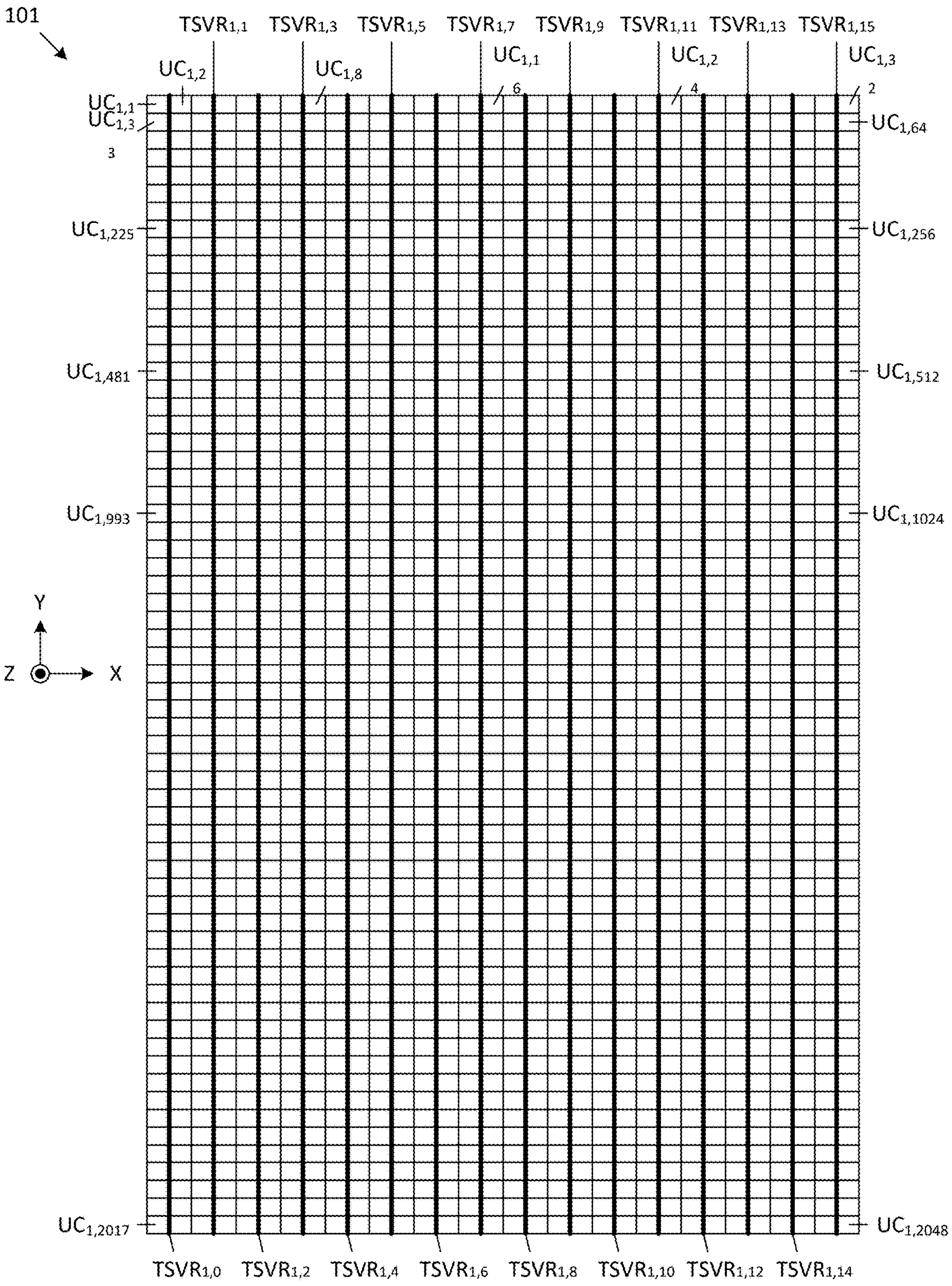
FIG. 2 is a top view of an MTDRAM chip of FIG. 1, illustrating the layout of 2048 included MTDRAM unit cells in accordance with one embodiment of the present invention.

FIG. 2 is a top view of MTDRAM chip 101, illustrating the layout of the 2048 included MTDRAM unit cells $UC_{1,1}$ to $UC_{1,2048}$ (wherein unit cells $UC_{1,1}$, $UC_{1,8}$, $UC_{1,16}$, $UC_{1,24}$, $UC_{1,32}$, $UC_{1,33}$, $UC_{1,64}$, $UC_{1,225}$, $UC_{1,256}$, $UC_{1,481}$, $UC_{1,512}$, $UC_{1,993}$, $UC_{1,1024}$, $UC_{1,2017}$ and $UC_{1,2048}$ are specifically labeled, thereby illustrating the numbering convention of the MTDRAM unit cells). The 2048 MTDRAM unit cells $UC_{1,1}$ to $UC_{1,2048}$ are organized into 32 columns and 64 rows of unit cells, wherein each row of MTDRAM unit cells extends along the X-axis width of the MTDRAM chip 101, as illustrated, and each column of MTDRAM unit cells extends along the Y-axis height of the MTDRAM chip 101.

Main TSV regions $TSVR_{1,0}$ to $TSVR_{1,15}$ are centrally located between columns of unit cells, as illustrated. More specifically, the main TSV region $TSVR_{1,0}$ is located between the first pair of MTDRAM unit cell columns (i.e., between the first column of MTDRAM unit cells and the second column of MTDRAM unit cells). The main TSV region $TSVR_{1,1}$ is located between the second pair of MTDRAM unit cell columns (i.e., between the third column of MTDRAM unit cells and the fourth column of MTDRAM unit cells). This pattern is repeated for the entire MTDRAM chip 101. Each of the main TSV regions $TSVR_{1,0}$ to $TSVR_{1,15}$ extends along the Y-axis height of the MTDRAM chip 101.

As described in more detail below, each of the MTDRAM unit cells $UC_{1,1}$ to $UC_{1,2048}$ has a dedicated set of TSVs within an adjacent one of the main TSV regions $TSVR_{1,0}$ to $TSVR_{1,15}$, wherein this dedicated set of TSVs is used to carry data, address and control information to/from the corresponding MTDRAM unit cell. Although the main TSV regions are located adjacent to the unit cells in FIG. 2, it is understood that other TSVs (not shown in FIG. 2) may extend through other locations within the unit cells (including unused areas of the unit cells that do not include circuitry required by the MTDRAM array structure). The TSVs included in the main TSV regions $TSVR_{1,0}$ to $TSVR_{1,15}$ (as well as the other TSVs not located in the main TSV regions) are coupled to the TSV connectors 111 and 112 in the manner illustrated by FIG. 1.

Figure 3:
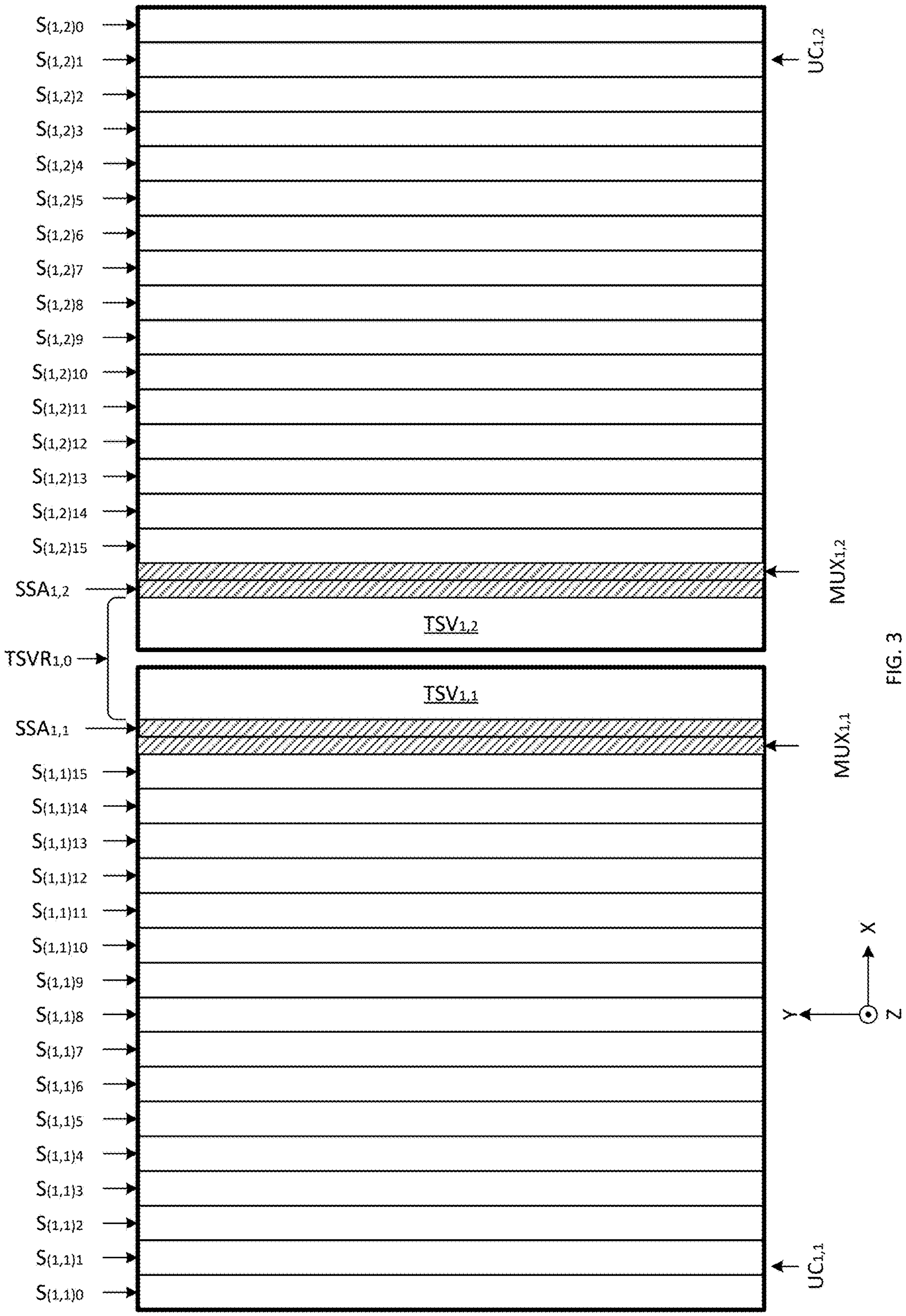
FIG. 3 is a top view illustrating two horizontally adjacent MTDRAM unit cells on the MTDRAM chip of FIG. 2, including the through-silicon vias (TSVs) associated with these unit cells, in accordance with one embodiment of the present invention.

FIG. 3 is a top view illustrating the horizontally adjacent MTDRAM unit cells $UC_{1,1}$ and $UC_{1,2}$ of FIG. 2, along with the corresponding portion of main TSV region $TSVR_{1,0}$ located between these unit cells, in accordance with one embodiment of the present invention.

Each of the MTDRAM unit cells $UC_{1,1}$ to $UC_{1,2048}$ includes sixteen 1.125 Mbit MTDRAM strips, wherein each of these strips extends vertically along the height of the unit cell (along the Y-axis). The sixteen MTDRAM strips of each unit cell are laid out in parallel along the Y-axis. As illustrated by FIG. 3, MTDRAM unit cell $UC_{1,1}$ includes sixteen MTDRAM strips $S_{(1,1)0}$ to $S_{(1,1)15}$, and MTDRAM unit cell $UC_{1,2}$ includes sixteen MTDRAM strips $S_{(1,2)0}$ to $S_{(1,2)15}$.

Each of the MTDRAM unit cells $UC_{1,1}$ to $UC_{1,2048}$ also includes a multiplexer and a secondary sense amplifier circuit located between the sixteen MTDRAM strips of the unit cell and the corresponding main TSV region. For example, unit cell $UC_{1,1}$ includes multiplexer $MUX_{1,1}$ and secondary sense amplifier circuit $SSA_{1,1}$, which are located between MTDRAM strips $S_{(1,1)0}$ to $S_{(1,1)15}$ and main TSV region $TSVR_{1,0}$. Similarly, unit cell $UC_{1,2}$ includes multiplexer $MUX_{1,2}$ and secondary sense amplifier circuit $SSA_{1,2}$, which are located between MTDRAM strips $S_{(1,2)0}$ to $S_{(1,2)15}$ and main TSV region $TSVR_{1,0}$.

Each of the MTDRAM unit cells $UC_{1,1}$ to $UC_{1,2048}$ also includes a dedicated set of TSVs within its corresponding main TSV region. For example, unit cell $UC_{1,1}$ includes a dedicated TSV set $TSV_{1,1}$ within the corresponding main TSV region $TSVR_{1,0}$, and unit cell $UC_{1,2}$ includes a dedicated TSV set $TSV_{1,2}$ within the corresponding main TSV region $TSVR_{1,0}$.

In the manner illustrated by FIG. 3, the horizontally adjacent MTDRAM unit cells $UC_{1,1}$ and $UC_{1,2}$ are laid out as mirror images of one another on MTDRAM chip 101. In the described embodiments, each pair of horizontally adjacent MTDRAM unit cells separated by a main TSV region have the same configuration as MTDRAM unit cells $UC_{1,1}$ and $UC_{1,2}$.

Although the unit cells $UC_{1,1}$-$UC_{1,2048}$ have the same logical configuration in the described embodiment, it is understood that in other embodiments, different unit cells on MTDRAM chip 101 can have different logical configurations. For example, in other embodiments, different unit cells can have different numbers of MTDRAM strips, different numbers of MTDRAM bit cells, different data word widths, different numbers of data channels, etc., in a manner that would be apparent to one of ordinary skill.

The configuration and operation of the MTDRAM strips $S_{(1,1)0}$-$S_{(1,1)15}$, multiplexer $MUX_{1,1}$ and secondary sense amplifier circuit $SSA_{1,1}$ (along with the signals transmitted on the corresponding TSV set $TSV_{1,1}$) is described in more detail below.

The MTDRAM chips 102, 103 and 104 have the same layout illustrated for MTDRAM chip 101 in FIG. 2, wherein the 2048 unit cells $UC_{1,1}$-$UC_{1,2048}$ of MTDRAM chip 101 are re-numbered as unit cells $UC_{2,1}$-$UC_{2,2048}$ in MTDRAM chip 102, unit cells $UC_{3,1}$-$UC_{3,2048}$ in MTDRAM chip 103, and unit cells $UC_{4,1}$-$UC_{4,2048}$ in MTDRAM chip 104. Similarly, the main TSV regions $TSVR_{1,0}$-$TSVR_{1,15}$ of MTDRAM chip 101 are re-numbered as main TSV regions $TSVR_{2,0}$-$TSVR_{2,15}$ in MTDRAM chip 102, main TSV regions $TSVR_{3,0}$-$TSVR_{3,15}$ in MTDRAM chip 103, and main TSV regions $TSVR_{4,0}$-$TSVR_{4,15}$ in MTDRAM chip 104. The unit cells $UC_{1,x}$, $UC_{2,x}$, $UC_{3,x}$ and $UC_{4,x}$ (x=1 to 2048) of MTDRAM chips 101-104 are vertically aligned along the Z-axis. Similarly, the main TSV regions $TSVR_{y,0}$-$TSVR_{y,15}$ (y=1 to 4) are vertically aligned along the Z-axis. This configuration enables vertically aligned MTDRAM unit cells to be connected to form MTDRAM unit stacks, as shown in more detail in FIG. 4.

Figure 4:
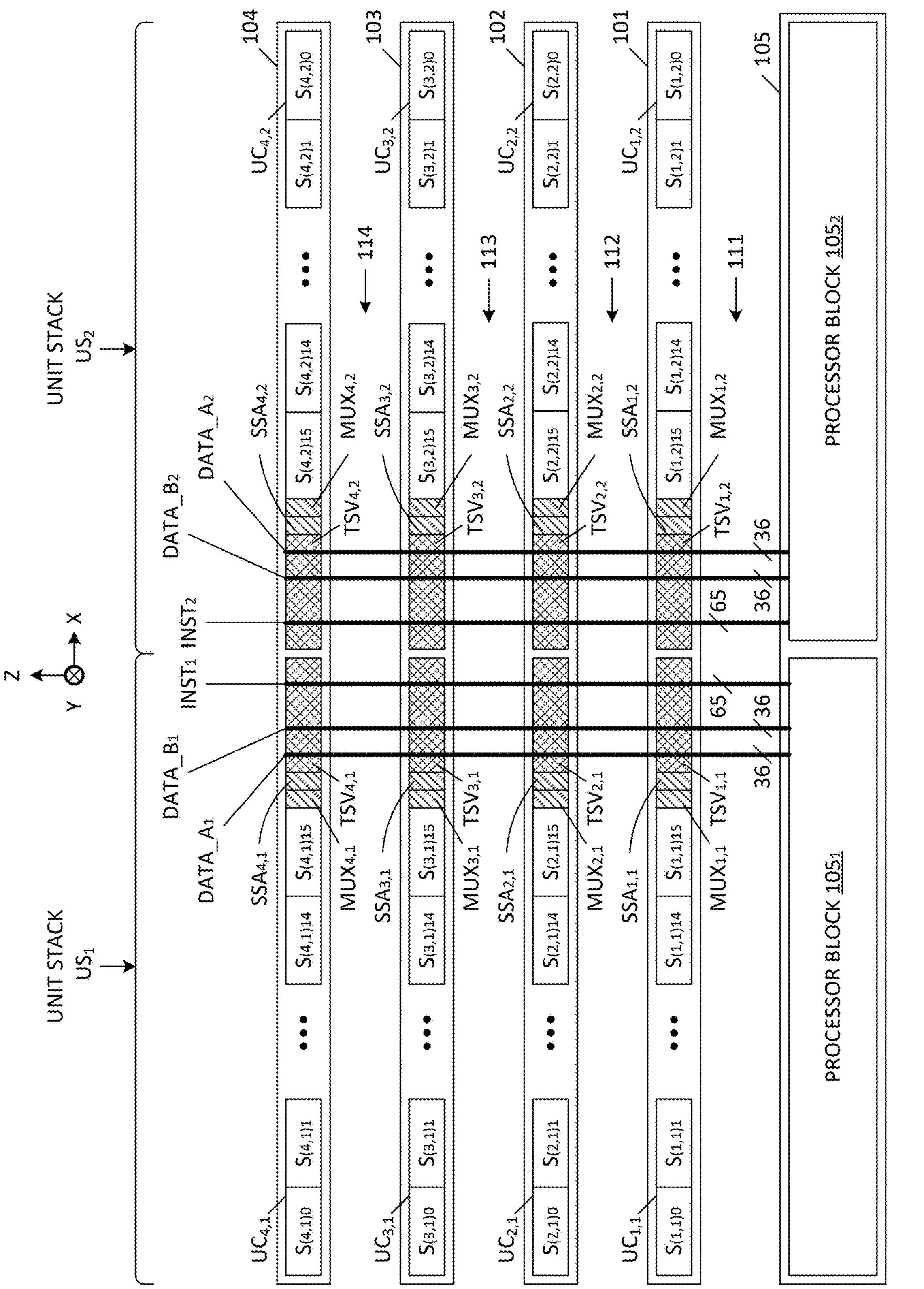
FIG. 4 is a side view of two adjacent MTDRAM unit stacks, which include the MTDRAM unit cells of FIG. 3, in accordance with one embodiment of the present invention.

FIG. 4 is a side view of two adjacent MTDRAM unit stacks $US_1$ and $US_2$ in accordance with one embodiment of the present invention. Unit stack $US_1$ includes four vertically aligned MTDRAM unit cells $UC_{1,1}$, $UC_{2,1}$, $UC_{3,1}$ and $UC_{4,1}$ in MTDRAM chips 101, 102, 103 and 104, respectively. The unit cells $UC_{1,1}$ $UC_{2,1}$ $UC_{3,1}$ $UC_{4,1}$ are connected to one another (and processor block $105_1$) via TSVs in corresponding TSV sets $TSV_{1,1}$, $TSV_{2,1}$, $TSV_{3,1}$ and $TSV_{4,1}$, respectively, and the TSV connectors 111-114 (FIG. 1). More specifically, unit stack $US_1$ includes an instruction bus $INST_1$ and two independent 36-bit data buses $DATA\_A_1$ and $DATA\_B_1$, which are constructed using TSVs in TSV regions $TSV_{1,1}$ $TSV_{2,1}$, $TSV_{3,1}$ and $TSV_{4,1}$ and TSV connectors 111-114.

The sixteen strips within each unit cell $UC_{x,1}$ are labeled as strips $S_{(x,1)0}$ to $S_{(x,1)15}$, wherein x=1 to 4. The multiplexer within each unit cell $UC_{x,1}$ is labeled as $MUX_{x,1}$, wherein x=1 to 4, and the secondary sense amplifier circuit within each unit cell $UC_{x,1}$ is labeled as $SSA_{x,1}$, wherein x=1 to 4.

Similarly, independent unit stack $US_2$ includes four vertically aligned MTDRAM unit cells $UC_{1,2}$, $UC_{2,2}$, $UC_{3,2}$ and $UC_{4,2}$ in MTDRAM chips 101, 102, 103 and 104, respectively. The unit cells $UC_{1,2}$ $UC_{2,2}$ $UC_{3,2}$ $UC_{4,2}$ are connected to one another (and corresponding processor block $\mathbf{105}_2$) via TSVs in corresponding TSV sets $TSV_{1,2}$, $TSV_{2,2}$, $TSV_{3,2}$ and $TSV_{4,2}$, respectively, and the TSV connectors 111-114 (FIG. 1). More specifically, unit stack $US_2$ includes an instruction bus $INST_2$ and two independent 36-bit data buses $DATA\_A_2$ and $DATA\_B_2$, which are constructed using TSVs in TSV regions $TSV_{1,2}$ $TSV_{2,2}$, $TSV_{3,2}$ and $TSV_{4,2}$ and TSV connectors 111-114.

The sixteen strips within each unit cell $UC_{x,2}$ are labeled as strips $S_{(x,2)0}$ to $S_{(x,2)15}$, wherein x=1 to 4. The multiplexer within each unit cell $UC_{x,2}$ is labeled as $MUX_{x,2}$, wherein x=1 to 4, and the secondary sense amplifier within each unit cell $UC_{x,2}$ is labeled as $SSA_{x,2}$, wherein x=1 to 4.

Figure 5:
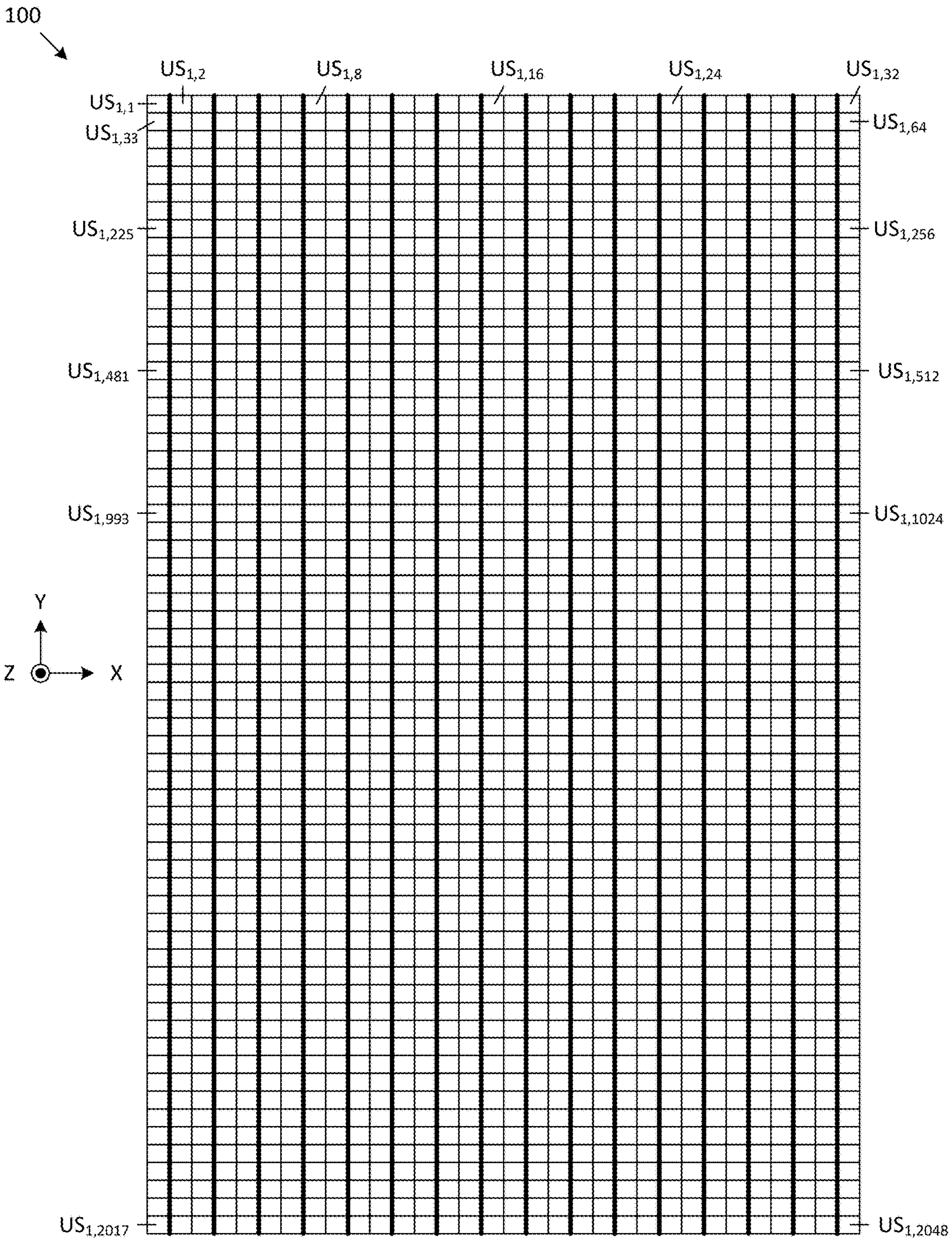
FIG. 5 is a top view of the 2048 unit stacks included in the MTDRAM system of FIG. 1 in accordance with one embodiment of the present embodiment.

Although FIG. 4 illustrates two unit stacks $US_1$ and $US_2$, it is understood that a total of 2048 independent unit stacks, each identical to unit stack $US_1$ (or $US_2$), are formed from the unit cells of MTDRAM chips 101-104. More specifically each unit stack $US_x$ includes the four unit cells $UC_{1,x}$, $UC_{2,x}$, $UC_{3,x}$ and $UC_{4,x}$ (x=1 to 2048) of MTDRAM chips 101, 102, 103 and 104. FIG. 5 is a top view of the 2048 unit stacks $US_1$-$US_{2048}$ of MTDRAM system 100 in accordance with the present embodiment (wherein unit stacks $US_{1,1}$, $US_{1,8}$, $US_{1,16}$, $US_{1,24}$, $US_{1,32}$, $US_{1,33}$, $US_{1,64}$, $US_{1,225}$, $US_{1,256}$, $US_{1,481}$, $US_{1,512}$, $US_{1,993}$, $US_{1,1024}$, $US_{1,2017}$ and $US_{1,2048}$ are specifically labeled to illustrate the numbering system).

MTDRAM unit cell $UC_{1,1}$ will now be described in more detail. It is understood that each of the other unit cells $UC_{2,1}$, $UC_{3,1}$ and $UC_{4,1}$ of unit stack $US_1$ can be accessed in the same manner as unit cell $UC_{1,1}$ in response to an instruction provided on instruction bus $INST_1$. As described in more detail below, each of the four unit cells of unit stack $US_1$ can be individually addressed by instructions provided on instruction bus $INST_1$.

As described in more detail below, processor array $\mathbf{105}_0$ can simultaneously access up to two nearly random address locations within each of the unit stacks $US_1$-$US_{2048}$. Processor array $\mathbf{105}_0$ includes a plurality of processor blocks $\mathbf{105}_1$-$\mathbf{105}_{2048}$, which are coupled to corresponding unit stacks $US_1$-$US_{2048}$, respectively. The following access patterns can be implemented within unit stack $US_1$. In general, an instruction transmitted on instruction bus $INST_1$ can be used to simultaneously access up to two data values in the same MTDRAM strip of unit stack $US_1$ (subject to access limitations imposed by the MTDRAM configuration, which are described in more detail below). Data is routed from/to the unit stack $US_1$ on two independent 36-bit data channels $DATA\_A_1$ and $DATA\_B_1$. The following access patterns are generally allowable.

Processor block $\mathbf{105}_1$ can access one data value in any one of the strips $S_{(1,1)0}$-$S_{(1,1)15}$, $S_{(2,1)0}$-$S_{(2,1)15}$, $S_{(3,1)0}$-$S_{(3,1)15}$ or $S_{(4,1)0}$-$S_{(4,1)15}$, in any one of the unit cells $UC_{1,1}$, $UC_{2,1}$, $UC_{3,1}$ or $UC_{4,1}$ of unit stack $US_1$. For example, processor block $\mathbf{105}_1$ can access any data value in MTDRAM strip $S_{(1,1)14}$ of unit cell $UC_{1,1}$ in response to a single instruction on instruction bus $INST_1$ (subject to access limitations imposed by the MTDRAM configuration).

Processor block $\mathbf{105}_1$ can also simultaneously access two data values in any one of the strips in any one of the unit cells of unit stack $US_1$. As described in more detail below, a first half of each MTDRAM strip is designated to store data associated with the first data channel $DATA\_A_1$, and a second half of each MTDRAM strip is designated to store data associated with the second data channel $DATA\_B_1$. Processor block $\mathbf{105}_1$ can simultaneously access a first data value in the first half of MTDRAM strip $S_{(1,1)14}$ on the first data channel $DATA\_A_1$, and a second data value in the second half of MTDRAM strip $S_{(1,1)14}$ on the second data channel $DATA\_B_1$ in response to a single instruction on instruction bus $INST_1$ (subject to access limitations imposed by the MTDRAM configuration). A specific addressing scheme used to access unit stack $US_1$ is described in more detail below.

Note that each of the unit stacks $US_1$-$US_{2048}$ can be simultaneously and independently accessed in the same manner described above for unit stack $US_1$. Thus, processor array $\mathbf{105}_0$ has the address bandwidth to simultaneously access data from up to 4096 nearly random address locations within the unit stacks $US_1$-$US_{2048}$.

As mentioned above, the configuration of the MTDRAM unit cells imposes some access limitations. The configuration (and limitations) of the unit cells will now be described in more detail.

Figure 6:
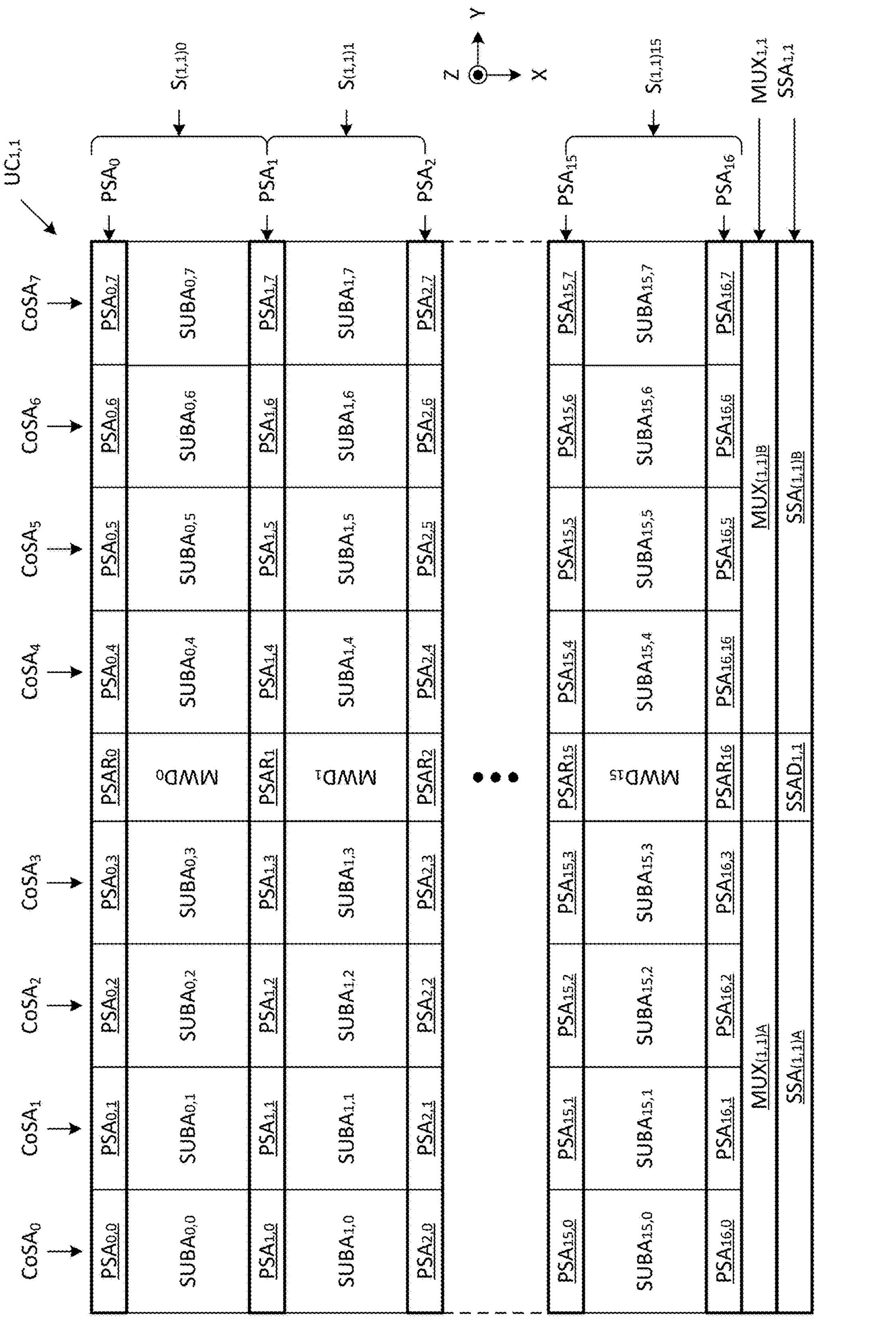
FIG. 6 is a block diagram of an MTDRAM unit cell in accordance with one embodiment of the present invention.

FIG. 6 is a block diagram of MTDRAM unit cell $UC_{1,1}$ in accordance with one embodiment of the present invention. Although FIG. 6 specifically illustrates MTDRAM strips $S_{(1,1)0}$, $S_{(1,1)1}$ and $S_{(1,1)15}$ of unit cell $UC_{1,1}$, it is understood that the remaining MTDRAM strips $S_{(1,1)2}$ to $S_{(1,1)14}$ of unit cell $UC_{1,1}$ have the same configuration. Note that the layout of the MTDRAM strips of FIG. 6 are rotated 90 degrees clockwise with respect to the orientation illustrated by FIGS. 2 and 3. This rotation is specified by the X-Y-Z axis representation in these figures.

Each MTDRAM strip $S_{(1,1)x}$ includes eight corresponding sub-arrays $SUBA_{x,0}$-$SUBA_{x,7}$ (wherein x=0 to 15 for strips $S_{(1,1)0}$ to $S_{(1,0)15}$, respectively). Each of the MTDRAM strips $S_{(1,1)0}$ to $S_{(1,1)15}$ extends across the height of the unit cell $UC_{1,1}$ along the Y-axis. The sub-arrays of the MTDRAM strips $S_{(1,1)0}$ to $S_{(1,1)15}$ are arranged in eight sub-array columns $CoSA_0$ to $CoSA_7$, which extend along the X-axis, as illustrated, wherein each sub-array column $CoSA_y$ includes sub-arrays $SUBA_{0,y}$-$SUBA_{15,y}$ (wherein y=0 to 7 for sub-array columns $CoSA_0$ to $CoSA_7$, respectively). As described in more detail below, sub-array columns $CoSA_0$-$CoSA_3$ are dedicated to data channel $DATA\_A_1$ of unit stack $US_1$ and sub-array columns $CoSA_4$-$CoSA_7$ are dedicated to data channel $DATA\_B_1$ of unit stack $US_1$ in the described embodiments. It is understood that in other embodiments, the sub-array columns $CoSA_0$-$CoSA_7$ can be dedicated to data channels $DATA\_A_1$ and $DATA\_B_1$ in different manners.

Each MTDRAM strip $S_{(1,1)x}$ also includes a centrally located main word line driver circuit $MWD_x$ (wherein x=0 to 15 for strips $S_{(1,1)0}$ to $S_{(1,1)15}$, respectively). As described in more detail below, each main word line driver circuit is configured to drive an addressed main word line in the corresponding strip.

Each MTDRAM strip $S_{(1,1)x}$ also includes a pair of corresponding primary sense amplifier circuits $PSA_x$ and $PSA_{(x+1)}$ (wherein x=0 to 15). For example, MTDRAM strip $S_{(1,1)0}$ includes primary sense amplifier circuits $PSA_0$ and $PSA_1$. Each primary sense amplifier circuit $PSA_x$ is subdivided into eight corresponding primary sense amplifier sub-circuits $PSA_{x,0}$-$PSA_{x,7}$ (wherein x=0 to 15 for strips $S_{(1,1)0}$ to $S_{(1,1)15}$, respectively). For example, primary sense amplifier circuit $PSA_1$ is subdivided into eight corresponding primary sense amplifier sub-circuits $PSA_{1,0}$-$PSA_{1,7}$. Each primary sense amplifier sub-circuit is coupled to one (or two) adjacent MTDRAM sub-arrays, as illustrated. For example, primary sense amplifier sub-circuits $PSA_{0,0}$ to $PSA_{0,7}$ of primary sense amplifier circuit $PSA_0$ are coupled to adjacent MTDRAM sub-arrays $SUBA_{0,0}$ to $SUBA_{0,7}$, respectively. Similarly, primary sense amplifier sub-circuits $PSA_{1,0}$ to $PSA_{1,7}$ of primary sense amplifier circuit $PSA_1$ are coupled to adjacent MTDRAM sub-arrays $SUBA_{0,0}$ to $SUBA_{0,7}$, respectively, and adjacent MTDRAM sub-arrays $SUBA_{1,0}$ to $SUBA_{1,7}$, respectively.

Vertically adjacent sub-arrays (along the X-axis) share primary sense amplifier sub-circuits. For example, an access to sub-array $SUBA_{0,0}$ requires the activation of primary sense amplifier sub-circuits $PSA_{0,0}$ and $PSA_{1,0}$. Similarly, an access to vertically adjacent sub-array $SUBA_{1,0}$ requires activation of primary sense amplifier sub-circuits $PSA_{1,0}$ and $PSA_{2,0}$. Thus, sub-arrays $SUBA_{0,0}$ and $SUBA_{1,0}$ 'share' primary sense amplifier sub-circuit $PSA_{1,0}$. The time required to cycle (reset) each primary sense amplifier sub-circuit after activation (i.e., Row Cycle time) is about 32 nanoseconds (ns) in the described embodiment. Thus, after accessing sub-array $SUB_{0,0}$, a subsequent access to sub-array $SUBA_{0,0}$ and/or sub-array $SUBA_{1,0}$ must not occur for 32 ns (i.e., until shared primary sense amplifier sub-circuit $PSA_{1,0}$ has been reset). This is one limitation to implementing entirely random accesses within unit cell $UC_{1,1}$. Although the Row Cycle time is listed as about 32 ns, it is understood that the Row Cycle time may be shorter, based on testing of the associated circuitry.

Each primary sense amplifier sub-circuit (e.g., $PSA_{0,0}$) includes a plurality (288) of single-ended sense amplifiers and a corresponding primary sense amplifier driver circuit (e.g., $PSAD_{0,0}$), which are described in more detail below in connection with FIGS. 7-8. Each primary sense amplifier driver circuit generates signals for controlling the plurality of single-ended sense amplifiers in the corresponding primary sense amplifier sub-circuit.

Each primary sense amplifier circuit $PSA_0$-$PSA_{16}$ also includes a corresponding centrally located region $PSAR_0$-$PSAR_{16}$, respectively. Although the primary sense amplifier driver circuits (e.g., $PSAD_{0,0}$) are located within a corresponding primary sense amplifier sub-circuit (e.g., $PSA_{0,0}$) in the described embodiments, it is understood that some (or all) portions of these primary sense amplifier driver circuits can be located within the centrally located regions $PSAR_0$-$PSAR_{16}$ in other embodiments. In an alternate embodiment, the primary sense amplifier driver circuits are located on the ASIC controller chip 105, and TSVs carry the required control signals from the primary sense amplifier driver circuits on the ASIC controller chip 105 to the primary sense amplifier sub-circuits $PSA_{0,0}$ to $PSA_{16,7}$. However, it is understood this embodiment undesirably requires substantially more TSVs within the unit cell $UC_{1,1}$.

As described above in connection with FIGS. 3-4, MTDRAM unit cell $UC_{1,1}$ also includes multiplexer $MUX_{1,1}$ and secondary sense amplifier circuit $SSA_{1,1}$. Multiplexer $MUX_{1,1}$ includes a first multiplexer circuit $MUX_{(1,1)A}$ associated with the sub-array columns $CoSA_0$-$CoSA_3$ dedicated to data channel $DATA\_A_1$, and a second multiplexer circuit $MUX_{(1,1)B}$ associated with the sub-array columns $CoSA_4$-$CoSA_7$ dedicated to data channel $DATA\_B_1$.

Secondary sense amplifier circuit $SSA_{1,1}$ includes a first 72-bit secondary sense amplifier section $SSA_{(1,1)A}$, which is coupled to first multiplexer circuit $MUX_{(1,1)A}$, and is dedicated to data channel $DATA\_A_1$. Secondary sense amplifier circuit $SSA_{1,1}$ also includes a second 72-bit secondary sense amplifier section $SSA_{(1,1)B}$, which is coupled to second multiplexer circuit $MUX_{(1,1)B}$, and is dedicated to data channel $DATA\_B_1$. Secondary sense amplifier circuit $SSA_{1,1}$ also includes a centrally located secondary sense amplifier driver circuit $SSAD_{1,1}$ that generates signals for controlling the secondary sense amplifier sections $SSA_{(1,1)A}$ and $SSA_{(1,1)B}$. The operation and control of multiplexer $MUX_{1,1}$ and secondary sense amplifier circuit $SSA_{1,1}$ is described in more detail below.

Figure 7:
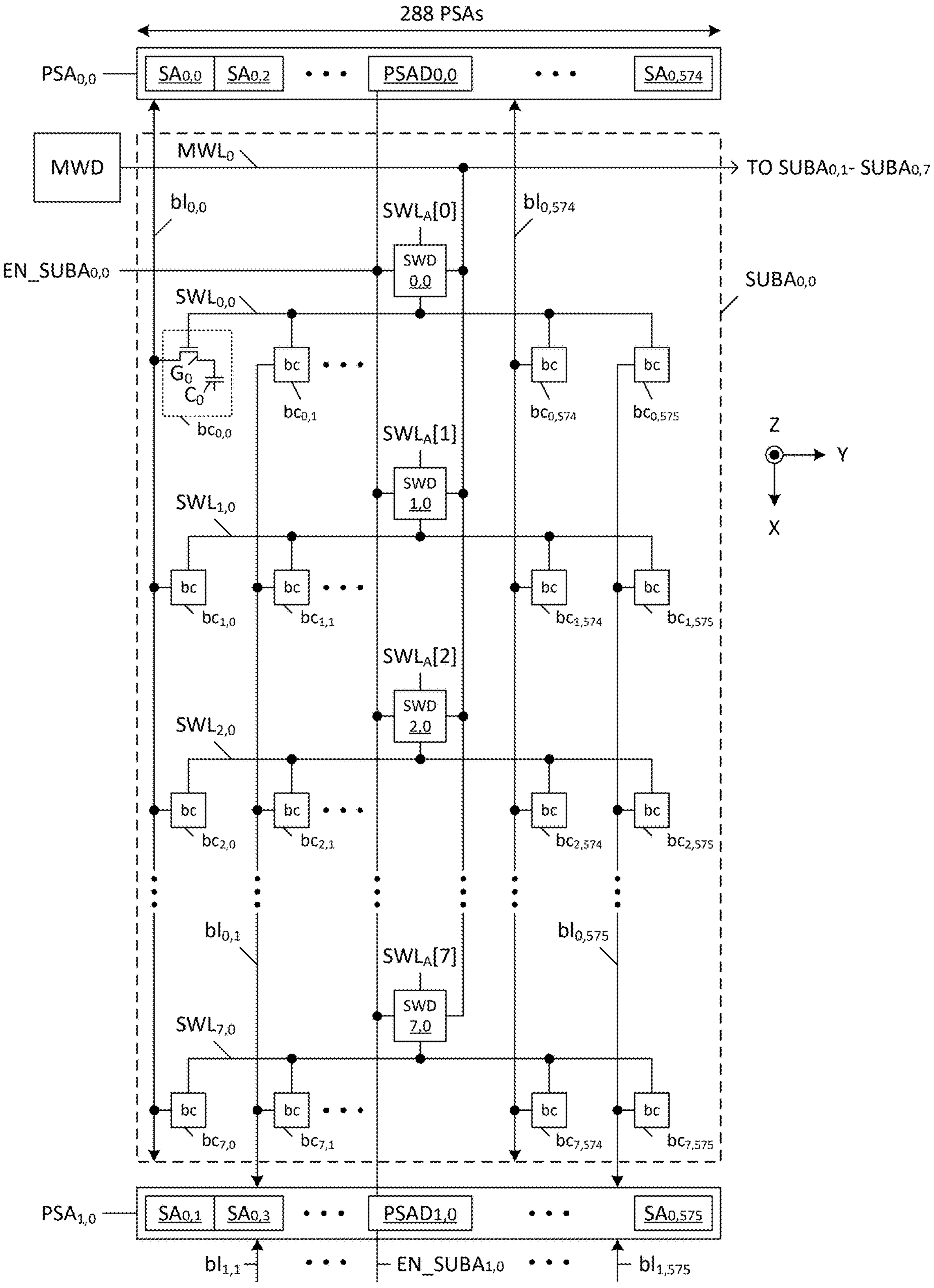
FIG. 7 is a block diagram illustrating the first eight rows of an MTDRAM sub-array included in the uppermost MTDRAM strip of FIG. 6, along with a corresponding main word line driver, corresponding sub-word line drivers and a corresponding pair of primary sense amplifier sub-circuits, in accordance with one embodiment of the present invention.

FIG. 7 is a diagram illustrating the first eight rows of sub-array $SUBA_{0,0}$, a corresponding main word line driver MWD (included in main word line driver circuit $MWD_0$), and the corresponding primary sense amplifier sub-circuits $PSA_{0,0}$ and $PSA_{1,0}$.

In the embodiments described herein, each of the MTDRAM sub-arrays includes 256 rows and 576 columns of MTDRAM bit cells. Although other numbers of rows/columns are possible in other embodiments, the selected number of rows and columns provides advantages with the configuration of unit cell $UC_{1,1}$, which will become apparent in view of the following description.

As illustrated by FIG. 7, the first eight rows of sub-array $SUBA_{0,0}$ include a single main word line $MWL_0$ and eight associated sub-word lines $SWL_{0,0}$ to $SWL_{7,0}$. Each of the sub-word lines $SWL_{0,0}$, to $SWL_{7,0}$ is coupled to a corresponding row of 576 corresponding MTDRAM bit cells within the sub-array $SUBA_{0,0}$. For example, sub-word line $SWL_{0,0}$ is coupled to MTDRAM bit cells $bc_{0,0}$ to $bc_{0,575}$, as illustrated. Bit cell $bc_{0,0}$ is illustrated to show the configuration of the corresponding bit cell pass gate transistor $G_0$ and bit cell capacitor $C_0$. In the described embodiments, all bit cells have the same construction.

The 576 data bits associated with each sub-word line correspond with eight 72-bit values. In various embodiments, these 72-bit values may include: eight 8-bit data values and an 8-bit error correction code (ECC) value, eight 8-bit data values and an 8-bit packet header value, or two separate 36-bit data values.

Sub-word lines $SWL_{0,0}$ to $SWL_{7,0}$ are selectively driven by sub-word line driver circuits $SWD_{0,0}$ to $SWD_{7,0}$, respectively. At most, only one of the eight sub-word line driver circuits $SWD_{0,0}$ to $SWD_{7,0}$ is activated for an access to sub-array $SUBA_{0,0}$. Each of the sub-word line driver circuits $SWD_{0,0}$ to $SWD_{7,0}$ is centrally located within the sub-array $SUBA_{0,0}$ (along the Y-axis), wherein the sub-word line driver circuits $SWD_{0,0}$ to $SWD_{7,0}$ are vertically aligned in a column (along the X-axis), as illustrated by FIG. 7.

Each of the sub-word line driver circuits $SWD_{0,0}$ to $SWD_{7,0}$ is coupled to receive the signal on the corresponding main word line $MWL_0$. To access the data associated with one of the sub-word lines $SWL_{0,0}$ to $SWL_{7,0}$, the main word line $MWL_0$ is activated, along with the corresponding sub-word line driver circuit associated with the accessed sub-word line.

Each of the sub-word line driver circuits $SWD_{0,0}$ to $SWD_{7,0}$ is also coupled to receive a sub-array enable signal $EN\_SUBA_{0,0}$, which is applied to each of the sub-word line driver circuits in sub-array $SUBA_{0,0}$. Sub-word line driver circuits $SWD_{0,0}$ to $SWD_{7,0}$ are further coupled to receive sub-word line address signals $SWL_A[0]$ to $SWL_A[7]$, respectively. Each sub-word line driver circuit $SWD_{x,0}$ (x=0 to 7) is configured to activate a sub-word line voltage on the corresponding sub-word line $SWL_{x,0}$ in response to receiving an activated main word line signal $MWL_0$, an activated sub-word line address signal $SWL_A[x]$ and an activated sub-array enable signal $EN\_SUBA_{0,0}$. One specific manner in which the sub-word line driver circuits $SWD_{0,0}$ to $SWD_{7,0}$ operate is described in more detail in commonly owned, co-pending U.S. patent application Ser. No. 18/399,579, which is hereby incorporated by reference in its entirety.

The illustrated circuitry associated with the first eight rows of sub-array $SUBA_{0,0}$ is repeated along the X-axis (32 times), such that the entire sub-array $SUBA_{0,0}$ includes 32 main word lines, 256 sub-word line driver circuits and 256 sub-word lines. Thus, each of the main word lines is coupled to a corresponding set of eight sub-word line driver circuits (similar to sub-word line driver circuits $SWD_{0,0}$ to $SWD_{7,0}$). Each set of eight sub-word line driver circuits is coupled to receive the eight corresponding sub-word line address signals $SWL_A[0]$ to $SWL_A[7]$ (in the same order illustrated by FIG. 7). Each of the 256 sub-word line driver circuits in sub-array $SUBA_{0,0}$ is further coupled to receive the same sub-array enable signal $EN\_SUBA_{0,0}$. As described in more detail below, each of the sub-arrays of a unit stack is independently enabled by a corresponding sub-array enable signal.

Each of the 32 main word lines associated with the sub-array $SUBA_{0,0}$ extends along the Y-axis to each of the sub-arrays included in the same strip $S_{(1,1)0}$ (i.e., each of the main word lines extends along the Y-axis height of the unit cell $UC_{1,1}$). For example, the main word line $MWL_0$ extends to each of the sub-arrays $SUBA_{0,1}$ to $SUBA_{0,7}$ of MTDRAM strip $S_{(1,1)0}$. In the embodiments described herein, an access to unit cell $UC_{1,1}$ results in the activation of a single one of the 512 main word lines within the unit cell. As described in more detail below, this activated main word line is specified by a 12-bit main word line address value MWL[11:0] and a 16-bit strip address value STRIP[15:0] on the instruction bus $INST_1$.

In the embodiments described herein, the sub-arrays $SUBA_{x,0}$-$SUBA_{x,3}$ (x=0 to 15) located to the left-side of the centrally located main word line driver circuits $MWD_0$-$MWD_{15}$ (FIG. 6) are coupled to receive a first sub-word line address value $SWL_A[7:0]$, which is associated with the first data channel $DATA\_A_1$. The sub-arrays $SUBA_{x,4}$-$SUBA_{x,7}$ (x=0 to 15) located to the right-side of the centrally located main word line driver circuits $MWD_0$-$MWD_{15}$ (FIG. 6) are coupled to receive a second sub-word line address value $SWL_B[7:0]$, which is associated with the second data channel $DATA\_B_1$.

Thus, to access unit cell $UC_{1,1}$, a single main word line (e.g., $MWL_0$) is activated within one of the strips (e.g., strip $S_{(1,1)0}$), a first word sub-word line (defined by SWLA[7:0]) associated with the activated main word line is activated within a left-side sub-array within the selected strip (e.g., $SUBA_{0,0}$), and a second sub-word line (defined by $SWL_B$ [7:0]) associated with the activated main word line is activated within a right-side sub-array within the selected strip (e.g., $SUBA_{4,0}$), wherein the first sub-word line and second sub-word line can have different (or the same) addresses. Providing independent sub word line address values $SWL_A[7:0]$ and $SWL_B[7:0]$ advantageously provides flexibility in addressing the unit cell $UC_{1,1}$. In an alternate embodiment, a single sub-word line address value is used to access the unit cell $UC_{1,1}$, thereby reducing the number of TSVs required in the instruction bus $INST_1$ by 8.

Using a single main word line address value and a single strip address value for both data channels $DATA\_A_1$ and $DATA\_B_1$ provides limitations to random address accessing within the unit stack $US_1$. In alternate embodiments, independent main word line addresses (and/or independent strip addresses) are provided for the left-side sub-arrays and the right-side sub-arrays of the unit stack, thereby reducing or eliminating the above-described random access limitations. It is understood that additional TSVs would be required to route the independent main word line addresses (and/or independent strip addresses) in such embodiments.

As described above, an access to an MTDRAM strip requires the activation of a main word line that extends along the entire length of the MTDRAM strip. Prior to performing a subsequent access to a different sub-array column (CoSA) within the same strip, the previously activated main word line must be pre-charged to its initial (deactivated) state. This main word line pre-charge operation limits the access rate to the MTDRAM strip. In accordance with one embodiment, the main word line pre-charge operation requires 4 ns (while accesses may occur at a rate of 1 GHz, or at a period of 1 ns). In this case, once a strip is accessed, a new address within the same strip cannot be accessed again for 4 ns. The required main word line pre-charge operation is a further limitation to random accessing of the unit stack $US_1$.

Each column of bit cells in sub-array $SUBA_{0,0}$ is coupled to a corresponding bit line. More specifically, all 256 bit cells located in the same column as bit cell $bc_{0,x}$ are coupled to bit line $bl_{0,x}$ (wherein x=0 to 575). Bit lines $bl_{0,y}$ (wherein y represents even values from 0 and 575) are coupled to corresponding single-ended sense amplifiers in primary sense amplifier sub-circuit $PSA_{0,0}$. More specifically, the 'even' bit lines $bl_{0,0}$, $bl_{0,2}$, . . . $bl_{0,574}$ of sub-array $SUBA_{0,0}$ are coupled to corresponding single-ended sense amplifiers $SA_{0,0}$, $SA_{0,2}$, . . . . $SA_{0,574}$, respectively, in primary sense amplifier sub-circuit $PSA_{0,0}$.

Bit lines $bl_{0,z}$ (wherein z represents odd values from 0 and 575) are coupled to corresponding single-ended sense amplifiers in primary sense amplifier sub-circuit $PSA_{1,0}$. More specifically, the 'odd' bit lines $bl_{0,1}$, $bl_{0,3}$, . . . $bl_{0,575}$ of sub-array $SUBA_{0,0}$ are coupled to corresponding single-ended sense amplifiers $SA_{0,1}$, $SA_{0,3}$, . . . . $SA_{0,575}$, respectively, in primary sense amplifier sub-circuit $PSA_{1,0}$.

The 'odd' bit lines $bl_{1,1}$, $bl_{0,3}$, . . . $bl_{1,575}$ of vertically adjacent sub-array $SUBA_{1,0}$ are also coupled to corresponding single-ended sense amplifiers $SA_{0,1}$, $SA_{0,3}$, . . . $SA_{0,575}$, respectively, in primary sense amplifier sub-circuit $PSA_{1,0}$ (thereby allowing the primary sense amplifier sub-circuit $PSA_{1,0}$ to be shared by sub-arrays $SUBA_{0,0}$ and $SUBA_{1,0}$).

Primary sense amplifier driver circuits $PSAD_{0,0}$ and $PSAD_{1,0}$ are centrally located within primary sense amplifier sub-circuits $PSA_{0,0}$ and $PSA_{1,0}$, respectively, as illustrated in FIG. 7. These driver circuits $PSAD_{0,0}$ and $PSAD_{1,0}$ are vertically aligned with the sub-word line driver circuits $SWD_{0,0}$ to $SWD_{7,0}$ along the X-axis, advantageously simplifying the layout of associated sub-array column $CoSA_0$. Primary sense amplifier driver circuits $PSAD_{0,0}$ and $PSAD_{1,0}$ are coupled to receive the sub-array enable signal $EN\_SUBA_{0,0}$, which is activated when sub-array $SUBA_{0,0}$ is accessed. Primary sense amplifier driver circuit $PSAD_{1,0}$ is also coupled to receive the sub-array enable signal $EN\_SUBA_{1,0}$, which is activated when sub-array $SUBA_{1,0}$ is accessed.

Figure 8:
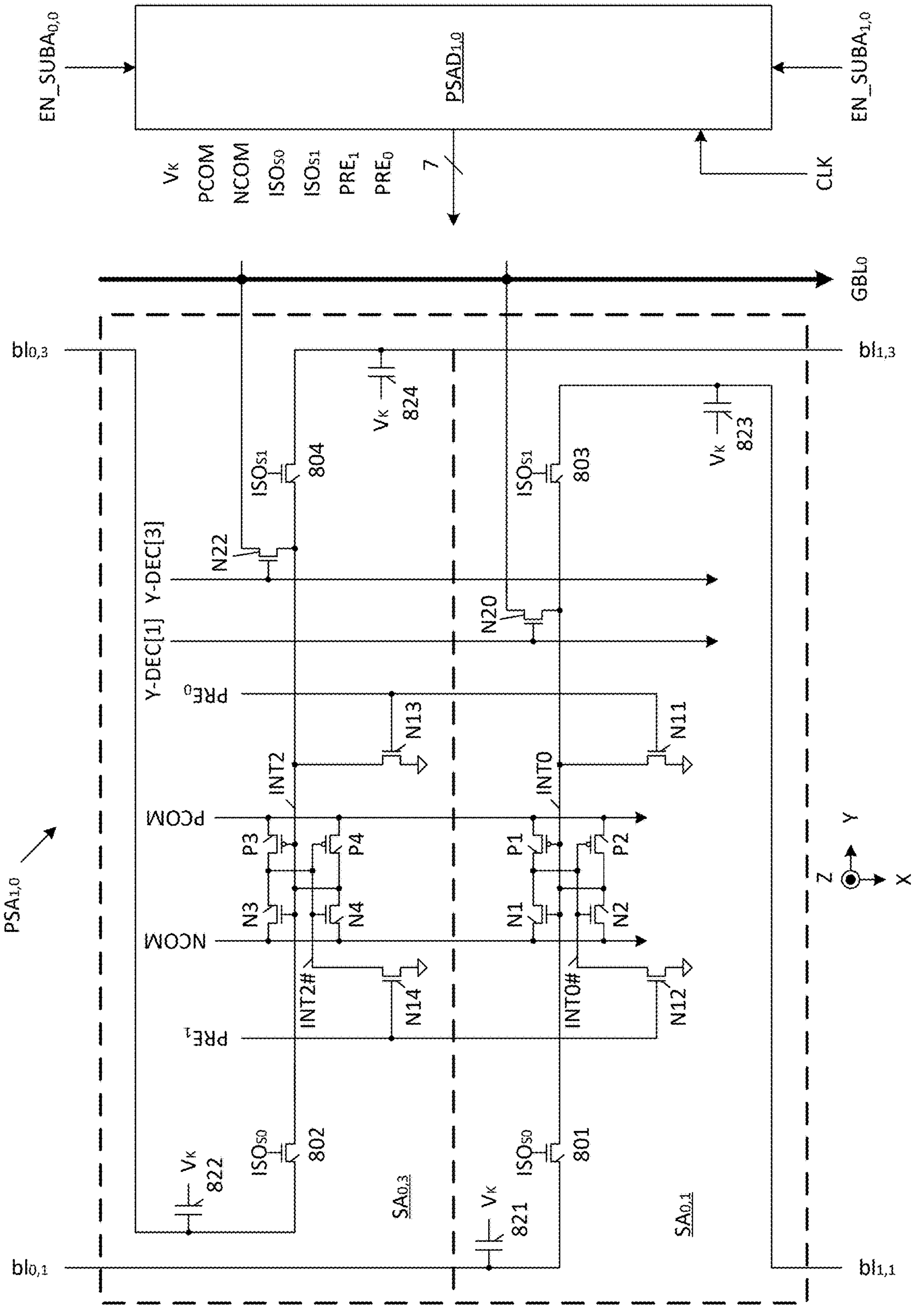
FIG. 8 is a diagram illustrating the manner in which a primary sense amplifier driver circuit controls accesses to single-ended sense amplifiers within a primary sense amplifier sub-circuit in accordance with one embodiment of the present invention.

FIG. 8 is a diagram illustrating the manner in which the primary sense amplifier driver circuit $PSAD_{1,0}$ controls accesses to single-ended sense amplifiers $SA_{0,1}$ and $SA_{0,3}$ within primary sense amplifier sub-circuit $PSA_{1,0}$ in accordance with one embodiment of the present invention. It is understood that the control signals generated by primary sense amplifier driver circuit $PSAD_{1,0}$ are provided to all of the single-ended sense amplifiers of primary sense amplifier sub-circuit $PSA_{1,0}$ in parallel. It is also understood that the single-ended sense amplifiers $SA_{0,1}$ and $SA_{0,3}$ (along with any of the other single-ended sense amplifiers included in the unit cell $UC_{1,1}$) can be replaced with any of the single-ended sense amplifiers described below in connection with FIGS. 26 to 32 in alternate embodiments of the present invention.

Single-ended sense amplifier $SA_{0,1}$ includes p-channel transistors P1-P2, n-channel transistors N1-N2, N11-N12 and N20, internal sense amplifier nodes INT0 and INT0#, thick oxide, high voltage NMOS transistors 801 and 803, and bit line voltage kick capacitors 821 and 823, which are connected as illustrated. Similarly, single-ended sense amplifier $SA_{0,3}$ includes p-channel transistors P3-P4, n-channel transistors N3-N4, N13-N14 and N22, internal sense amplifier nodes INT2 and INT2#, thick oxide, high voltage NMOS transistors 802 and 804, and bit line voltage kick capacitors 822 and 824, which are connected as illustrated.

Single-ended sense amplifiers $SA_{0,1}$ and $SA_{0,3}$ operate in response to control signals provided by primary sense amplifier driver circuit $PSAD_{1,0}$, including kick control signal Vk (which is provided to capacitors 821-824, as illustrated), PCOM and NCOM (which are provided to latch circuits formed by transistors P1-P4 and N1-N4, as illustrated), $ISO_{S0}$ and $ISO_{S1}$ (which are isolation signals provided to transistors 801-802 and 803-804, as illustrated), and precharge signals $PRE_0$ and $PRE_1$, which are provided to transistors N11-N14 as illustrated). The specific timing of the above-described control signals and the corresponding operation of the single-ended sense amplifiers $SA_{0,1}$ and $SA_{0,3}$ is described in detail in U.S. patent application Ser. No. 18/399,579, which is hereby incorporated by reference in its entirety. The operation and control of the single-ended sense amplifiers $SA_{0,1}$ and $SA_{0,3}$ in response to the above-described control signals is also described in more detail below in connection with FIGS. 11A and 11B. In one embodiment, primary sense amplifier driver circuit $PSAD_{1,0}$ generates the timing of the above-described control signals in response to a clock signal (CLK) provided on a TSV of the instruction bus $INST_1$. Advantageously, only the enabled primary sense amplifier driver circuits are activated to generate the required control signals, resulting in significant power savings within unit cell $UC_{1,1}$.

As described above, single-ended sense amplifier $SA_{0,1}$ is coupled to 'odd' bit line $bl_{0,1}$ of sub-array $SUBA_{0,0}$, and 'odd' bit line $bl_{1,1}$ of sub-array $SUBA_{1,0}$. Similarly, single-ended sense amplifier $SA_{0,3}$ is coupled to 'odd' bit line $bl_{0,3}$ of sub-array $SUBA_{0,0}$, and 'odd' bit line $bl_{1,3}$ of sub-array $SUBA_{1,0}$.

If the sub-array enable signal $EN\_SUBA_{0,0}$ is activated (indicating an access to sub-array $SUBA_{0,0}$), then primary sense amplifier driver circuit $PSAD_{1,0}$ enables generation of the control signals $ISO_{S0}$, Vk, PCOM, NCOM, $PRE_0$ and $PRE_1$, such that the bit lines $bl_{0,1}$ and $bl_{0,3}$ of sub-array $SUBA_{0,0}$ are effectively coupled to single-ended sense amplifiers $SA_{0,1}$ and $SA_{0,3}$, respectively. During this access, primary sense amplifier driver circuit $PSAD_{1,0}$ deactivates the isolation control signal $ISO_{S1}$, effectively de-coupling the bit lines $bl_{1,1}$ and $bl_{1,3}$ of sub-array $SUBA_{1,0}$ from the single-ended sense amplifiers $SA_{0,1}$ and $SA_{0,3}$, respectively. Note that each of the single-ended sense amplifiers $SA_{0,1}$ and $SA_{0,3}$ latches a data bit entirely in response to the signal developed on a single bit line.

Conversely, if the sub-array enable signal $EN\_SUBA_{1,0}$ is activated (indicating an access to sub-array $SUBA_{1,0}$), then primary sense amplifier driver circuit $PSAD_{1,0}$ enables generation of the control signals $ISO_{S1}$, Vk, PCOM, NCOM, $PRE_0$ and $PRE_1$, such that the bit lines $bl_{1,1}$ and $bl_{1,3}$ of sub-array $SUBA_{1,0}$ are effectively coupled to single-ended sense amplifiers $SA_{0,1}$ and $SA_{0,3}$, respectively. During this access, primary sense amplifier driver circuit $PSAD_{1,0}$ deactivates the isolation control signal $ISO_{S0}$, effectively de-coupling the bit lines $bl_{0,1}$ and $bl_{0,3}$ of sub-array $SUBA_{0,0}$ from the single-ended sense amplifiers $SA_{0,1}$ and $SA_{0,3}$, respectively.

In the manner described above, only primary sense amplifier sub-circuits associated with accessed sub-arrays are activated during an access to unit cell $UC_{1,1}$, advantageously resulting in significant power savings.

In an alternate embodiment, primary sense amplifier driver $PSAD_{1,0}$ generates a first kick control voltage (e.g., $V_{K1}$), which is activated and applied to kick transistors 821 and 822 when the $EN\_SUBA_{0,0}$ signal is activated, and a second kick control voltage (e.g., $V_{K2}$), which is activated and applied to kick transistors 823 and 824 when the $EN\_SUBA_{1,0}$ signal is activated, thereby resulting in further power savings within unit cell $UC_{1,1}$. Note that this embodiment requires additional decoding circuitry within primary sense amplifier driver circuit $PSAD_{1,0}$.

In the described examples, the data transfer rate between the sub-arrays and the primary sense amplifier sub-circuits is 1 GHz. However, it is understood that higher data transfer rates can be implemented in other embodiments, based on real silicon performance capability for a given silicon technology. Other considerations may require slower data transfer rates in other embodiments.

Returning now to FIG. 7, a read access to sub-array $SUBA_{0,0}$ results in 288 data bits being transferred from the bit cells associated with an addressed sub-word line to primary sense amplifier sub-circuit $PSA_{0,0}$, and also results in 288 data bits being transferred from the bit cells associated with the addressed sub-word line to primary sense amplifier sub-circuit $PSA_{1,0}$. As described above, each of these data bits is latched into a single-ended sense amplifier. Although the present example describes a read access to sub-array $SUBA_{0,0}$, (i.e., through data channel $DATA\_A_1$) it is understood that a simultaneous (parallel) read access may be performed to one of the right-side sub-arrays $SUBA_{0,4}$ to $SUBA_{0,7}$ (i.e., through data channel $DATA\_B_1$). Moreover, although the present example describes a read access, it is understood that write accesses are similarly performed within the unit cell $UC_{1,1}$.

Data stored in the primary sense amplifier circuits is selectively routed to global bit lines (GBLs), which extend along the X-axis through the unit cell $UC_{1,1}$. The global bit lines extend from the primary sense amplifier circuits to the multiplexer circuit $MUX_{1,1}$ in a manner described in more detail below.

Figure 9:
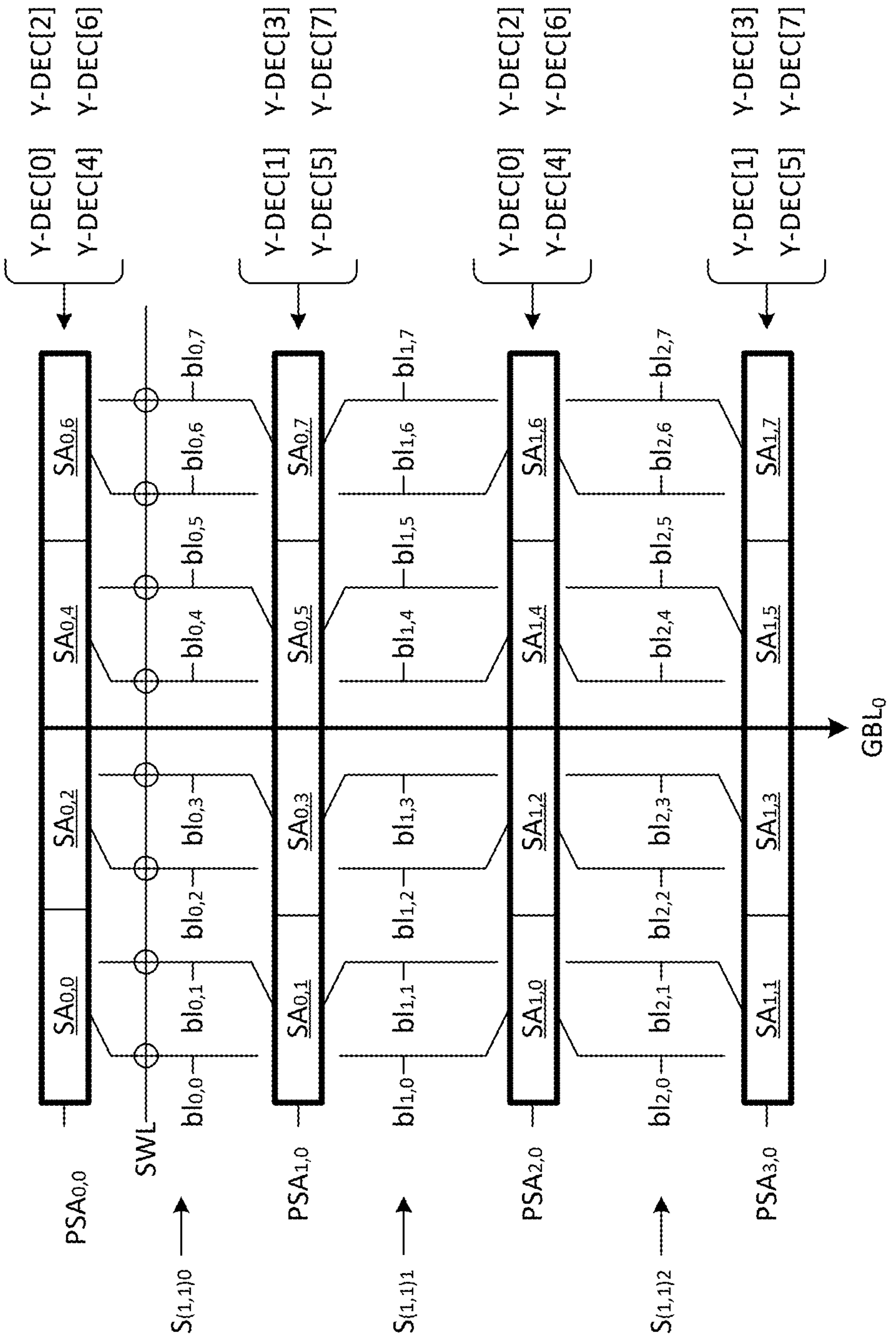
FIG. 9 is a block diagram illustrating connections between bit lines, single-ended sense amplifiers and a corresponding global bit line within the MTDRAM unit cell of FIG. 6 in accordance with one embodiment of the present invention.

FIG. 9 is a block diagram illustrating the first eight bit line-to-primary sense amplifier connections in the first three strips $S_{(1,1)0}$-$S_{(1,1)2}$ of unit cell $UC_{1,1}$, along with the associated global bit line $GBL_0$. In the first strip $S_{(1,1)0}$, the even bit lines $bl_{0,0}$, $bl_{0,2}$, $bl_{0,4}$ and $bl_{0,6}$ are coupled to corresponding single-ended sense amplifiers $SA_{0,0}$, $SA_{0,2}$, $SA_{0,4}$ and $SA_{0,6}$ in primary sense amplifier sub-circuit $PSA_{0,0}$. The odd bit lines $bl_{0,1}$, $bl_{0,3}$, $bl_{0,5}$ and $bl_{0,7}$ of the first strip $S_{(1,1)0}$ are coupled to corresponding single-ended sense amplifiers $SA_{0,1}$, $SA_{0,3}$, $SA_{0,5}$ and $SA_{0,7}$ in primary sense amplifier sub-circuit $PSA_{1,0}$.

In the second strip $S_{(1,1)1}$, the odd bit lines $bl_{1,1}$, $bl_{1,3}$, $bl_{1,5}$ and $bl_{1,7}$ are coupled to corresponding single-ended sense amplifiers $SA_{0,1}$, $SA_{0,3}$, $SA_{0,5}$ and $SA_{0,7}$ in primary sense amplifier sub-circuit $PSA_{1,0}$. The even bit lines $bl_{1,0}$, $bl_{1,2}$, $bl_{1,4}$ and $bl_{1,6}$ of the second strip $S_{(1,1)1}$ are coupled to corresponding single-ended sense amplifiers $SA_{1,0}$, $SA_{1,2}$, $SA_{1,4}$ and $SA_{1,6}$ in primary sense amplifier sub-circuit $PSA_{2,0}$.

In the third strip $S_{(1,1)2}$, the even bit lines $bl_{2,0}$, $bl_{2,2}$, $bl_{2,4}$ and $bl_{2,6}$ are coupled to corresponding single-ended sense amplifiers $SA_{1,0}$, $SA_{1,2}$, $SA_{1,4}$ and $SA_{1,6}$ in primary sense amplifier sub-circuit $PSA_{2,0}$. The odd bit lines $bl_{2,1}$, $bl_{2,3}$, $bl_{2,5}$ and $bl_{2,7}$ of the third strip $S_{(1,1)2}$ are coupled to corresponding single-ended sense amplifiers $SA_{1,1}$, $SA_{1,3}$, $SA_{1,5}$ and $SA_{1,7}$ in primary sense amplifier sub-circuit $PSA_{2,0}$.

As described in more detail below, the routing of data between the single-ended sense amplifiers of unit cell $UC_{1,1}$ and corresponding global bit lines is controlled by Y-address signals Y-DEC[7:0]. In general, the Y-address signals Y-DEC[0], Y-DEC[2], Y-DEC[4] and Y-DEC[6] control output routing from primary sense amplifier circuits $PSA_0$, $PSA_2$, $PSA_4$, $PSA_6$, $PSA_8$, $PSA_{10}$, $PSA_{12}$, $PSA_{14}$ and $PSA_{16}$ and the Y-address signals Y-DEC[1], Y-DEC[3], Y-DEC[5] and Y-DEC[7] control output routing from primary sense amplifier circuits $PSA_1$, $PSA_3$, $PSA_5$, $PSA_7$, $PSA_9$, $PSA_{11}$, $PSA_{13}$ and $PSA_{15}$.

Figure 10:
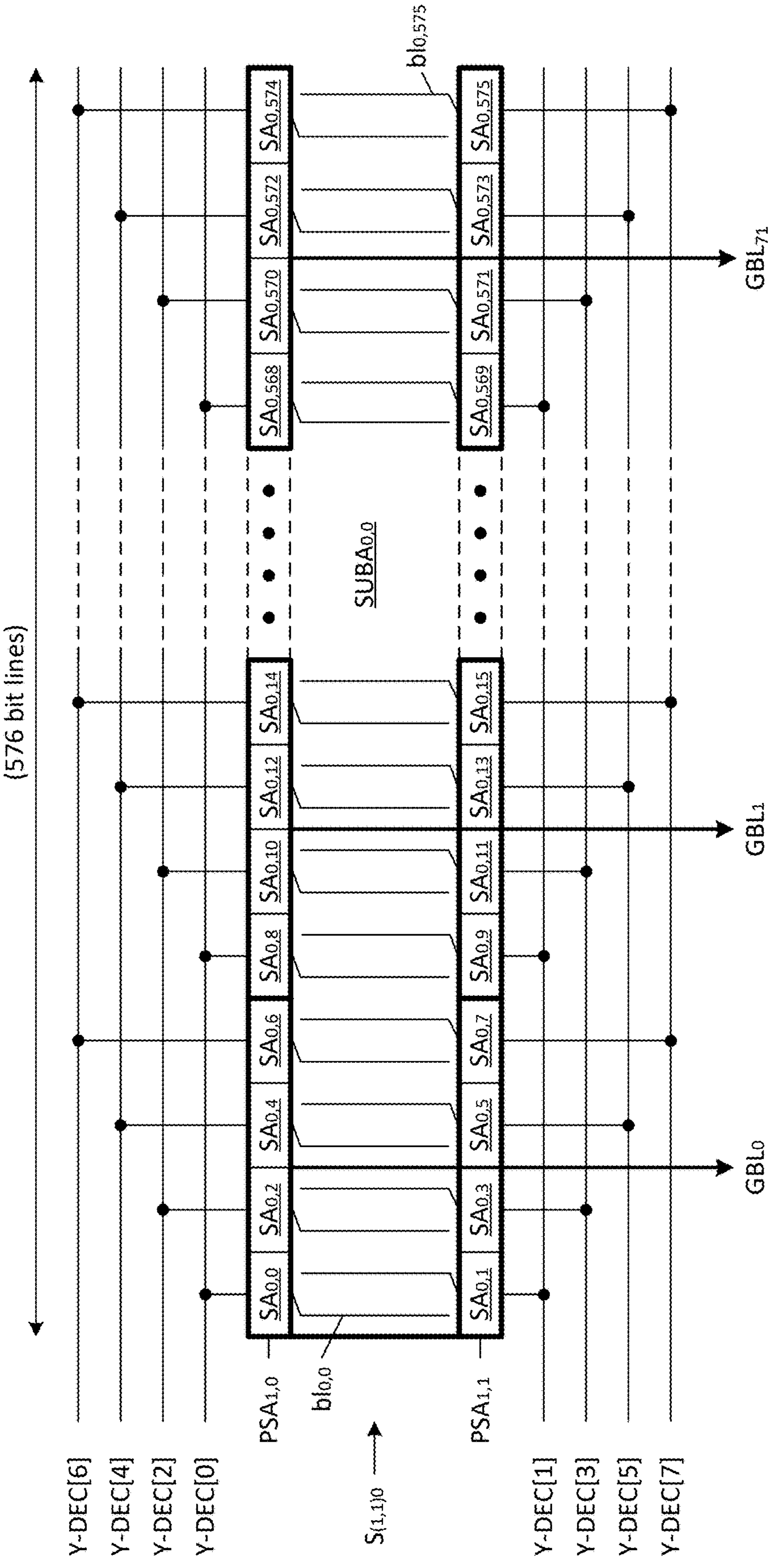
FIG. 10 is a diagram illustrating the MTDRAM sub-array of FIG. 7, along with Y-decoder logic used to selectively route data from the primary sense amplifier sub-circuits to a set of global bit lines in accordance with one embodiment of the present invention.

FIG. 10 is a block diagram illustrating MTDRAM sub-array $SUBA_{0,0}$ the corresponding primary sense amplifier sub-circuits $PSA_{1,0}$ and $PSA_{1,1}$ and the corresponding global bit lines $GBL_0$-$GBL_{71}$ in accordance with one embodiment of the present invention. The global bit lines $GBL_0$-$GBL_{71}$ are shared by all of the sub-arrays in sub-array column $CoSA_0$. FIG. 10 illustrates the manner in which the Y-address signals Y-DEC[7:0] route data from the single-ended sense amplifiers of primary sense amplifier sub-circuits $PSA_{0,0}$ and $PSA_{1,0}$ to global bit lines $GBL_0$-$GBL_{71}$ in accordance with one embodiment of the present invention.

As described above, a read access to a row of sub-array $SUBA_{0,0}$ results in 288 data bits being transferred to primary sense amplifier sub-circuit $PSA_{1,0}$ on the even bit lines of sub-array $SUBA_{0,0}$, and 288 data bits being transferred to primary sense amplifier sub-circuit $PSA_{1,1}$ on the odd bit lines of sub-array $SUBA_{0,0}$. As illustrated in FIG. 10, primary sense amplifier sub-circuit $PSA_{1,0}$ includes 288 single-ended sense amplifiers $SA_{0,Y}$ (wherein Y=even numbers from 0 to 574) and primary sense amplifier sub-circuit $PSA_{1,1}$ includes 288 single-ended sense amplifiers $SA_{0,Z}$ (wherein Z=odd numbers from 1 to 575), which store data read from a row of bit cells in sub-array $SUBA_{0,0}$.

Column select circuitry within primary sense amplifier sub-circuits $PSA_{1,0}$ and $PSA_{1,1}$ is controlled to selectively route a 72-bit data value onto global bit lines $GBL_0$-$GBL_{71}$ in response to a pre-decoded Y-address value Y-DEC[0:7] provided on the instruction bus $INST_1$.

As illustrated by FIG. 10, each global bit line GBL is coupled to eight corresponding single-ended sense amplifiers in primary sense amplifier sub-circuits $PSA_{1,0}$ and $PSA_{1,1}$. For example, global bit line $GBL_0$ is coupled to four single-ended sense amplifiers $SA_{0,0}$, $SA_{0,2}$, $SA_{0,4}$ and $SA_{0,6}$ in primary sense amplifier sub-circuit $PSA_{1,0}$ and four single-ended sense amplifiers $SA_{0,1}$, $SA_{0,3}$, $SA_{0,5}$ and $SA_{0,7}$ in primary sense amplifier sub-circuit $PSA_{1,1}$. Each of these eight single-ended sense amplifiers $SA_{0,0}$-$SA_{0,7}$ is coupled to the global bit line $GBL_0$ by a corresponding transistor, which is controlled by the Y-address values Y-DEC[0] to Y-DEC[7], respectively. Note that FIG. 8 illustrates exemplary transistors N20 and N22, which couple the single-ended sense amplifiers $SA_{0,1}$ and $SA_{0,3}$ to global bit line $GBL_0$ in response to the Y-address values Y-DEC[1] and Y-DEC[3], respectively. Thus, if the Y-address value Y-DEC [1] is activated (and the Y-address values Y-DEC[0] and Y-DEC[2:7] are deactivated), then the data value stored in single-ended sense amplifier $SA_{0,1}$ is transmitted onto global bit line $GBL_0$ (through turned on transistor N20).

The above-described pattern is repeated for successive sets of eight single-ended sense amplifiers, as illustrated, whereby a 72-bit data value is transmitted onto global bit lines $GBL_0$-$GBL_{71}$. It is noted that a burst read access of up to eight 72-bit data values can be performed for data stored in primary sense amplifier sub-circuits $PSA_{1,0}$ and $PSA_{1,1}$ by changing (e.g., incrementing) the Y-address value Y-DEC [0:7] over successive cycles, without reactivating the primary sense amplifier sub-circuits $PSA_{1,0}$ and $PSA_{1,1}$. As described in more detail below, the Y-address value Y-DEC [0:7] is controlled by the processor block $\mathbf{105}_1$ (via instruction bus $INST_1$).

Note that global bit lines $GBL_0$-$GBL_{71}$ are shared by all of the sub-arrays in sub-array column $CoSA_0$. As described in more detail below, each of the eight sub-array columns $CoSA_0$-$CoSA_7$ of unit cell $UC_{1,1}$ has a corresponding set of 72 global bit lines. In the embodiments described herein, all of the primary sense amplifiers of a unit stack share the same Y-address value Y-DEC[0:7].

As illustrated by FIGS. 9 and 10, when sub-array $SUBA_{1,0}$ of strip $S_{(1,1)1}$ is accessed, single-ended sense amplifiers in primary sense amplifier sub-circuit $PSA_{1,0}$ are selectively coupled to global bit lines $GBL_0$-$GBL_{71}$ in response to the Y-address signals Y-DEC[1], Y-DEC[3], Y-DEC[5] and Y-DEC[7], and single-ended sense amplifiers in primary sense amplifier sub-circuit $PSA_{2,0}$ are selectively coupled to global bit lines $GBL_0$-$GBL_{71}$ in response to the Y-address signals Y-DEC[0], Y-DEC[2], Y-DEC[4] and Y-DEC[6]. Using this pattern, each of the primary sense amplifier circuits $PSA_0$-$PSA_{16}$ only needs to receive four Y-address signals, advantageously reducing routing congestion within the unit cell $UC_{1,1}$.

The timing of Y-address value Y-DEC[0:7] (and the timing of the read/write signals on the global bit lines) is different during read accesses and write accesses.

Figure 11A:
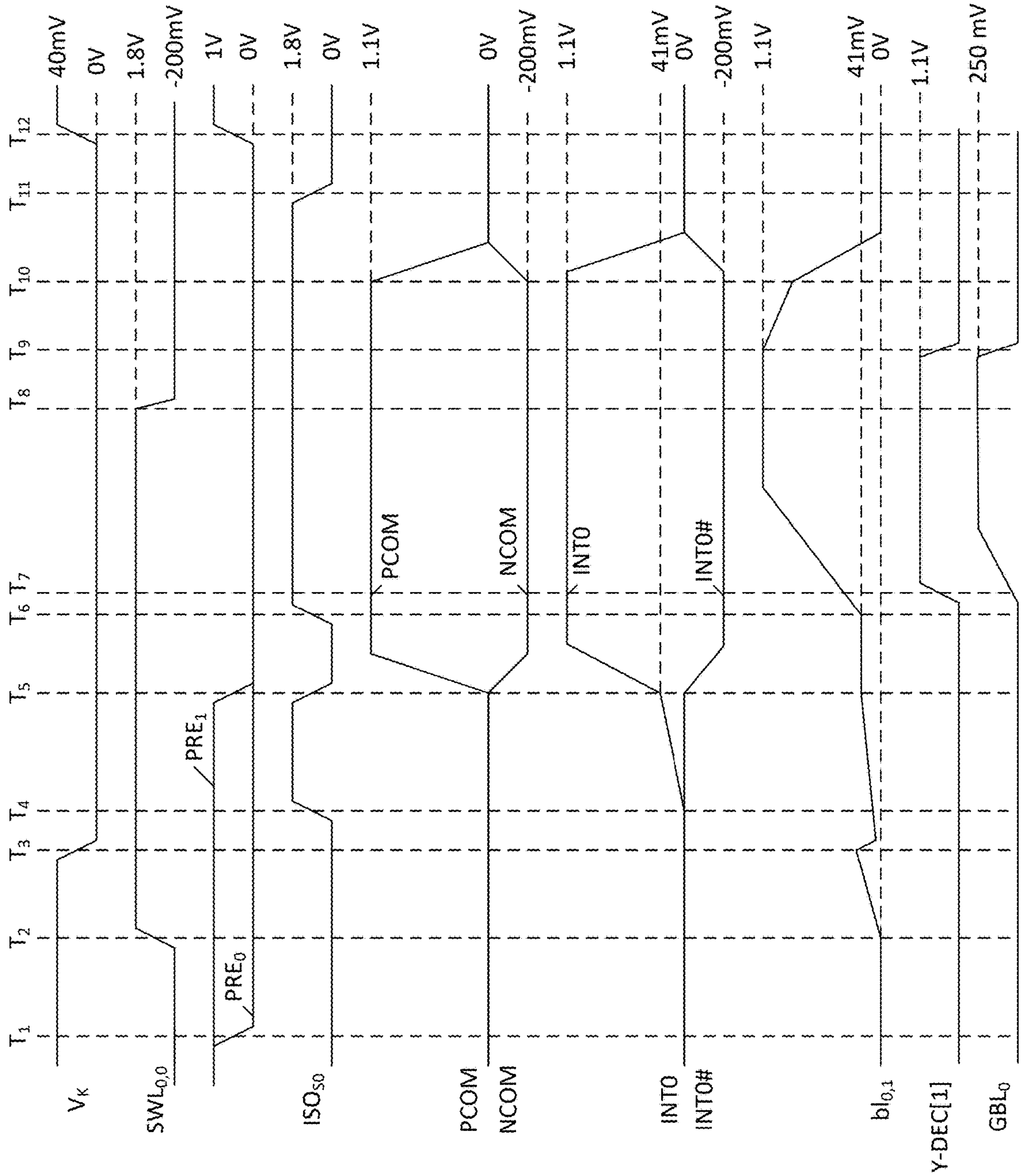
FIG. 11A is a waveform diagram illustrating signals involved in a read access to the MTDRAM sub-array of FIG. 7 in accordance with one embodiment of the present invention.

FIG. 11A is a waveform diagram illustrating the control signals used to read a (logic high) data value from bit cell $bc_{0,1}$ of sub-array $SUBA_{0,0}$ into single-ended sense amplifier $SA_{0,1}$, and then transfer this data value from the single-ended sense amplifier $SA_{0,1}$ to global bit line $GBL_0$, in accordance with one embodiment. In general, the pre-charge signals $PRE_0$ and $PRE_1$ are activated (high) to pre-charge the single-ended sense amplifier $SA_{0,1}$ prior to time T1. At time T1, the pre-charge control voltage $PRE_0$ is driven to GND, thereby turning off n-channel transistors N11 and N13, such that the internal sense amplifier nodes INT0 and INT2 are no longer actively pulled to GND through transistors N11 and N13.

At time T2, the sub-word line $SWL_{0,0}$, is driven high by the corresponding sub-word line driver circuit $SWD_{0,0}$ (in response to the $MWL_0$, $SWL_A[0]$ and $EN\_SUBA_{0,0}$ signals), thereby enabling the bit cell $bc_{0,1}$ to provide positive charge onto corresponding bit line $bl_{0,1}$. At time T3, the kick voltage $V_K$ is activated low, thereby further developing the signal on the bit line $bl_{0,1}$. At time T4, the $ISO_{S0}$ signal is activated, thereby coupling the bit line $bl_{0,1}$ to internal node $INT_0$ of single-ended sense amplifier $SA_{0,1}$. At time T5, the pre-charge signal $PRE_1$ and the $ISO_{S0}$ signal are deactivated, and the PCOM and NCOM voltages are activated, effectively enabling the single-ended sense amplifier $SA_{0,1}$ to latch a logic high data value (i.e., a full read voltage is developed across the internal nodes INT0 and INT0# of single-ended sense amplifier $SA_{0,1}$). At time T6, the $ISO_{S0}$ signal is re-activated, such that the read voltage developed on internal node INT0 is driven onto bit line $bl_{0,1}$ to refresh the bit cell $bc_{0,0}$. Shortly after time T6 (i.e., at time T7), the Y-address signal associated with bit line $bl_{0,1}$ (i.e., Y-DEC[1]) is activated high (e.g., 1.1V), thereby coupling the internal node INT0 to global bit line $GBL_0$. Under these conditions, the voltage on global bit line $GBL_0$ is driven to a logic high voltage of about 250 mV (due to the capacitance of the global bit line structure, which is described in more detail below). Note that a read data voltage of about −200 mV is provided on the global bit line $GBL_0$ when a logic low data value is read from bit cell $bc_{0,1}$. The operation of the single-ended sense amplifier $SA_{0,1}$ is described in more detail in U.S. patent application Ser. No. 18/399,579, which is hereby incorporated by reference in its entirety. Note that the Y-DEC[1] and $GBL_0$ signals are deactivated around time T9.

Figure 11B:
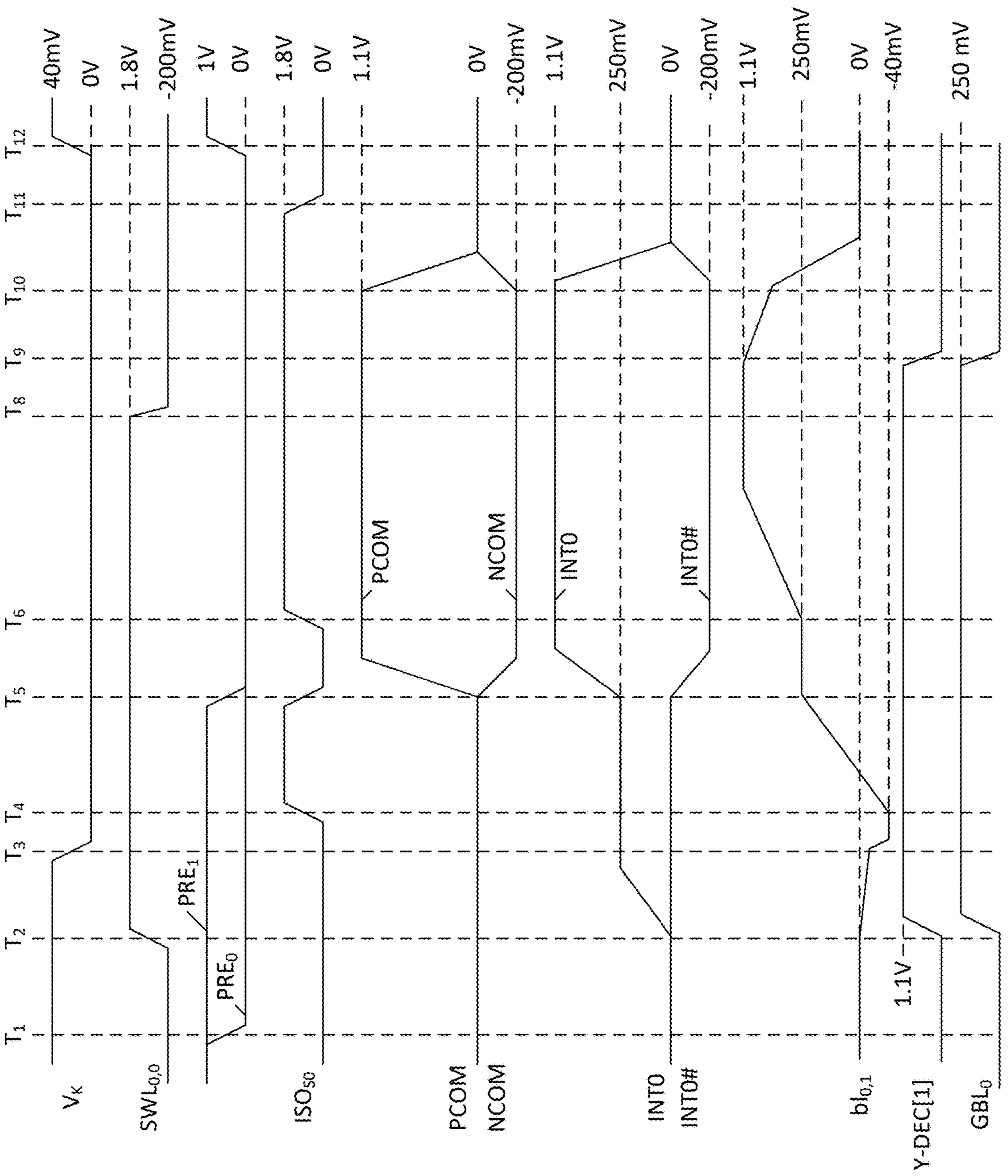
FIG. 11B is a waveform diagram illustrating signals involved in a write access to the MTDRAM sub-array of FIG. 7 in accordance with one embodiment of the present invention.

FIG. 11B is a waveform diagram illustrating the control signals used to write a logic high data value from global bit line $GBL_0$ into single-ended sense amplifier $SA_{0,1}$, and then transfer this data value from the single-ended sense amplifier $SA_{0,1}$ onto bit line $bl_{0,1}$ and into bit cell $bc_{0,1}$ in accordance with one embodiment. Processing proceeds in a similar manner as the read access of FIG. 11A between time T1 to T5, with exceptions noted below. In the illustrated embodiment, bit cell $bc_{0,1}$ stores a logic low data value, such that the voltage on bit line $bl_{0,1}$ is initially pulled down below 0V when the sub-word line $SWL_{0,0}$ is activated at time T2. Also at time T2, a write driver circuit within the secondary sense amplifier circuit $SSA_{1,1}$ (described in more detail below), drives a logic high write data value (250 mV) onto global bit line $GBL_0$. Also at time T2, the Y-address signal associated with bit line $bl_{0,1}$ (i.e., Y-DEC[1]) is activated high (e.g., 1.1V), thereby coupling the internal node INT0 to global bit line $GBL_0$. Under these conditions, the internal node INT0 is driven to a voltage of 250 mV. At time T3, the activated kick voltage Vk drives the voltage on bit line $bl_{0,1}$ down to −40 mV. The $ISO_{S0}$ signal is activated between time T4 and T5, whereby the 250 mV voltage on the internal node INT0 is applied to bit line $bl_{0,1}$. Advantageously, the single-ended sense amplifier $SA_{0,1}$ is not activated until time T5 (i.e., PCOM and NCOM do not transition until time T5). As a result, the write driver circuit does not need to flip the state of the single-ended sense amplifier $SA_{0,1}$ (i.e., the write driver circuit only needs to overcome the relatively small voltage (−40 mV) initially developed on the bit line $bl_{0,1}$ at time T4).

At time T5, the pre-charge signal $PRE_1$ and the $ISO_{S0}$ signal are deactivated, and the PCOM and NCOM voltages are activated, effectively enabling the single-ended sense amplifier $SA_{0,1}$ to latch a logic high write data value (i.e., a full write voltage is developed across the internal nodes INT0 and INT0# of single-ended sense amplifier $SA_{0,1}$). At time T6, the $ISO_{S0}$ signal is re-activated, such that the write voltage developed on internal node INT0 is driven onto bit line $bl_{0,1}$ to write bit cell $bc_{0,1}$. Signal processing proceeds in the manner illustrated by FIG. 11B to complete the write access. Note that the write driver circuit drives a voltage of −200 mV on the global bit line $GBL_0$ to write a logic low data value to bit cell $bc_{0,1}$. Note that the Y-DEC[1] and $GBL_0$ signals are deactivated around time T9.

Figure 12:
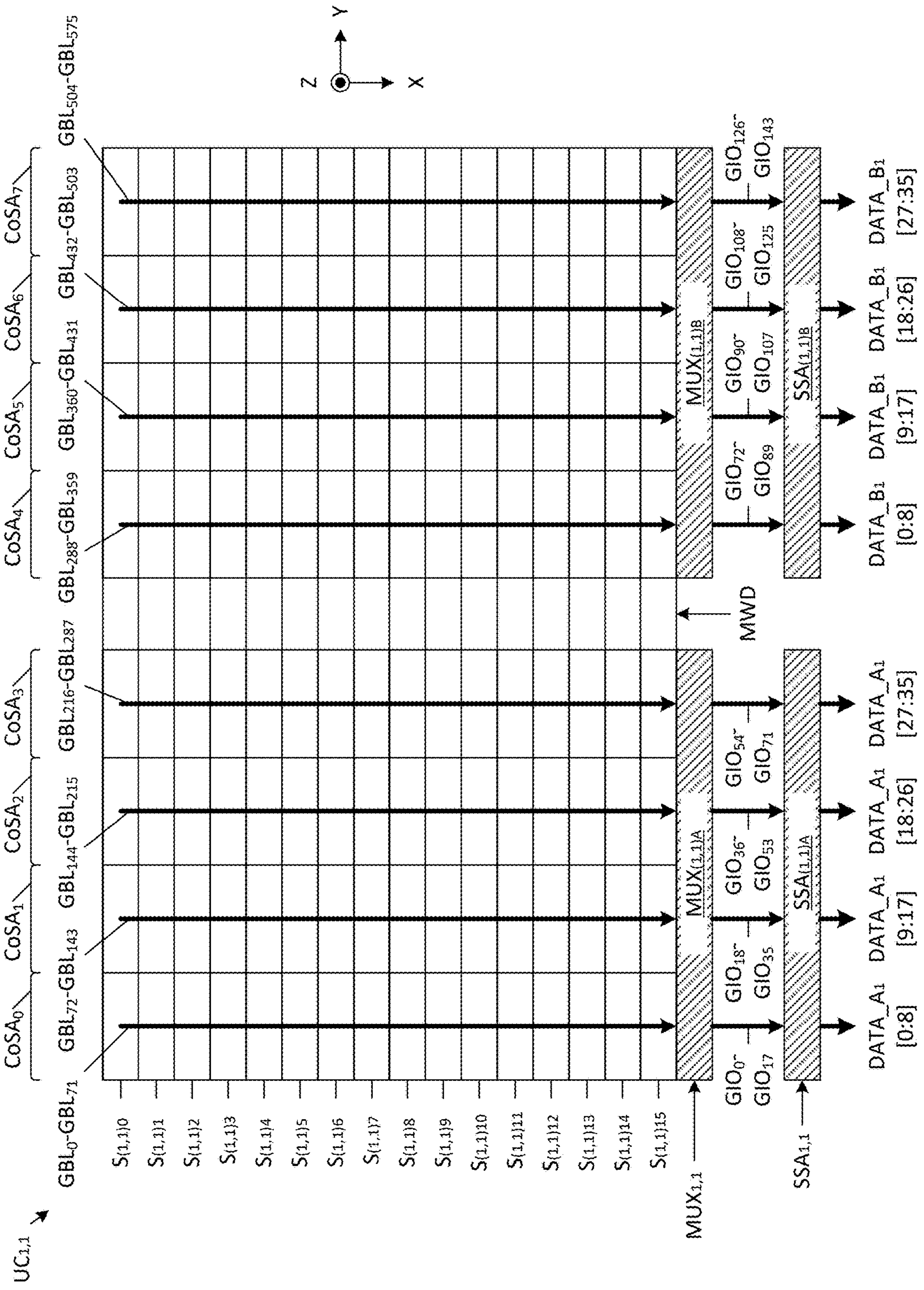
FIG. 12 is a diagram illustrating the data channels of the MTDRAM unit cell of FIG. 6 in accordance with one embodiment of the present invention.

FIG. 12 is a diagram illustrating the data channels of unit cell $UC_{1,1}$ in accordance with one embodiment of the invention. As described above in connection with FIG. 10, each of the sub-array columns $CoSA_0$-$CoSA_7$ includes a set of 72 global bit lines, which extend in parallel along the X-axis through strips $S_{(1,1)0}$-$S_{(1,1)15}$. More specifically, sub-array columns $CoSA_0$, $CoSA_1$, $CoSA_2$, $CoSA_3$, $CoSA_4$, $CoSA_5$, $CoSA_6$ and $CoSA_7$ include 72-bit global bit line sets $GBL_0$-$GBL_{71}$, $GBL_{72}$-$GBL_{143}$, $GBL_{144}$-$GBL_{215}$, $GBL_{216}$-$GBL_{287}$, $GBL_{288}$-$GBL_{359}$, $GBL_{360}$-$GBL_{431}$, $GBL_{432}$-$GBL_{503}$ and $GBL_{504}$-$GBL_{575}$, respectively, as illustrated. These global bit lines $GBL_0$-$GBL_{575}$ are coupled to multiplexer $MUX_{1,1}$. More specifically, global bit lines $GBL_0$-$GBL_{287}$ (which are associated with the left-side sub-arrays) are coupled to a first multiplexer section $MUX_{(1,1)A}$ of multiplexer $MUX_{1,1}$, which is dedicated to data channel $DATA\_A_1$ of unit stack $US_1$. Similarly, global bit lines $GBL_{288}$-$GBL_{575}$ (which are associated with the right-side sub-arrays) are coupled to a second multiplexer section $MUX_{(1,1)B}$ of multiplexer $MUX_{1,1}$, which is dedicated to data channel $DATA\_B_1$ of unit stack $US_1$.

If there is a read access to unit cell $UC_{1,1}$ on data channel $DATA\_A_1$, multiplexer section $MUX_{(1,1)A}$ is controlled to route a 72-bit data value from one of the 72-bit global bit line sets $GBL_0$-$GBL_{71}$, $GBL_{72}$-$GBL_{143}$, $GBL_{144}$-$GBL_{215}$ or $GBL_{216}$-$GBL_{287}$ on global input/output (I/O) lines $GIO_0$-$GIO_{71}$.

Similarly, if there is a read access to unit cell $UC_{1,1}$ on data channel $DATA\_B_1$, multiplexer section $MUX_{(1,1)B}$ is controlled to route a 72-bit data value from one of the 72-bit global bit line sets $GBL_{288}$-$GBL_{359}$, $GBL_{360}$-$GBL_{431}$, $GBL_{432}$-$GBL_{503}$ or $GBL_{504}$-$GBL_{575}$ on global I/O lines $GIO_{72}$-$GIO_{143}$.

Global I/O lines $GIO_0$-$GIO_{143}$ are coupled to secondary sense amplifier circuit $SSA_{1,1}$. More specifically, global input/output lines $GIO_0$-$GIO_{71}$ are coupled to a first secondary sense amplifier section $SSA_{(1,1)A}$ of secondary sense amplifier circuit $SSA_{1,1}$, which is dedicated to data channel $DATA\_A_1$ of unit stack $US_1$. Similarly, global input/output lines $GIO_{72}$-$GIO_{143}$ are coupled to a second secondary sense amplifier section $SSA_{(1,1)B}$ of secondary sense amplifier circuit $SSA_{1,1}$, which is dedicated to data channel $DATA\_B_1$ of unit stack $US_1$.

If there is a read access to unit cell $UC_{1,1}$ on data channel $DATA\_A_1$, secondary sense amplifier section $SSA_{(1,1)A}$ is controlled to route a 72-bit data value received from multiplexer section $MUX_{(1,1)A}$ to data channel $DATA\_A_1$ as two 36-bit data values. As described in more detail below, the secondary sense amplifier section $SSA_{(1,1)A}$ routes these two 36-bit data values at twice the frequency (2 GHz) that the 72-bit data values are read from the sub-arrays (1 GHz). The 36-bit data values routed by the secondary sense amplifier section $SSA_{(1,1)A}$ are labeled $DATA\_A_1$[0:35] in FIG. 12.

Similarly, if there is a read access to unit cell $UC_{1,1}$ on data channel $DATA\_B_1$, secondary sense amplifier section $SSA_{(1,1)B}$ is controlled to amplify and route a 72-bit data value received from multiplexer section $MUX_{(1,1)B}$ to data channel $DATA\_B_1$ as two 36-bit data values in the same manner that multiplexer section $MUX_{(1,1)A}$ amplifies and routes 72-bit data values to data channel $DATA\_A_1$. The 36-bit data values routed by the secondary sense amplifier section $SSA_{(1,1)B}$ are labeled $DATA\_B_1$[0:35] in FIG. 12.

It is understood that the secondary sense amplifier section $SSA_{(1,1)A}$ drives the output data values $DATA\_A_1$[0:35] onto 36 corresponding TSVs in TSV set $TSV_{1,1}$ (and the secondary sense amplifier section $SSA_{(1,1)B}$ similarly drives the output data values $DATA\_B_1$[0:35] onto 36 corresponding TSVs in TSV set $TSV_{1,1}$).

Note that in other embodiments, the secondary sense amplifier sections $SSA_{(1,1)A}$ and $SSA_{(1,1)B}$ can route the received 72-bit data values in other manners. For example, in an alternate embodiment, secondary sense amplifier sections $SSA_{(1,1)A}$ and $SSA_{(1,1)B}$ may be configured to route the 72-bit data values received from multiplexer sections $MUX_{(1,1)A}$ and $MUX_{(1,1)B}$ to data channels $DATA\_A_1$ and $DATA\_B_1$ as four 18-bit data values a frequency of 4 GHz.

In this embodiment, the number of TSVs required to implement the corresponding unit stack $US_1$ is advantageously reduced (by 36).

Further note that the read data paths described above are reversed for write operations (wherein secondary sense amplifier sections $SSA_{(1,1)A}$ and $SSA_{(1,1)B}$ include write driver circuits, which are described in more detail below).

Figure 13:
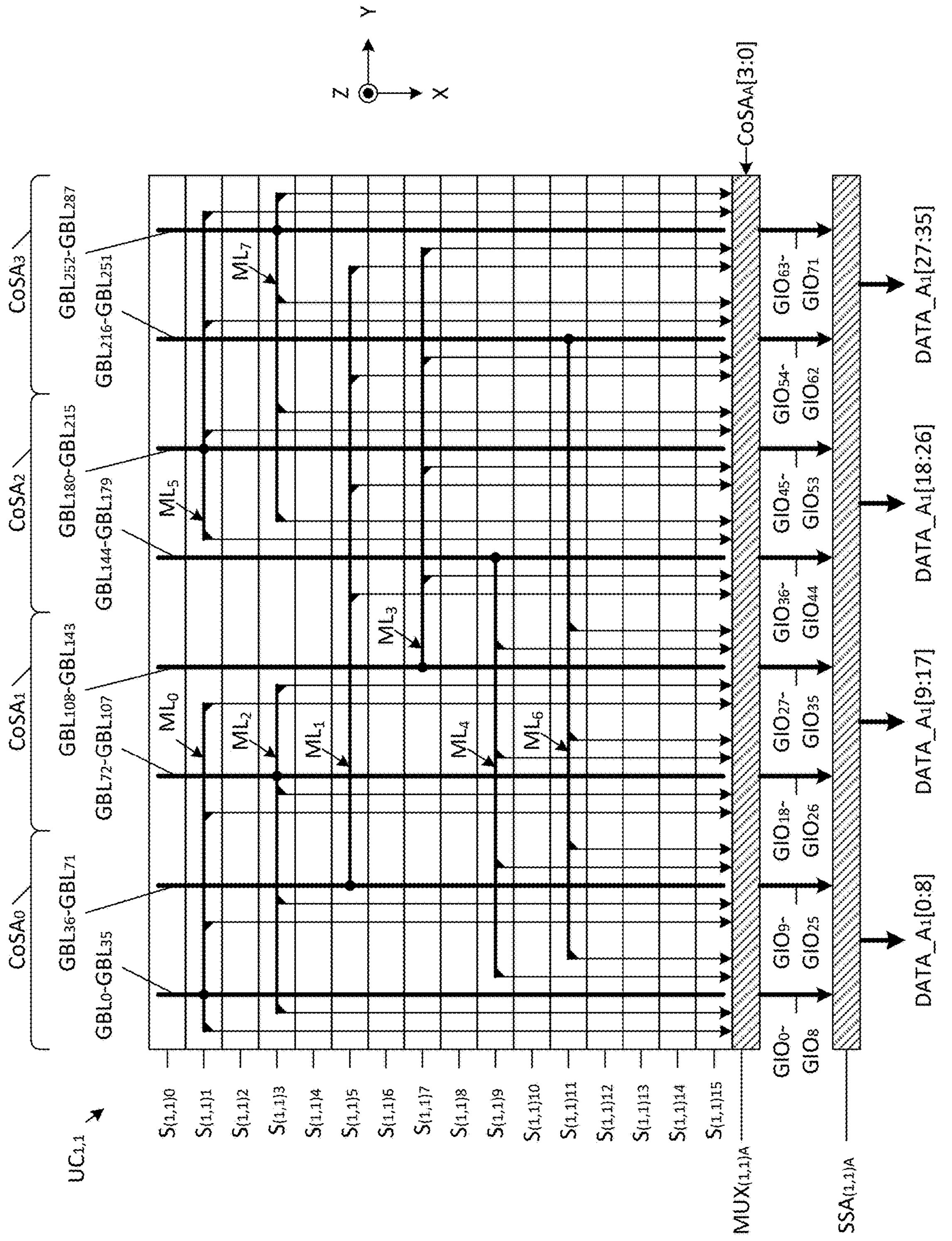
FIG. 13 is a diagram illustrating the manner in which data on global bit lines associated with a first data channel of an MTDRAM unit cell are routed to a multiplexer section in accordance with one embodiment of the present invention.

FIG. 13 is a diagram illustrating the manner in which the signals on the global bit lines $GBL_0$-$GBL_{287}$ are routed to the multiplexer section $MUX_{(1,1)A}$ in accordance with one embodiment of the present invention. It is understood that the signals on global bit lines $GBL_{288}$-$GBL_{575}$ are routed to the multiplexer section $MUX_{(1,1)B}$ in the same manner.

In general, the global bit lines $GBL_0$-$GBL_{287}$ extend in parallel along the X-axis width of the strips $S_{(1,1)0}$-$S_{(1,1)15}$, as illustrated. The signals of each set of 72 global bit lines are distributed horizontally along the X-Axis width of the multiplexer $MUX_{(1,1)A}$, in eight 9-bit groups. In one embodiment, horizontal metal lines (along the Y-axis) are used to distribute the signals from the global bit lines.

For example, a set of 36 metal lines $ML_0$ distribute the signals on global bit lines $GBL_0$-$GBL_{35}$ along the Y-axis, as illustrated. Nine of these 36 metal lines $ML_0$ distribute global bit lines $GBL_0$-$GBL_8$ to the left (in the negative direction along the Y-axis), and 27 of these 36 metal lines distribute global bit lines $GBL_9$-$GBL_{35}$ to the right (in the positive direction along the Y-axis). Thus, the required layout height of the metal lines $ML_0$ along the X-axis is only 27 metal lines high.

Similarly, a set of 36 metal lines $ML_1$ distribute the signals on global bit lines $GBL_{36}$-$GBL_{71}$ along the Y-axis, as illustrated. All 36 of these metal lines $ML_1$ distribute global bit lines $GBL_{36}$-$GBL_{71}$ to the right (in the positive direction along the Y-axis). Thus, the required layout height of the metal lines $ML_1$ along the X-axis is 36 metal lines high.

A set of 36 metal lines $ML_2$ distribute the signals on global bit lines $GBL_{72}$-$GBL_{107}$ along the Y-axis, as illustrated. Nine of these 36 metal lines $ML_2$ distribute global bit lines $GBL_{99}$-$GBL_{107}$ to the right (in the positive direction along the Y-axis), and 27 of these 36 metal lines distribute global bit lines $GBL_{72}$-$GBL_{98}$ to the left (in the negative direction along the Y-axis). Thus, the required layout height of the metal lines $ML_2$ along the X-axis is only 27 metal lines high.

Similarly, a set of 36 metal lines $ML_3$ distribute the signals on global bit lines $GBL_{108}$-$GBL_{143}$ along the Y-axis, as illustrated. All 36 of these metal lines $ML_3$ distribute global bit lines $GBL_{108}$-$GBL_{143}$ to the right (in the positive direction along the Y-axis). Thus, the required layout height of the metal lines $ML_3$ along the X-axis is 36 metal lines high.

A set of 36 metal lines $ML_4$ distribute the signals on global bit lines $GBL_{144}$-$GBL_{179}$ along the Y-axis in a pattern having a height of 36 metal lines along the X-axis, as illustrated.

A set of 36 metal lines $ML_5$ distribute the signals on global bit lines $GBL_{180}$-$GBL_{215}$ in a pattern having a height of 27 metal lines along the X-axis, as illustrated. In the illustrated embodiment, the set of metal lines $ML_5$ are located at the same latitude as the set of metal lines $ML_0$, such that the set of metal lines $ML_5$ do not add to the required height of the metal line structure along the X-axis.

A set of 36 metal lines $ML_6$ distribute the signals on global bit lines $GBL_{216}$-$GBL_{251}$ along the Y-axis in a pattern having a height of 36 metal lines along the X-axis, as illustrated.

A set of 36 metal lines $ML_7$ distribute the signals on global bit lines $GBL_{252}$-$GBL_{287}$ in a pattern having a height of 27 metal lines along the X-axis, as illustrated. In the illustrated embodiment, the set of metal lines $ML_7$ are located at the same latitude as the set of metal lines $ML_2$, such that the set of metal lines $ML_7$ do not add to the required height of the metal line structure along the X-axis.

The configuration of FIG. 13 requires a total of 27+27+36+36+36+36, or 198 horizontal metal line tracks, each extending in parallel with the Y-axis. Note that sufficient area for these 198 horizontal metal line tracks is provided by limiting the main word line configuration to one (metal) word line per eight sub-word lines as set forth above in connection with FIG. 7 (wherein the sub-word lines $SWL_{0,0}$-$SWL_{7,0}$ are implemented using conductive polysilicon structures, rather than metal layer lines). The pitch between the metal main word lines (MWL) (along the X-axis) is equal to the height of 4 bit cells (along the X-axis), so the above-described configuration (of one metal main word line for each eight rows of bit cells) advantageously reduces the number of main word line tracks required within the unit cell by a factor of 2, thereby freeing up the necessary horizontal tracks for routing the global bit lines in the manner illustrated by FIG. 13.

The configuration of FIG. 13 requires 288×2 or 576 vertical metal lines, including 288 global bit lines $GBL_0$-$GBL_{287}$ and 288 metal lines that extend vertically along the X-axis from the metal line sets $ML_0$-$ML_7$ to the multiplexer section $MUX_{(1,1)A}$.

Figure 14:
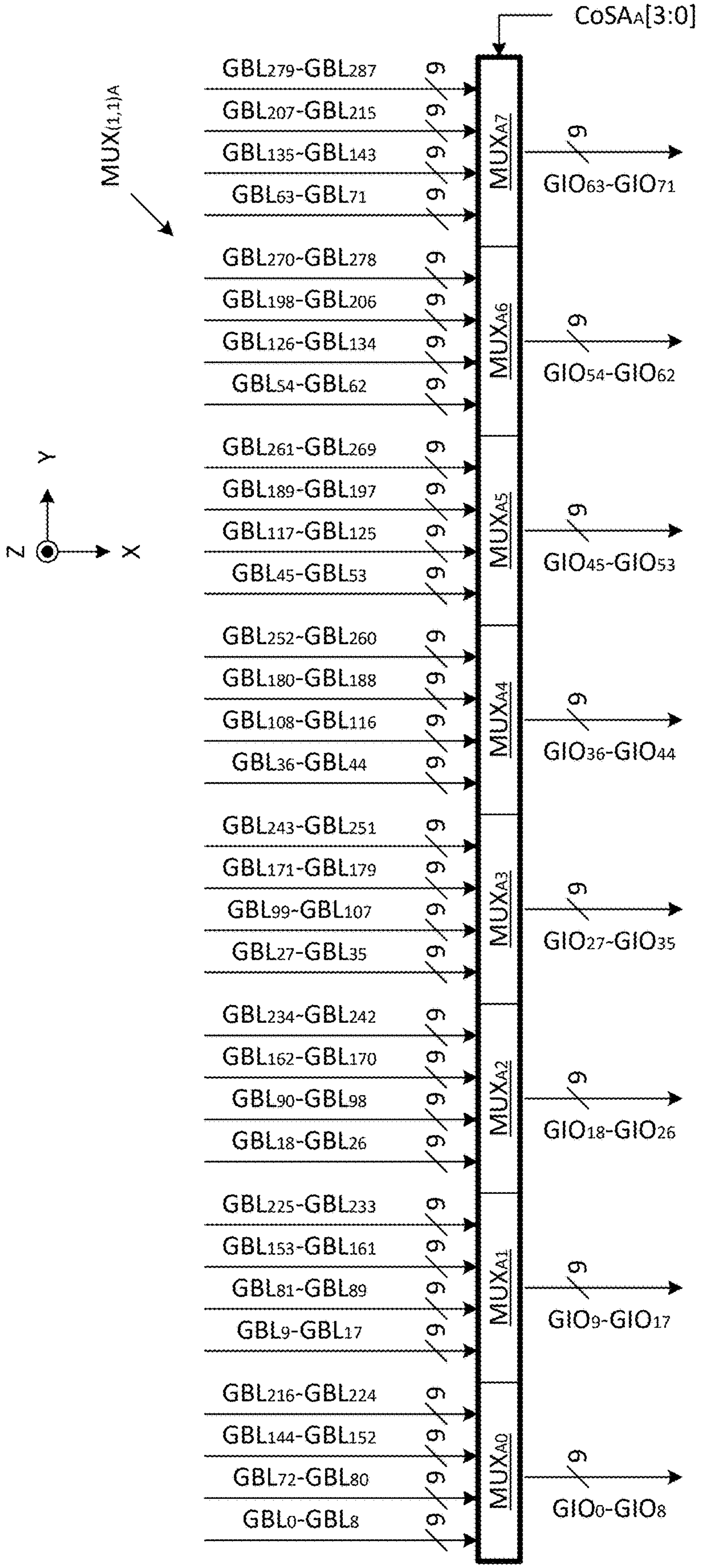
FIG. 14 is a diagram illustrating the manner in which the global bit lines of FIG. 10 are distributed to the multiplexer section and the manner in which the multiplexer section routes data on the global bit lines to global input/output (I/O) lines in accordance with one embodiment of the present invention.

FIG. 14 is a diagram illustrating the manner in which the global bit lines $GBL_0$-$GBL_{287}$ are distributed to the multiplexer section $MUX_{(1,1)A}$ in accordance with the present embodiment. Multiplexer section $MUX_{(1,1)A}$ includes eight 4-to-1 multiplexers $MUX_{A0}$-$MUX_{A7}$, wherein each of these multiplexers is coupled to 9 global bit lines from each of the four sub-array columns $CoSA_0$-$CoSA_3$. For example, multiplexer $MUX_{A0}$ is coupled to the nine global bit lines $GBL_0$-$GBL_8$ of sub-array column $CoSA_0$, the nine global bit lines $GBL_{72}$-$GBL_{80}$ of sub-array column $CoSA_1$, the nine global bit lines $GBL_{144}$-$GBL_{152}$ of sub-array column $CoSA_2$, and the nine global bit lines $GBL_{216}$-$GBL_{224}$ of sub-array column $CoSA_3$. This pattern is repeated for the remaining multiplexers $MUX_{A1}$-$MUX_{A7}$.

Multiplexers $MUX_{A0}$-$MUX_{A7}$ are controlled by a predecoded sub-array column address $COSA_A[3:0]$, wherein the address values $COSA_A[0]$, $COSA_A[1]$, $COSA_A[2]$ and $COSA_A[3]$, when activated, connect the global bit lines from sub-array columns $CoSA_0$, $CoSA_1$, $CoSA_2$ and $CoSA_3$, respectively, to the global I/O lines $GIO_0$-$GIO_{71}$. For example, a sub-array column address $CoSA_A[3:0]$ of '0001' will cause multiplexers $MUX_{A0}$-$MUX_{A7}$ to connect the global bit lines $GBL_0$-$GBL_{71}$ of sub-array column $CoSA_0$ to the global I/O lines $GIO_0$-$GIO_{71}$. The pre-decoded sub-array column address $CoSA_A[3:0]$ is provided on the instruction bus $INST_1$.

It is understood that multiplexer $MUX_{(1,1)B}$ operates in the same manner as multiplexer $MUX_{(1,1)A}$, although multiplexer $MUX_{(1,1)B}$ operates in response to the signals on global bit lines $GBL_{288}$-$GBL_{575}$, and is controlled by a separate pre-decoded sub-array column address $CoSA_B[3:0]$ (wherein the address values $CoSA_B[0]$, $CoSA_B[1]$, $CoSA_B[2]$ and $CoSA_B[3]$, when activated, connect the global bit lines from sub-array columns $CoSA_4$, $CoSA_5$, $CoSA_6$ and $CoSA_7$, respectively, to the global I/O lines $GIO_{72}$-$GIO_{143}$). The pre-decoded sub-array column address $CoSA_B[3:0]$ is provided on the instruction bus $INST_1$.

Figure 15:
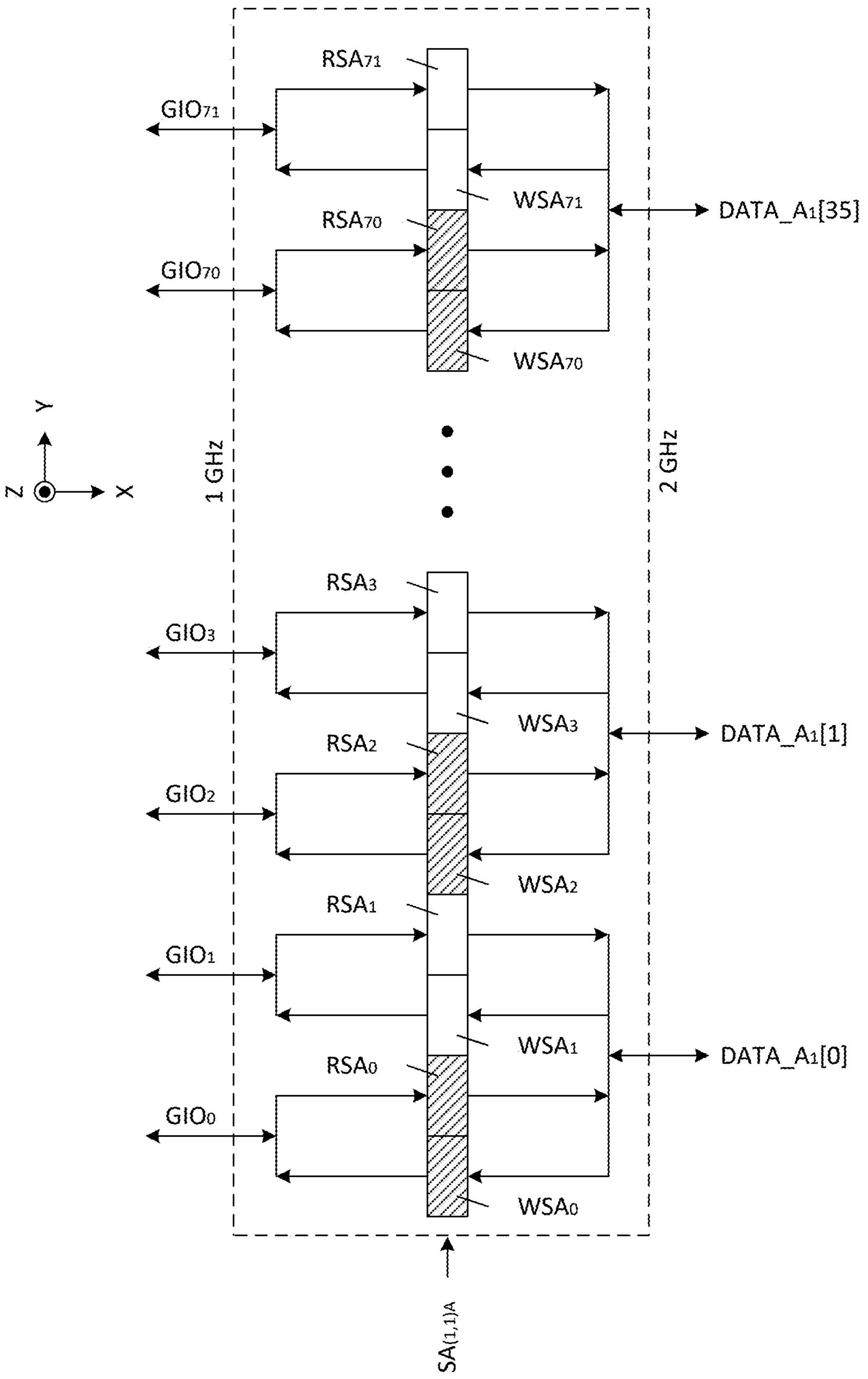
FIG. 15 is a diagram of a secondary sense amplifier that transfers read values from the global I/O lines of FIG. 14 onto the TSVs of a first data channel of the MTDRAM unit cell, and transfers write data values from the first data channel of the MTDRAM unit cell to the global I/O lines of FIG. 14, in accordance with one embodiment of the present invention.

FIG. 15 is a diagram of secondary sense amplifier section $SSA_{(1,1)A}$ in accordance with one embodiment of the present invention. It is understood that secondary sense amplifier section $SSA_{(1,1)B}$ is configured and operates in the same manner as secondary sense amplifier circuit $SSA_{(1,1)A}$. Secondary sense amplifier circuit $SSA_{(1,1)A}$ includes thirty-six identical 'even' read secondary sense amplifier circuits $RSA_0$, $RSA_2$, . . . $RSA_{70}$, which are coupled to receive read data values from 'even' global I/O lines $GIO_0$, $GIO_2$, . . . $GIO_{70}$, respectively, and thirty-six identical 'odd' read secondary sense amplifier circuits $RSA_1$, $RSA_3$, . . . $RSA_{71}$, which are coupled to receive read data values from 'odd' global I/O lines $GIO_1$, $GIO_3$, . . . $GIO_{71}$, respectively. Each consecutive pair of even/odd read secondary sense amplifier circuits is coupled to a corresponding single bit (TSV) of the data bus $DATA\_A_1[0:35]$. For example, the even and odd read secondary sense amplifiers $RSA_0$ and $RSA_1$ coupled to global input output lines $GIO_0$ and $GIO_1$, respectively, are commonly coupled to a TSV (of set $TSV_{1,1}$) that carries the data bus signal $DATA\_A_1[0]$.

As described in more detail below, 72-bit read data on global I/O lines $GIO_0$-$GIO_{71}$ is transferred to secondary sense amplifier circuit $SSA_{(1,1)A}$ at a data rate of 1 GHz, and 36-bit data is read from secondary sense amplifier circuit $SSA_{(1,1)A}$ at a data rate of 2 GHz. This advantageously minimizes the required number of TSVs required to transfer read data from unit stack $US_1$ to ASIC processor block $\mathbf{105}_1$.

Secondary sense amplifier circuit $SSA_{(1,1)A}$ also includes thirty-six identical 'even' write secondary sense amplifier circuits $WSA_0$, $WSA_2$, . . . $WSA_{70}$, which are coupled to provide write data values to 'even' global I/O lines $GIO_0$, $GIO_2$, . . . $GIO_{70}$, respectively, and thirty-six identical 'odd' write secondary sense amplifier circuits $WSA_1$, $WSA_3$, . . . $WSA_{71}$, which are coupled to provide write data values to 'odd' global I/O lines $GIO_1$, $GIO_3$, . . . $GIO_{71}$, respectively. Each consecutive pair of even/odd write secondary sense amplifier circuits is coupled to a corresponding single bit (TSV) of the data bus $DATA\_A_1[0:35]$. For example, the even and odd write secondary sense amplifiers $WSA_0$ and $WSA_1$ coupled to global input output lines $GIO_0$ and $GIO_1$, respectively, are commonly coupled to a TSV (of set $TSV_{1,1}$) that carries the data bus signal $DATA\_A_1[0]$.

As described in more detail below, 36-bit write data on data bus $DATA\_A_1[0:35]$ is transferred to secondary sense amplifier section $SSA_{(1,1)A}$ at a data rate of 2 GHz, and 72-bit write data is transferred from secondary sense amplifier section $SSA_{(1,1)A}$ to global I/O lines $GIO_0$-$GIO_{71}$ at a data rate of 1 GHz. This advantageously minimizes the required number of TSVs required to transfer write data from ASIC processor block $\mathbf{105}_1$ to unit stack $US_1$.

Figure 16:
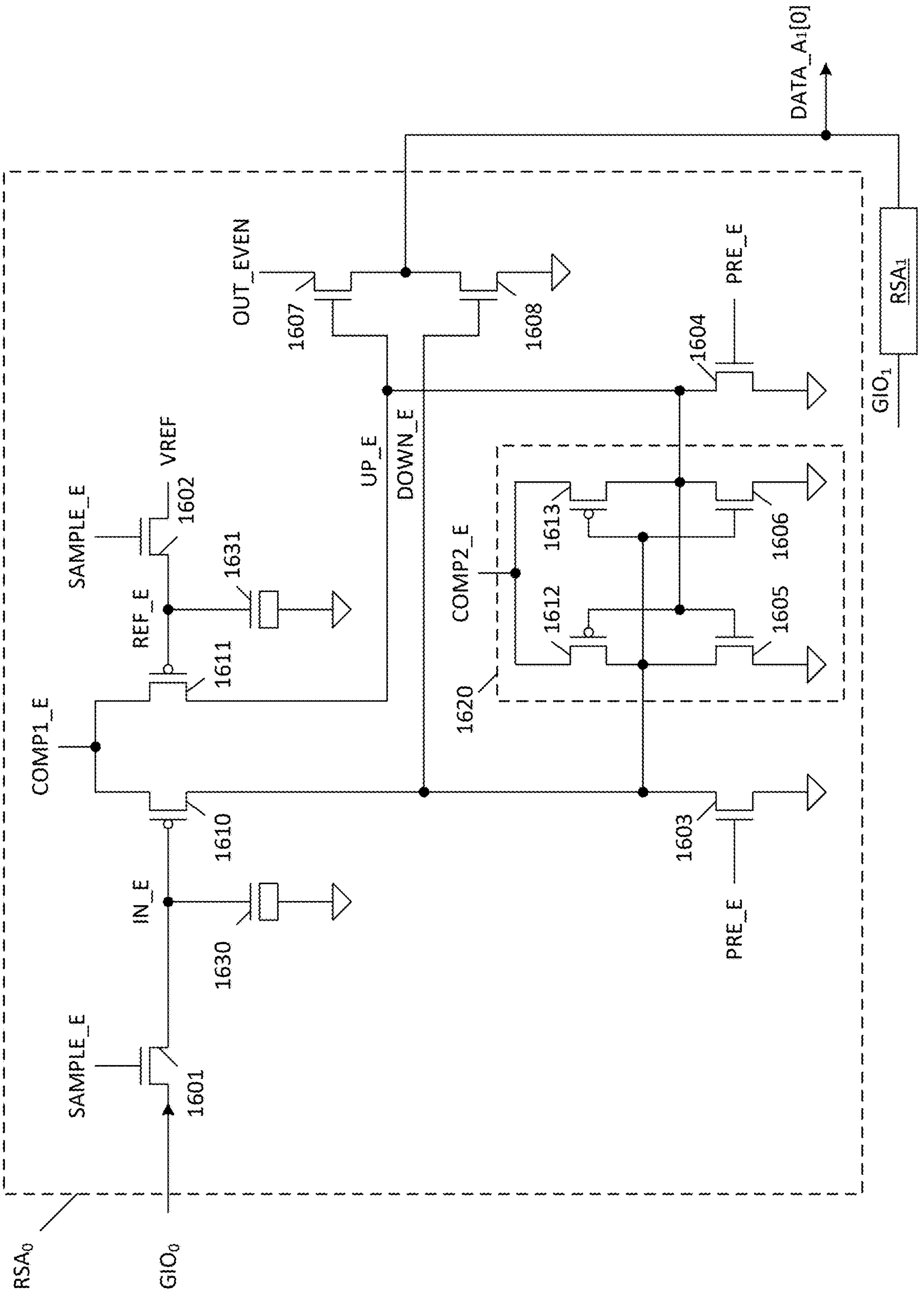
FIG. 16 is a circuit diagram of an even read secondary sense amplifier circuit of the secondary sense amplifier of FIG. 15, which is used to receive and transmit read data values received on an even global I/O line in accordance with one embodiment of the present invention.
Figure 17:
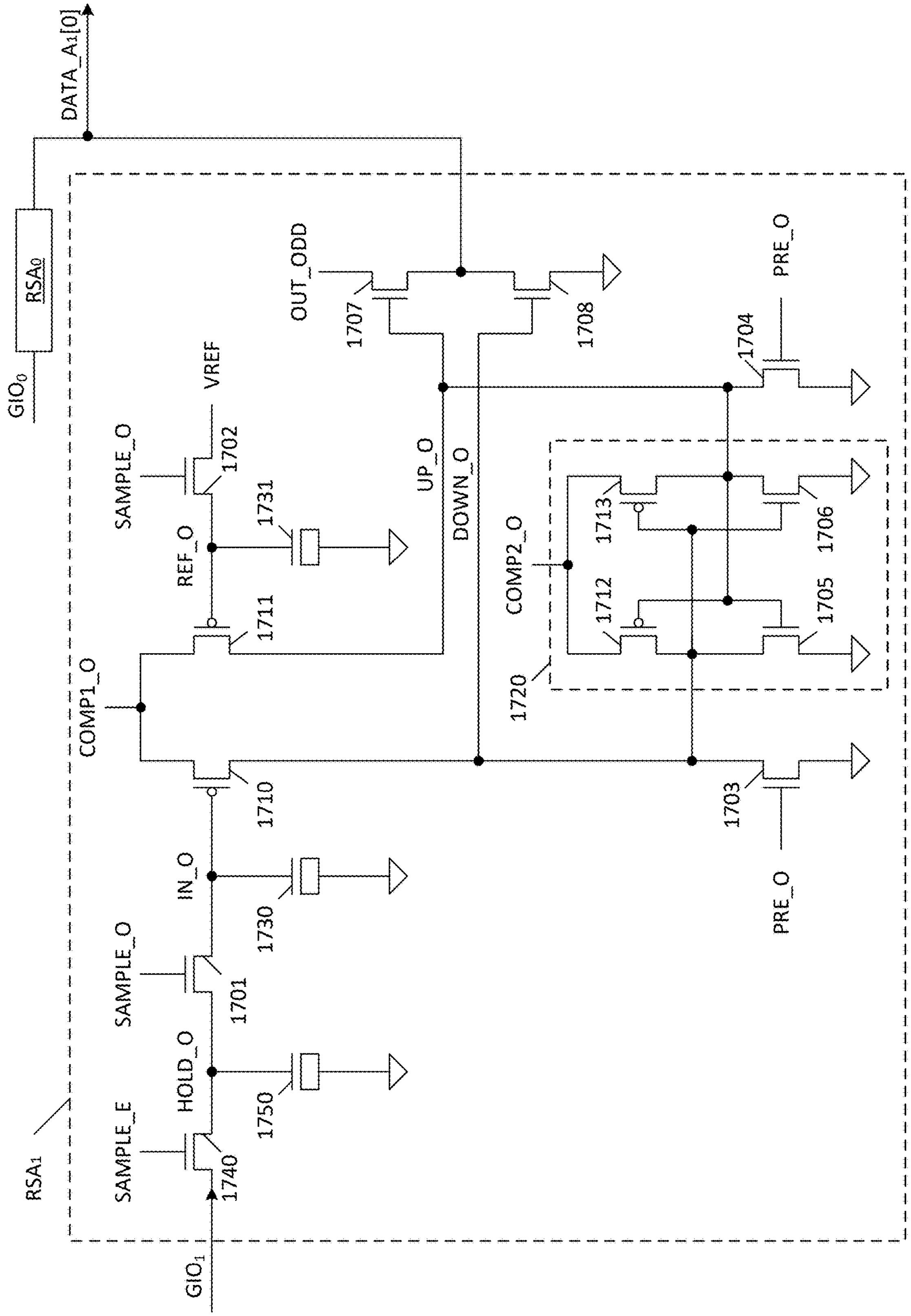
FIG. 17 is a circuit diagram of an odd read secondary sense amplifier circuit of the secondary sense amplifier of FIG. 15, which is used to receive and transmit read data values received on an odd global I/O line in accordance with one embodiment of the present invention.

FIGS. 16 and 17 are circuit diagrams of 'even' read secondary sense amplifier circuit $RSA_0$ and 'odd' read secondary sense amplifier circuit $RSA_1$, respectively, in accordance with one embodiment of the present invention. Because each of these read secondary sense amplifier circuits operate in response to the signal received on a single global I/O line, these read secondary sense amplifiers are 'single-ended sense amplifiers' as described herein.

Even read secondary sense amplifier circuit $RSA_0$ includes n-channel transistors 1601-1608, p-channel transistors 1610-1613 and capacitors 1630-1631, which are connected as illustrated in FIG. 16. N-channel transistors 1605-1606 and p-channel transistors 1612-1613 are connected to form a sense amplifier latch 1620 that includes cross-coupled inverters. P-channel transistors 1610 and 1611 form a pre-amplifier differential pair.

As illustrated by FIG. 17, odd read secondary sense amplifier circuit $RSA_1$ includes n-channel transistors 1701-1708, p-channel transistors 1710-1713 and capacitors 1730-1731, which are connected in the same manner as n-channel transistors 1601-1608, p-channel transistors 1610-1613 and capacitors 1630-1631 of even read secondary sense amplifier circuit $RSA_0$. N-channel transistors 1705-1706 and p-channel transistors 1712-1713 are connected to form a sense amplifier latch 1720 that includes cross-coupled inverters. P-channel transistors 1710 and 1711 form a pre-amplifier differential pair. Odd read secondary sense amplifier circuit $RSA_1$ also includes an additional input stage that includes n-channel transistor 1740 and capacitor 1750.

Figure 18:
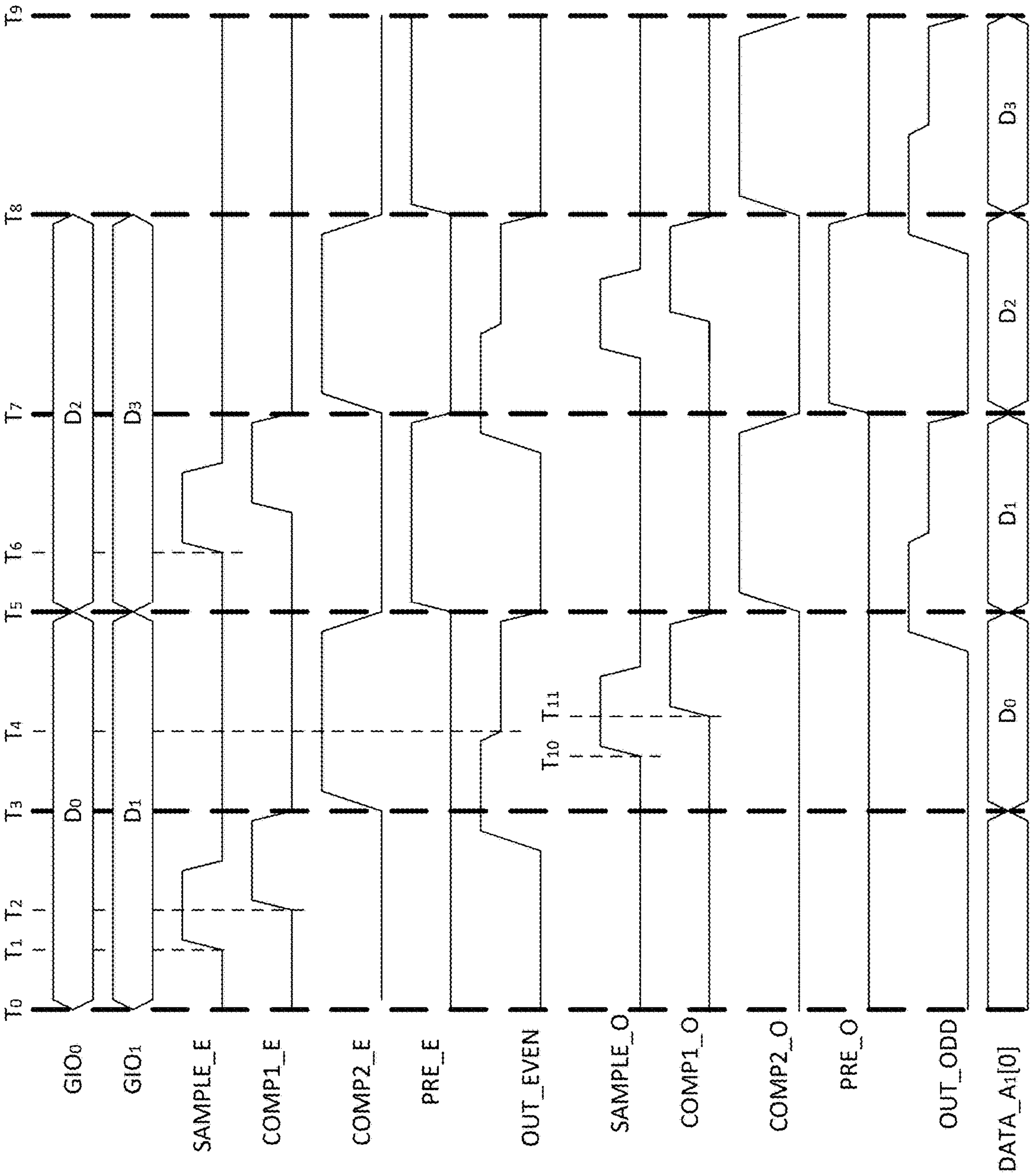
FIG. 18 is a waveform diagram illustrating the operation of the even read secondary sense amplifier circuit of FIG. 15 and the odd read secondary sense amplifier circuit of FIG. 16, in accordance with one embodiment of the present invention.

FIG. 18 is a waveform diagram illustrating the operation of 'even' read secondary sense amplifier circuit $RSA_0$ and 'odd' read secondary sense amplifier circuit $RSA_1$, in accordance with one embodiment of the present invention.

Although the present embodiment specifies particular voltages as the logic high voltages used to drive the various transistors of $RSA_0$ and $RSA_1$, it is understood that other logic high voltages can be specified in other embodiments. In general, it is desirable for the logic high voltage to be as low as possible to achieve power savings, while being high enough to enable the controlled circuits to meet speed and/or headroom requirements. In various embodiments, the logic high voltage has a value in the range of 250 mV to 1.1 Volts. It is noted that the use of specialized n-channel transistors fabricated in accordance with the MST process (described in commonly owned U.S. Pat. Nos. 10,109,342 and 10,107,854, which are hereby incorporated by reference in their entireties) allows the logic high voltage to be increased (e.g., up to 200 mV greater than the baseline Vdd supply voltage of 1.1V), effectively overdriving n-channel transistors within $RSA_0$ and $RSA_1$.

In the embodiments described below, the SAMPLE_E, SAMPLE_O, PRE_O and PRE_E control signals have logic high voltages of about 250 mV, the COMP1_E, COMP1_O, COMP2_E and COMP2_O control signals have logic high voltages of about 1.1 V to 1.3 V, and the OUT_ODD and OUT_EVEN control signals have logic high voltages of 250 mV to 350 mV.

At time T0, data values $D_0$ and $D_1$ are read out of one of the sub-array columns $CoSA_0$-$CoSA_3$, and onto global I/O lines $GIO_0$ and $GIO_1$, respectively, in the manner described above.

At time T1, the read sample signal SAMPLE_E, which is applied to the gates of n-channel transistors 1601 and 1602 in $RSA_0$ and to the gate of n-channel transistor 1740 in $RSA_1$, is activated from a logic low voltage (0V) to a logic high voltage (250 mV). Under these conditions, transistors 1601 and 1740 turn on, such that the read data values on global I/O lines $GIO_0$ and $GIO_1$ (i.e., $D_0$ and $D_1$, respectively) are applied to (and are stored by) capacitors 1630 and 1750, respectively, as the input signals IN_E and HOLD_O, respectively. In the embodiments described herein, the data values transmitted on the global I/O lines $GIO_0$ and $GIO_1$, exhibit a logic low voltage of ground (0V) and a logic high voltage of 250 mV. Capacitor 1750 is large enough to ensure there is no noticeable charge leakage from this device during the time that the sampled data value must be stored as the HOLD_O value (e.g., a few ns).

Also under these conditions, transistor 1602 turns on, such that the reference voltage VREF is applied to (and is stored by) capacitor 1631 as the reference signal REF_E. In the embodiments described herein, the reference VREF (and therefore the reference signal REF_E) has a voltage a little less than half of the logic high voltage on the global I/O lines (e.g., a little less than 250 mV/2, or about 110 mV in one embodiment). Capacitors 1601 and 1602 are matched, and are large enough that there is no noticeable (e.g., 5% or less) differential signal coupling mismatch to transistors 1610 and 1611.

The input signal IN_E stored by capacitor 1630 is applied to the gate of p-channel transistor 1610 and the input signal REF_E stored by capacitor 1631 is applied to the gate of p-channel transistor 1611, as illustrated. In the described embodiments, transistors 1610-1611 are identical, transistors 1601-1602 are identical, and capacitors 1630-1631 are identical, thereby balancing the inputs of read secondary sense amplifier $RSA_0$.

At time T2, the comparator enable signal COMP1_E is activated from a logic low voltage (0V) to a logic high voltage of about 1.1 to 1.3 Volts within read secondary sense amplifier circuit $RSA_0$. Under these conditions, differential UP_E and DOWN_E voltages are developed on the drains of p-channel transistors 1610 and 1611, respectively, wherein the DOWN_E voltage developed on the drain of transistor 1610 is representative of the voltage of the input signal IN_E, and the UP_E voltage on the drain of transistor 1611 is representative of the reference voltage REF_E applied to the gate of transistor 1611. In the described embodiment, the reference voltage REF_E is equal to 110 mV, which is slightly less than half of the logic high voltage of input signal IN_E (250 mV).

If the voltage of the input signal IN_E is less than the reference voltage REF_E (i.e., if IN_E is=0V), then the voltage of the UP_E signal will be less than the voltage of the DOWN_E signal. Conversely, if the voltage of the input signal IN_E is greater than the reference voltage REF_E (i.e., if IN_E is=250 mV), then the voltage of the UP_E signal will be greater than the voltage of the DOWN_E signal.

At time T2, the comparator enable signal COMP1_E is deactivated from the logic high voltage to a logic low voltage (0V), as illustrated. Also at time T2, the comparator enable signal COMP2_E is activated from a logic low voltage (0V) to a logic high voltage of about 1.1 V to 1.3 V, thereby enabling sense amplifier latch 1620.

Under these conditions, sense amplifier latch 1620 amplifies the difference between the differential UP_E and DOWN_E voltages, such that the sense amplifier latch 1620 stores a data value representative of the voltage received on global I/O line $GIO_0$. For example, if the UP_E voltage is less than the DOWN_E voltage, then latch 1620 will pull the DOWN_E voltage up to the voltage of the COMP2_E signal (350 mV), and will pull the UP_E voltage to ground. Conversely, if the UP_E voltage is greater than the DOWN_E voltage, then latch 1620 will pull the DOWN_E voltage down to ground, and will pull the UP_E voltage up to the voltage of the COMP2_E signal (e.g., 1.1V to 1.3V).

The UP_E and DOWN_E voltages are applied to the gates of n-channel transistors 1607 and 1608, respectively. As described above, when the sense amplifier latch 1620 is enabled, either the UP_E voltage or the DOWN_E voltage will be pulled up to 1.1 to 1.3 V, thereby turning on the corresponding n-channel transistor 1607 or 1608, respectively.

Just prior to time T2, the output control signal OUT_EVEN is driven from ground (0V) to the slightly boosted voltage of 350 mV. Thus, if the UP_E voltage is pulled up to 350 mV, the corresponding n-channel transistor 1607 is turned on, and the $DATA\_A_1[0]$ output signal is initially pulled up to 350 mV at the output of read secondary sense amplifier $RSA_0$. Shortly after the sense amplifier latch 1620 is enabled (e.g., at time T4), the output control signal OUT_EVEN is reduced from 350 mV to 250 mV, such that the $DATA\_A_1[0]$ output signal is pulled up to 250 mV at the output of read secondary sense amplifier $RSA_0$. The voltage at the output of read secondary sense amplifier $RSA_0$ is initially boosted based on the significant capacitance of the $DATA\_A_1[0]$ signal line structure (see, e.g., FIG. 4). The duration of this voltage boost is controlled such that the voltage received at the processor block $105_1$ quickly reaches, but does not exceed, 250 mV.

Maintaining the OUT_EVEN signal at 0V from time T0 until just prior to time T3 advantageously minimizes leakage current in n-channel transistor 1607 and reduces the power requirements of read secondary sense amplifier $RSA_0$. However, it is understood that in other embodiments the OUT_EVEN voltage can be maintained at a voltage of 250 mV (or 350 mV) from time T0 to time T3.

If the DOWN_E voltage is pulled up to the logic high voltage of 1.1 to 1.3V when the sense amplifier latch 1620 is enabled at time T2, the corresponding n-channel transistor 1608 is turned on, and the $DATA\_A_1[0]$ output signal is pulled down to ground (0V) at the output of read secondary sense amplifier $RSA_0$.

At time T5, the COMP2_E signal is deactivated from the logic high voltage (1.1 to 1.3V) to a logic low voltage (0V) as illustrated, thereby disabling the sense amplifier latch 1620, such that the secondary sense amplifier $SSA_{EVEN}$ no longer actively drives the $DATA\_A_1[0]$ signal. In the illustrated embodiment, the duration from time T2 to T5 (i.e., the time that the output of the read secondary sense amplifier $RSA_0$ is active to drive the data value $D_0$ onto $DATA\_A_1[0]$) is 0.5 ns, corresponding with an output data rate of 2 GHz.

Pre-charge operations, which prepare the read secondary sense amplifier $RSA_0$ to receive the next data value on global I/O line $GIO_0$, are then performed as follows.

Shortly after time T5, the PRE_E signal is activated from a logic low state (0V) to a logic high state (250 mV), thereby turning on n-channel pre-charge transistors 1603 and 1604. Under these conditions, the voltages of the UP_E and DOWN_E signals are pulled down to ground, thereby precharging these signals. The PRE_E signal is de-activated low (0V) to turn off transistors 1603-1604 prior to the next time the sense amplifier latch 1620 is enabled (e.g., at time T7 in FIG. 18).

The above-described signal pattern is repeated for successive accesses within read secondary sense amplifier $RSA_0$. Thus, as illustrated by FIG. 18, the next read access from read secondary sense amplifier $RSA_0$ is initiated at time T6 (with the activation of the SAMPLE_E signal), and continues with the next read data value $D_2$ being read out as the $DATA\_A_1[0]$ signal from time T7 to time T8.

Turning now to 'odd' read secondary sense amplifier $RSA_1$ (FIG. 17) at time T10, the sample signal SAMPLE_O applied to the gates of n-channel transistors 1701 and 1702 is activated from a logic low voltage (0V) to a logic high voltage (250 mV). Under this condition, transistor 1701 turns on, such that the data value previously received on global I/O line $GIO_1$ and stored by capacitor 1750 as the HOLD_O voltage is applied to (and stored by) capacitor 1730 as the input signal IN_O.

Also under these conditions, transistor 1702 turns on, such that the reference voltage VREF is applied to (and is stored by) capacitor 1731 as the reference signal REF_O. As described above, the reference voltage VREF (and therefore the reference signal REF_O) has a voltage of about 110 mV in the described embodiments.

At time T11, the comparator enable signal COMP1_O is activated from a logic low voltage (0V) to a logic high voltage (1.1 to 1.3V) within odd read secondary sense amplifier circuit $RSA_1$. Under these conditions, differential UP_O and DOWN_O voltages are developed on the drains of p-channel transistors 1710 and 1711, respectively, in the same manner the differential UP_E and DOWN_E voltages are developed on the drains of p-channel transistors 1610 and 1611 of the even read secondary sense amplifier $RSA_0$.

At time T5, the comparator enable signal COMP1_O is deactivated from a logic high voltage (1.1 to 1.3V) to a logic low voltage (0V), as illustrated. Also at time T5, the comparator enable signal COMP2_O is activated from a logic low voltage (0V) to a boosted logic high voltage (1.1 to 1.3V), thereby enabling sense amplifier latch 1720. Just prior to time T5, the output control signal OUT_ODD is driven from ground (0V) to the slightly boosted voltage of 350 mV.

Under these conditions, sense amplifier latch 1720 operates in the same manner described above in connection with sense amplifier latch 1620, wherein sense amplifier latch 1720 amplifies the difference between the differential UP_O and DOWN_O voltages, such that the sense amplifier latch 1720 stores a data value $D_1$ representative of the voltage received on global I/O line $GIO_1$.

The UP_O and DOWN_O voltages are applied to the gates of n-channel transistors 1707 and 1708, respectively. When the sense amplifier latch 1720 is enabled, either the UP_O voltage or the DOWN_O voltage will be pulled up to 1.1 to 1.3V, thereby turning on the corresponding n-channel transistor 1707 or 1708, respectively. The OUT_ODD output control signal of read secondary sense amplifier $RSA_1$ is controlled in the same manner described above for the OUT_EVEN output control signal of read secondary sense amplifier $RSA_0$. As a result, the read secondary sense amplifier $RSA_1$ drives the data value $D_1$ received on global I/O line $GIO_1$ onto the DATA_$A_1$[0] signal line starting from time T5.

At time T7, the COMP2_O signal is deactivated from the boosted logic high state (1.1 to 1.3V) to a logic low state (0V) as illustrated, thereby disabling the sense amplifier latch 1720, such that the read secondary sense amplifier $RSA_1$ no longer actively drives the DATA_$A_1$[0] signal. In the illustrated embodiment, the duration from time T5 to T7 (i.e., the time that the output of the read secondary sense amplifier $RSA_1$ is active to drive the data value $D_1$ onto DATA_$A_1$[0]) is 0.5 ns, corresponding with an output data rate of 2 GHz.

Pre-charge operations within read secondary sense amplifier $RSA_1$ are the same as the above-described pre-charge operations within read secondary sense amplifier $RSA_0$. In fact, it is noted that the signals used to operate the 'even' read secondary sense amplifier $RSA_0$ between time T0 and time T8 are identical to the signals used to operate the 'odd' secondary sense amplifier $RSA_1$ between time T3 and time T9.

It is further noted that the above-described operations are successively repeated in FIG. 18, wherein the next read data value $D_2$ received on global I/O line $GIO_0$ is read out onto the DATA_$A_1$[0] signal line during the time period from T7 to time T8, and the next data value $D_3$ received on global I/O line $GIO_1$ is read out onto the DATA_$A_1$[0] signal line during the time period from T8 to time T9

Although FIGS. 16-18 describe the transfer of data from the general I/O lines $GIO_0$ and $GIO_1$ to the corresponding DATA_$A_1$[0] signal line, it is understood that data is transferred from all of the general I/O lines $GIO_0$-$GIO_{71}$ to the corresponding DATA_$A_1$[0:35] signal lines in parallel. In this manner, 36-bit read data is provided on the DATA_$A_1$ [0:35] TSVs at a frequency of 2 GHz. It is further understood that if the DATA_$B_1$ channel is also accessed, data is also transferred from all of the general I/O lines $GIO_{72}$-$GIO_{143}$ to the corresponding DATA_$B_1$[0:35] TSVs in parallel (such that 36-bit read data is also provided on DATA_$B_1$[0:35] signal lines at a frequency of 2 GHz).

Multiplexing the 72-bit data received on the global I/O lines $GIO_0$-$GIO_{71}$ (and/or $GIO_{72}$-$GIO_{143}$) at 1 GHz to 36-bit data on the TSVs associated with data bus DATA_$A_1$[0:71] (and/or DATA_$B_1$[0:71]) at 2 GHz advantageously reduces the number of TSVs required to implement unit stack $US_1$, while maintaining a relatively low data transfer frequency on these TSVs. Moreover, operating data buses DATA_$A_1$ [0:71] and DATA_$B_1$[0:71] at a signal swing of 250 mV advantageously minimizes the power requirements of data transmission on the corresponding TSVs.

Although the read operations have been described in connection with specific control voltages, it is understood that control voltages having other voltage levels can be used in other embodiments, corresponding with the particular characteristics of the unit cell $UC_{1,1}$ (and unit stack $US_1$). For example, although the logic high voltage on the global bit lines are specified as 250 mV, and the reference voltage VREF has been specified as 110 mV in the embodiments described above, it is understood that in other embodiments, these voltages may be scaled upward or downward. For example, in one embodiment (which implements transistors fabricated in accordance with MST process technology), the logic high voltage on the global bit lines may be specified at 110 mV, and the reference voltage VREF may be specified at 45 mV.

Figure 19:
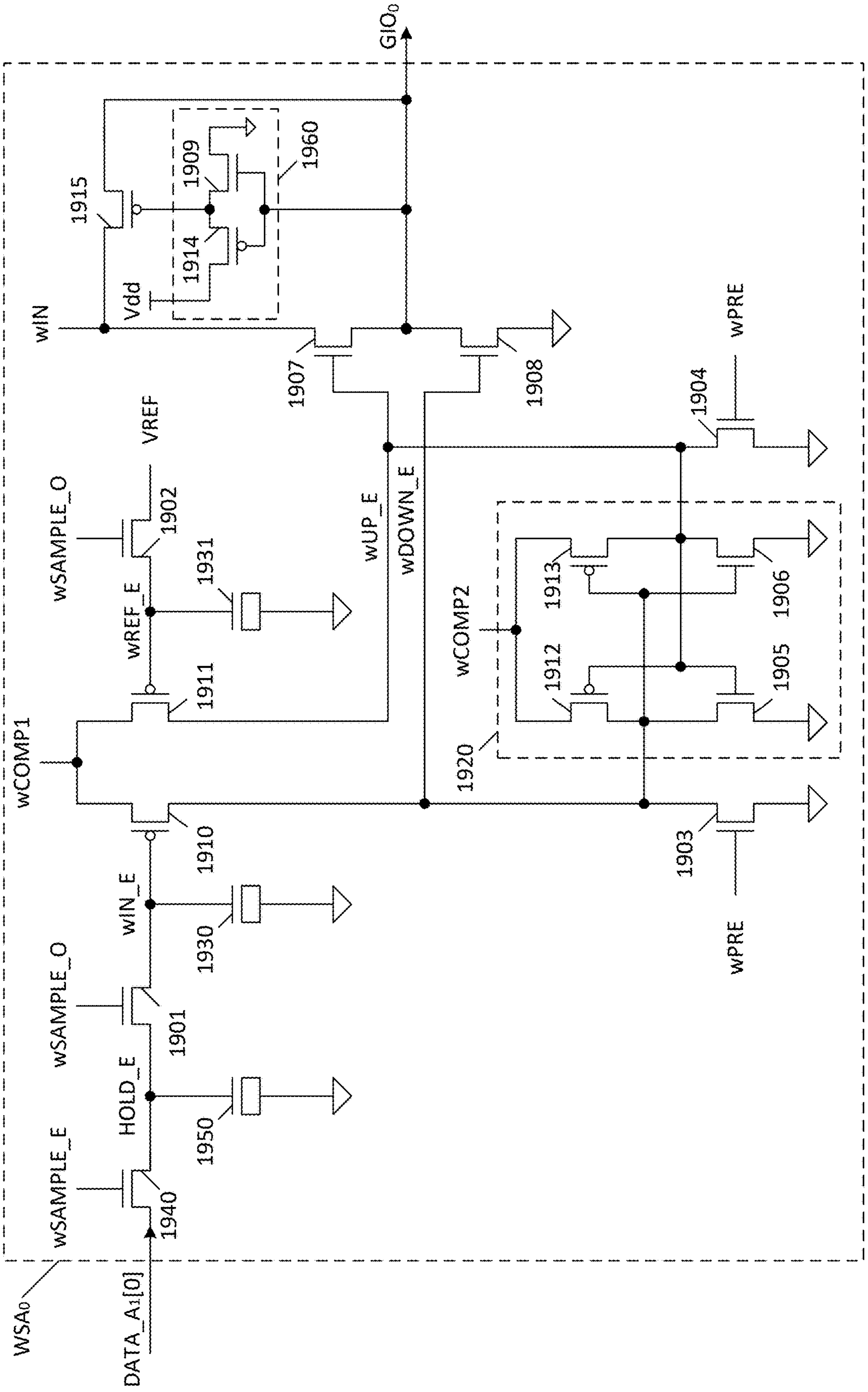
FIG. 19 is a circuit diagram of an even write secondary sense amplifier circuit of the secondary sense amplifier of FIG. 15, which is used to receive and transmit write data values received on an even data line of the first data channel in accordance with one embodiment of the present invention.
Figure 20:
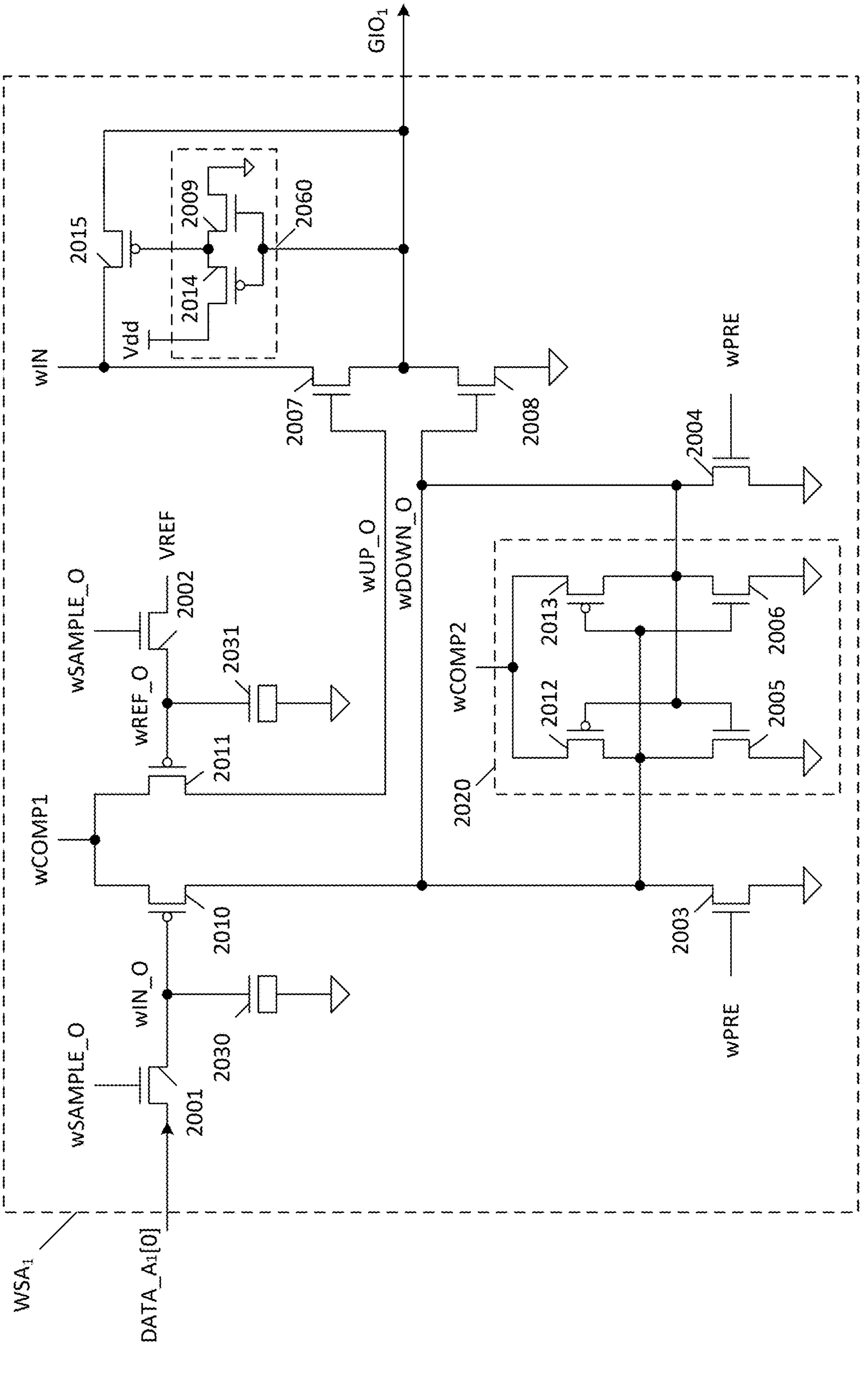
FIG. 20 is a circuit diagram of an odd write secondary sense amplifier circuit of the secondary sense amplifier of FIG. 15, which is used to receive and transmit write data values received on an odd data line of the first data channel in accordance with one embodiment of the present invention.

FIGS. 19 and 20 are circuit diagrams of 'even' write secondary sense amplifier circuit $WSA_0$ and 'odd' write secondary sense amplifier circuit $WSA_1$, respectively, in accordance with one embodiment of the present invention. Because each of these write secondary sense amplifier circuits operate in response to the signal received on a single data line, these write secondary sense amplifiers are 'single-ended sense amplifiers' as described herein.

Write secondary sense amplifier circuit $WSA_0$ includes n-channel transistors 1901-1909 and 1940, p-channel transistors 1910-1915, and capacitors 1930-1931 and 1950, which are connected as illustrated by FIG. 19. N-channel transistors 1905-1906 and p-channel transistors 1912-1913 are connected to form a sense amplifier latch 1920 that includes cross-coupled inverters. P-channel transistors 1910 and 1911 form a pre-amplifier differential pair. N-channel transistor 1940 and capacitor 1950 form an additional input stage for 'even' data values to be provided to general I/O signal line $GIO_0$. N-channel transistor 1909 and P-channel transistor 1914 are very small devices that form an inverter 1960, which along with p-channel transistor 1915, operate as a keeper circuit in a manner described in more detail below.

As illustrated by FIG. 20, 'odd' write secondary sense amplifier circuit $WSA_1$ includes n-channel transistors 2001-2009, p-channel transistors 2010-2015, and capacitors 2030-2031, which are connected in the same manner as n-channel transistors 1901-1909, p-channel transistors 1910-1915, and capacitors 1930-1931 of 'even' write secondary sense amplifier circuit $WSA_0$. Thus, n-channel transistors 2005-2006 and p-channel transistors 2012-2013 are connected to form a sense amplifier latch 2020 that includes cross-coupled inverters. P-channel transistors 2010 and 2011 form a pre-amplifier differential pair. P-channel transistor 2014 and n-channel transistor 2009 form an inverter 2060, which along with p-channel transistor 2015, operate as a keeper circuit in a manner described in more detail below.

Figure 21:
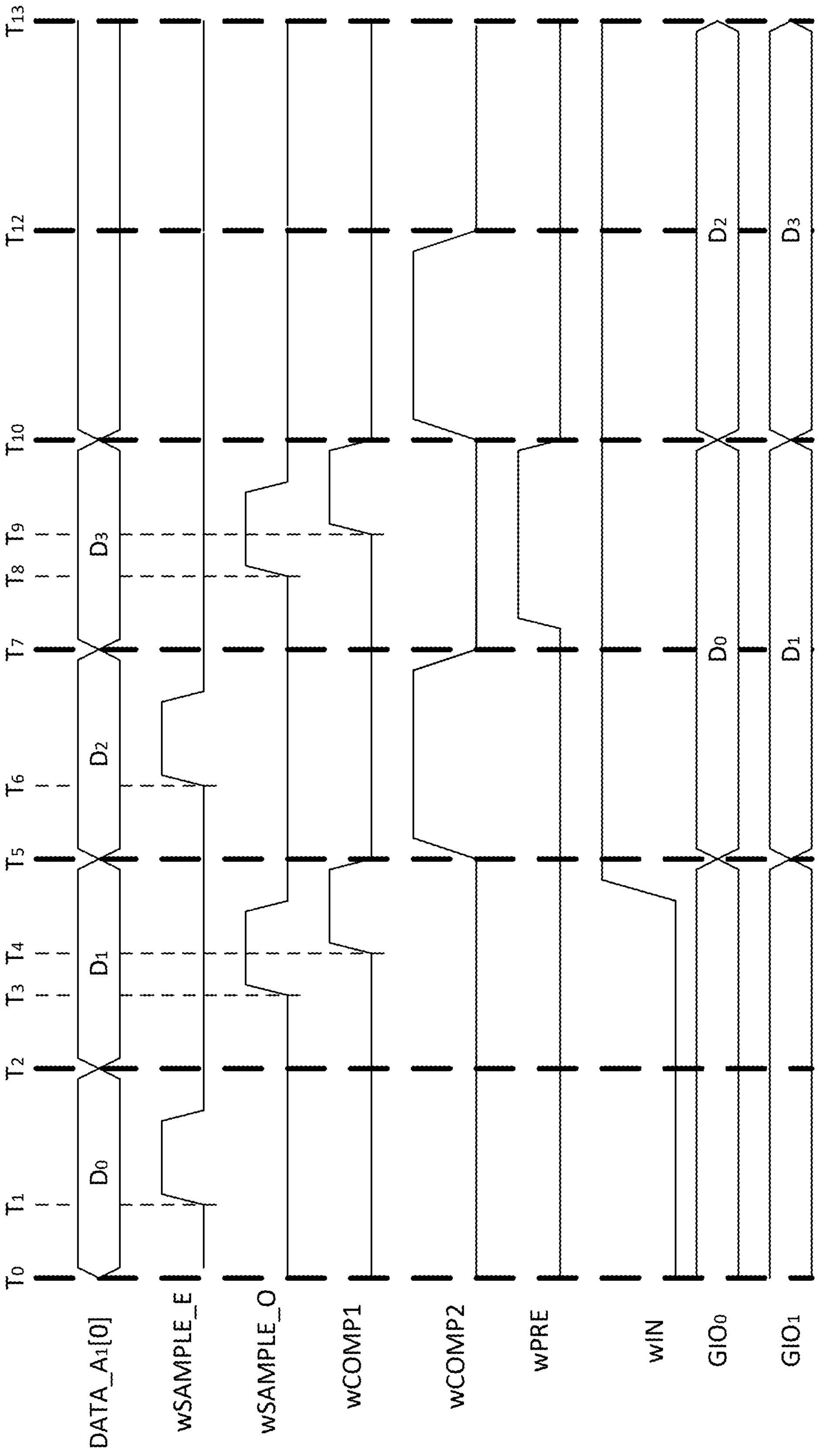
FIG. 21 is a waveform diagram illustrating the operation of the even write secondary sense amplifier circuit of FIG. 19 and the odd write secondary sense amplifier circuit of FIG. 20, in accordance with one embodiment of the present invention.

FIG. 21 is a waveform diagram illustrating the operation of 'even' write secondary sense amplifier circuit $WSA_0$ and 'odd' write secondary sense amplifier circuit $WSA_1$, in accordance with one embodiment of the present invention.

At time T0, even write data value Do is provided by processor block $\mathbf{105}_1$ on the data bus $DATA\_A_1$ as the data signal $DATA\_A_1[0]$.

At time T1, the write sample signal wSAMPLE_E, which is applied to the gate of n-channel transistor 1940 in $WSA_0$, is activated from a logic low voltage (0V) to a logic high voltage (250 mV or higher). Under these conditions, transistor 1940 turns on, such that the write data value $D_0$ on $DATA\_A_1[0]$ is applied to (and is stored by) capacitor 1950, as the input signal HOLD_E. In the embodiments described herein, the data values transmitted on the data bus $DATA\_A_1$ exhibit a logic low voltage of ground (0V) and a logic high voltage of about 250 mV. Capacitor 1950 is large enough to ensure there is no noticeable charge leakage from this device during the time that the sampled data value must be stored as the HOLD_E value (e.g., a few ns).

At time T2, odd write data value $D_1$ is provided by processor block $\mathbf{105}_1$ on the data bus $DATA\_A_1$ as the data signal $DATA\_A_1[0]$.

At time T3, the write sample signal wSAMPLE_O, which is applied to the gates of n-channel transistors 1901-1902 in $WSA_0$ and to the gates of n-channel transistors 2001-2002 in $WSA_1$, is activated from a logic low voltage (0V) to a logic high voltage (250 mV or higher). Under these conditions, transistor 1901 withing $WSA_0$ turns on, thereby transferring the data value $D_0$ stored in capacitor 1950 as the HOLD_E signal is applied to (and stored by) capacitor 1930 as the write input signal wIN_E. Also under these conditions, transistor 2001 within $WSA_1$ turns on, such that the data value $D_1$ on $DATA\_A_1[0]$ is applied to (and is stored by) capacitor 2030, as the write input signal wIN_O.

Also under these conditions, transistors 1902 and 2002 turn on, such that the reference voltage VREF is applied to (and is stored by) capacitors 1931 and 2031 as the reference signals wREF_E and wREF_O, respectively. In the embodiments described herein, the reference VREF (and therefore the reference signals wREF_E and wREF_O) has a voltage a little less than half of the logic high voltage on the $DATA\_A_1$ bus (e.g., a little less than 250 mV/2, or about 110 mV in one embodiment).

Within $WSA_0$, the input signal wIN_E stored by capacitor 1930 is applied to the gate of p-channel transistor 1910 and the input signal wREF_E stored by capacitor 1931 is applied to the gate of p-channel transistor 1911, as illustrated by FIG. 19. Similarly, within $WSA_1$, the input signal wIN_O stored by capacitor 2030 is applied to the gate of p-channel transistor 2010 and the input signal wREF_O stored by capacitor 2031 is applied to the gate of p-channel transistor 2011, as illustrated by FIG. 20.

In the described embodiments, transistors 1910-1911 and 2010-2011 are identical, transistors 1901-1902 and 2001-2002 are identical, and capacitors 1930-1931 and 2030-2031 are identical are identical, thereby balancing the inputs of write secondary sense amplifiers $WSA_0$-$WSA_1$.

At time T4, the write comparator enable signal wCOMP1 is activated from a logic low voltage (0V) to a logic high voltage (e.g., 1.1 to 1.3V) within write secondary sense amplifier circuits $WSA_0$ and $WSA_1$. Under these conditions, differential wDOWN_E and wUP_E voltages are developed on the drains of p-channel transistors 1910 and 1911, respectively, within $WSA_0$, and differential wDOWN_O and wUP_O voltages are developed on the drains of p-channel transistors 2010 and 2011, respectively, within $WSA_1$.

If the voltage of the input signal wIN_E is less than the reference voltage wREF_E (i.e., if wIN_E is=0V), then the voltage of the wDOWN_E signal will be greater than the voltage of the wUP_E signal. Conversely, if the voltage of the input signal wIN_E is greater than the reference voltage wREF_E (i.e., if wIN_E is=250 mV), then the voltage of the wDOWN_E signal will be less than the voltage of the wUP_E signal. The wUP_O and wDOWN_O signals are generated in a similar manner within $WSA_1$ in response to the wIN_O and wREF_O signals.

At time T5, the comparator enable signal wCOMP1 is deactivated from the logic high voltage to a logic low voltage (0V), as illustrated. Also at time T5, the comparator enable signal wCOMP2 is activated from a logic low voltage (0V) to a logic high voltage (e.g., 1.1 to 1.3V), thereby enabling sense amplifier latches 1920 and 2020 within $WSA_0$ and $WSA_1$, respectively.

Under these conditions, sense amplifier latch 1920 amplifies the difference between the differential wUP_E and wDOWN_E voltages, such that the sense amplifier latch 1920 stores a data value representative of the data value $D_0$ received on data bus $DATA\_A_1$. For example, if the wUP_E voltage is less than the wDOWN_E voltage, then latch 1920 will pull the wUP_E voltage down to ground, and will pull the wDOWN_E voltage up to the voltage of the wCOMP2 signal (1.1 to 1.3V). Conversely, if the wUP_E voltage is greater than the wDOWN_E voltage, then latch 1920 will pull the wDOWN_E voltage down to ground, and will pull the wUP_E voltage up to the voltage of the wCOMP2 signal (1.1 to 1.3V). The wUP_O and wDOWN_O signals are generated in a similar manner within $WSA_1$ in response to the wUP_O and wDOWN_O signals.

The wUP_E and wDOWN_E voltages are applied to the gates of n-channel transistors 1907 and 1908, respectively. As described above, when the sense amplifier latch 1920 is enabled, either the wUP_E voltage or the wDOWN_E voltage will be pulled up to 1.1 to 1.3V, thereby turning on the corresponding n-channel transistor 1907 or 1908, respectively. The wUP_O and wDOWN_O signals control the corresponding n-channel transistors 2007 and 2008, respectively, in a similar manner within $WSA_1$.

Just prior to time T5, the write input control signal wIN is driven from ground (0V) to the slightly boosted voltage of 350 mV. Thus, if the wDOWN_E voltage is pulled up to 1.1 to 1.3V, the corresponding n-channel transistor 1908 is turned on, thereby coupling the global I/O line $GIO_0$ to ground. In this manner, the data value $D_0$ ($D_0$=0) is driven onto the global I/O line $GIO_0$ starting at time $T_5$. Note that the ground voltage applied to $GIO_0$ turns on p-channel transistor 1914 within inverter 1960, such that the Vdd supply voltage (1.1 to 1.3 V) is applied to the gate of p-channel transistor 1915, thereby turning off this transistor 1915. As a result, the keeper circuit formed by inverter 1960 and p-channel transistor is turned off when a logic low write data value is driven onto global I/O line $GIO_0$.

Conversely, if the wUP_E voltage is pulled up to 1.1 to 1.3V, the corresponding transistor 1907 is turned on, thereby coupling the global I/O line $GIO_0$ to the wIN voltage of 350 mV. In this manner, the data value $D_0$ ($D_0$=1) is driven onto the global I/O line $GIO_0$ starting at time $T_5$. Note that the logic high voltage (350 mV) applied to $GIO_0$ turns on p-channel transistor 1909 within inverter 1960, such that the ground voltage is applied to the gate of p-channel transistor 1915, thereby turning on this transistor 1915. The turned on p-channel transistor 1915 keeps the voltage on the global I/O line $GIO_0$ at the wIN voltage of 350 mV. In this manner, the keeper circuit formed by inverter 1960 and p-channel transistor is turned on when a logic high write data value is driven onto global I/O line $GIO_0$.

Within $WSA_1$, n-channel transistors 2007-2008, inverter 2060 and p-channel transistor 2015 operate in the above described manner to drive the data value $D_1$ onto global I/O line $GIO_1$, starting at time T5.

At time T7, the wCOMP2 signal is deactivated (to ground), effectively disabling sense amplifier latches 1920 and 2020 within $WSA_0$ and $WSA_1$, respectively. Shortly after time T7, the wPRE signal is activated, thereby pre-charging the sense amplifier latches 1920 and 2020 to ground, ahead of the next write operation. However, the data values $D_0$ and $D_1$ remain on the respective global I/O lines $GIO_0$ and $GIO_1$ until time T10. More specifically, global I/O lines $GIO_0$ and $GIO_1$ that were actively pulled to ground between time T5 and T7 will remain at ground until time T10, because there is no mechanism within $WSA_0$ or $WSA_1$ to pull the global I/O lines $GIO_0$ and $GIO_1$ up from ground (and the capacitances associated with the global I/O lines $GIO_0$ and $GIO_1$ and the global bit lines GBL inhibit any sudden voltage changes on these global I/O lines).

Global I/O lines $GIO_0$ and $GIO_1$ that were actively pulled to the positive wIN voltage (350 mV) between time T5 and T7 will be held at this positive wIN voltage by the corresponding keeper circuit until time T10. For example, if the global I/O line $GIO_0$ is actively pulled up to the wIN voltage (350 mV) between times T5 and T7, then the n-channel transistor 1909 of inverter 1960 and the p-channel transistor 1915 are turned on in the manner described above. When the n-channel transistor 1907 is turned off (in response to the wUP_E signal being pre-charged to ground shortly after time T7), the global I/O line $GIO_0$ continues to be held to the wIN voltage (350 mV) through turned on p-channel transistor 1915. Note that the small transistors (1909 and 1914) used to implement inverter 1960 allows this inverter 1960 to be easily overdriven in response to the next received write data value.

In the illustrated embodiment, the period between time T0 and time T2 (i.e., the period of the data value $D_0$ driven onto DATA_A1[0]) is 0.5 ns, corresponding with an input data rate of 2 GHz on data bus $DATA\_A_1$, and the period between time T5 and time T10 is 1 ns, corresponding with an input data rate of 1 GHz on global input/output lines $GIO_0$ and $GIO_1$.

At time T5, the above described process begins again, wherein the next write data value $D_2$ provided on data bus line $DATA\_A_1[0]$ at time T5 is stored in capacitor 1950 of $WSA_0$ in response to the activated wSAMPLE_E signal at time T6, and wherein the next write data value $D_3$ provided on data bus line $DATA\_A_1[0]$ at time T7 is stored in capacitor 2030 of $WSA_1$ in response to the activated wSAMPLE_O signal at time T8, and wherein the write data values $D_2$ and $D_3$ are driven onto global I/O lines $GIO_0$ and $GIO_1$, respectively, from time T10 to time T13.

Although FIGS. 19-21 describe the transfer of write input data from the $DATA\_A_1[0]$ signal line (TSV) to the corresponding general I/O lines $GIO_0$ and $GIO_1$, it is understood that write input data is transferred from all of the $DATA\_A_1$ [0:35] signal lines to the corresponding general I/O lines $GIO_0$-$GIO_{71}$ in parallel. In this manner, 36-bit write data is provided on the $DATA\_A_1[0:35]$ signal lines at a frequency of 2 GHz and 72-bit write data is provided on general I/O lines $GIO_0$-$GIO_{71}$ at a frequency of 1 GHz. It is further understood that if a write operation is also performed on the $DATA\_B_1$ channel, write input data is also transferred from the $DATA\_B_1[0:35]$ signal lines to the corresponding general I/O lines $GIO_{72}$-$GIO_{143}$ in parallel (such that 36-bit write data is provided on the $DATA\_B_1[0:35]$ signal lines at a frequency of 2 GHz, and 72-bit write input data is provided on general I/O lines $GIO_{72}$-$GIO_{143}$ at a frequency of 1 GHz).

Demultiplexing the 36-bit write data values received on $DATA\_A_1[0:71]$ signal lines (and/or the $DATA\_B_1[0:71]$ signal lines) at 2 GHz onto the 72-bit global I/O lines $GIO_0$-$GIO_{71}$ (and/or $GIO_{72}$-$GIO_{143}$) at 1 GHz advantageously reduces the number of TSVs required to implement unit stack $US_1$, while maintaining a relatively low data transfer frequency on these TSVs.

The above-described control signals used to operate the read secondary sense amplifiers and the write secondary sense amplifiers are generated by secondary sense amplifier driver circuit $SSAD_{1,1}$ (shown in FIG. 6). The secondary sense amplifier driver circuit $SSAD_{1,1}$ generates the control signals required to control the read secondary sense amplifiers (i.e., SAMPLE_E, SAMPLE_O, COMP1_E, COMP1_O, COMP2_E, COMP2_E, PRE_E, PRE_O, OUT_EVEN and OUT_ODD) in response to receiving signals on the instruction bus $INST_1$ that specify a read access to unit cell $UC_{1,1}$ (e.g., RW=0, UC[3:0]=0001, CLK). Similarly, the secondary sense amplifier driver circuit $SSAD_{1,1}$ generates the control signals required to control the write secondary sense amplifiers (i.e., wSAMPLE_E, wSAMPLE_O, wCOMP1, wCOMP2, wPRE and wIN) in response to receiving signals on the instruction bus $INST_1$ that specify a write access to unit cell $UC_{1,1}$ (e.g., RW=1, UC[3:0]=0001, CLK). As described above in connection with FIG. 6, the secondary sense amplifier driver circuit $SSAD_{1,1}$ is centrally located within the secondary sense amplifier circuit $SSA_{1,1}$ in one embodiment. In one embodiment, secondary sense amplifier driver circuit $SSAD_{1,1}$ separately controls the secondary sense amplifier sections $SSA_{(1,1)A}$ and $SSA_{(1,1)B}$, wherein the secondary sense amplifier section $SSA_{(1,1)A}$ is only activated if there is an access to one of the sub-array columns $CoSA_0$-$CoSA_3$, and the secondary sense amplifier section $SSA_{(1,1)B}$ is only activated if there is an access to one of the sub-array columns $CoSA_4$-$CoSA_7$.

Addressing/Data Path

The signals included on the instruction bus $INST_1$ used to access the unit cells $UC_{1,1}$, $UC_{2,1}$, $UC_{3,1}$ and $UC_{4,1}$ of unit stack $US_1$ will now be described in more detail, along with the access patterns that can be implemented within the unit stack $US_1$. It is understood that any combination (including all) of the unit stacks $US_1$-$US_{2048}$ of MTDRAM system 100 may be simultaneously and independently accessed in parallel using the addressing implementation described below, advantageously providing high data bandwidth within MDRAM system 100.

Figure 22:
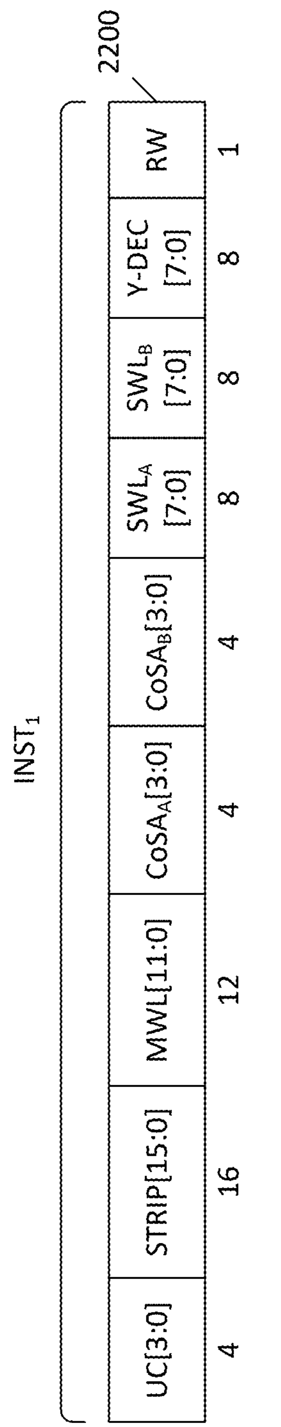
FIG. 22 is a block diagram illustrating the format of an instruction used to access an MTDRAM unit stack in accordance with one embodiment of the present invention.

FIG. 22 is a block diagram representation illustrating the format of an instruction 2200 used to access the unit stack $US_1$ in accordance with one embodiment of the present invention. Unit stack access instruction 2200 is routed to each of the unit cells $UC_{1,1}$, $UC_{2,1}$, $UC_{3,1}$ and $UC_{4,1}$ on dedicated instruction bus $INST_1$, as illustrated by FIG. 4.

Instruction 2200 includes a unit cell address field UC[3:0], a strip address field STRIP[15:0] which is shared by data channels $DATA\_A_1$ and $DATA\_B_1$, a main word line address field MWL[11:0] which is shared by data channels $DATA\_A_1$ and $DATA\_B_1$, a sub-array column address field $CoSA_A[3:0]$ associated with data channel $DATA\_A_1$, a sub-array column address field $CoSA_B[3:0]$ associated with data channel $DATA\_B_1$, a sub-word line address field $SWL_A$

[7:0] associated with data channel $DATA\_A_1$, a sub-word line address field $SWL_B[7:0]$ associated with data channel $DATA\_B_1$, a Y-column address field Y-DEC[7:0] which is shared by data channels $DATA\_A_1$ and $DATA\_B_1$, and a read/write signal field RW which is shared by data channels $DATA\_A_1$ and $DATA\_B_1$.

The unit cell address field UC[3:0] specifies the unit cell (of unit cells $UC_{1,1}$, $UC_{2,1}$, $UC_{3,1}$ and $UC_{4,1}$) to be accessed in response to the instruction. The signals of unit cell address field UC[3:0] are fully pre-decoded, such that the signals UC[3], UC[2], UC[1] and UC[0], when activated, specify accesses to unit cells $UC_{4,1}$, $UC_{3,1}$, $UC_{2,1}$ and $UC_{1,1}$, respectively. The unit cell address UC[3:0] may specify up to one unit cell for an access. For example, an access to unit cell $UC_{1,1}$ is specified by a UC[3:0] value of '0001' and an access to unit cell $UC_{3,1}$ is specified by a UC[3:0] value of '0100'.

The strip address field STRIP[15:0] specifies which one of the sixteen strips of the selected unit cell is accessed. In the described embodiments, the strip address value STRIP [15:0] specifies a single strip. When activated, the pre-decoded strip address bits STRIP[15] to STRIP[0] of instruction 2200 specify strips $S_{(x,1)15}$ to $S_{(x,1)0}$, respectively, within the addressed unit cell $UC_{x,1}$ (wherein x=1 to 4). Thus, an access to strip $S_{(1,1)14}$ of unit cell $UC_{1,1}$ is specified by a unit cell address value UC[3:0] of '0001' and a strip address value STRIP[15:0] of '0100 0000 0000 0000'. Similarly, an access to strip $S_{(2,1)1}$ of unit cell $UC_{2,1}$ is specified by a unit cell address value UC[3:0] of '0010' and a strip address value STRIP[15:0] of '0000 0000 0000 0010'.

The main word line address field MWL[11:0] specifies which one of the 32 main word lines of the specified strip is activated. The signals of the main word line address field MWL[11:0] are partially pre-decoded, wherein the signals MWL[11:0] are used to select one of thirty-two main word lines within the selected strip. In one embodiment, the eight main word line address signals MWL[4:11] are used to select one of eight sets of four main word lines, and the four main word line signals MWL[0:3] are used to select one of the four main word lines in the selected set.

Figure 23:
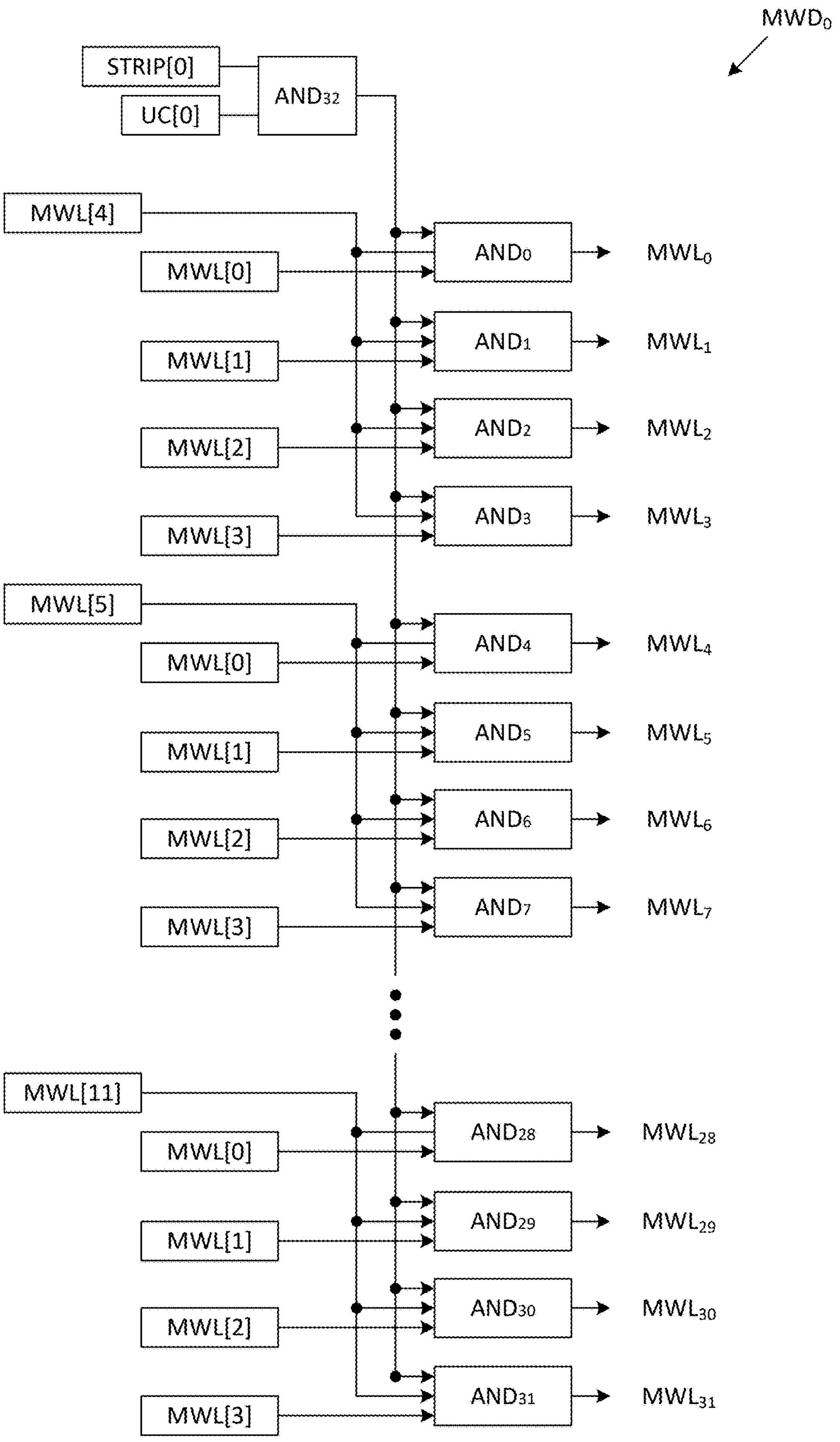
FIG. 23 is a diagram illustrating a main word line decoder circuit associated with an MTDRAM strip of an MTDRAM unit cell in accordance with one embodiment of the present invention.

FIG. 23 illustrates the main word line decoder circuit $MWD_0$ associated with strip $S_{(1,1)0}$ of unit cell $UC_{1,1}$ in accordance with one embodiment. Main word line decoder circuit $MWD_0$ includes 3-input AND gates $AND_0$-$AND_{32}$, which are connected as illustrated. If the received instruction specifies an access to strip $S_{(1,1)0}$ of unit cell $UC_{1,1}$ (i.e., UC[0]=1 and STRIP[0]=1), then AND gate $AND_{32}$ provides a logic high output signal to each of the 32 AND gates $AND_0$-$AND_{31}$ of main word line decoder circuit $MWD_0$. Each of the eight main word line address signals MWL[4:11] is provided to a corresponding set of four AND gates. More specifically, MWL[4] is provided to AND gates $AND_0$-$AND_3$, MWL[5] is provided to AND gates $AND_4$-$AND_7$, . . . and MWL[11] is provided to AND gates $AND_{28}$-$AND_{31}$. Only one of the signals MWL[4:11] is activated during an access.

Each of the four main word line address signals MWL [3:0] is provided to an AND gate in each of the eight sets of AND gates. More specifically, the signals MWL[0]-MWL [3] are provided to AND gates $AND_0$-$AND_3$, respectively, to AND gates $AND_4$-$AND_7$, respectively, . . . and to AND gates $AND_{28}$-$AND_{31}$, respectively. Only one of the signals MWL[3:0] is activated during an access. In this manner, one of the thirty-two main word lines $MWL_0$-$MWL_{31}$ is activated during an access to strip $S_{(1,1)0}$ of unit cell $UC_{1,1}$. Because only two of the main word line address signals MWL[11:0] are activated during an access, power savings are realized within the unit stack $US_1$. Although a particular circuit has been described for decoding the signals required to activate the main word lines $MWL_0$-$MWL_{32}$, it is understood that other decoding circuits are possible, and would be apparent to one of ordinary skill.

It is noted that each of the strips of unit cells $UC_{1,1}$, $UC_{2,1}$, $UC_{3,1}$ and $UC_{4,1}$ includes a corresponding centrally located main word line decoder circuit (having the same circuitry as main word line decoder circuit $MWD_0$), as illustrated by FIG. 6 (wherein each of these main word line decoder circuits operates in response to a corresponding strip address bit and a corresponding unit cell address bit). The timing of the main word line address signals MWL[0:11] is controlled to provide the desired timing of the main word line signal $MWL_0$. This timing is described in more detail in U.S. patent application Ser. No. 18/399,579, which is hereby incorporated by reference in its entirety.

The fully pre-decoded sub-array column address field $CoSA_A[3:0]$ specifies one (or none) of the four sub-array columns $CoSA_0$-$CoSA_3$ associated with data channel $DATA\_A_1$, and the fully pre-decoded sub-array column address field $CoSA_B[3:0]$ specifies one (or none) of the four sub-array columns $CoSA_4$-$CoSA_7$ associated with data channel $DATA\_B_1$. For example, a sub-array column address $CoSA_A[3:0]$ having a value of '0001' indicates that the sub-array column $COSA_0$ is selected for an access on data channel $DATA\_A_1$, and a sub-array column address $CoSA_B[3:0]$ having a value of '0010' indicates that the sub-array column $CoSA_5$ is selected for an access on data channel $DATA\_B_1$.

The sub-array column address signals $CoSA_A[3:0]$ and $CoSA_B[3:0]$ are used in combination with the unit cell signals UC[3:0] and strip address signal STRIP[15:0] to generate the sub-array select signals (e.g., $EN\_SUBA_{0,0}$) used to enable the sub-word line driver circuits and primary sense amplifier sub-circuits in the sub-array(s) to be accessed.

Figure 24:
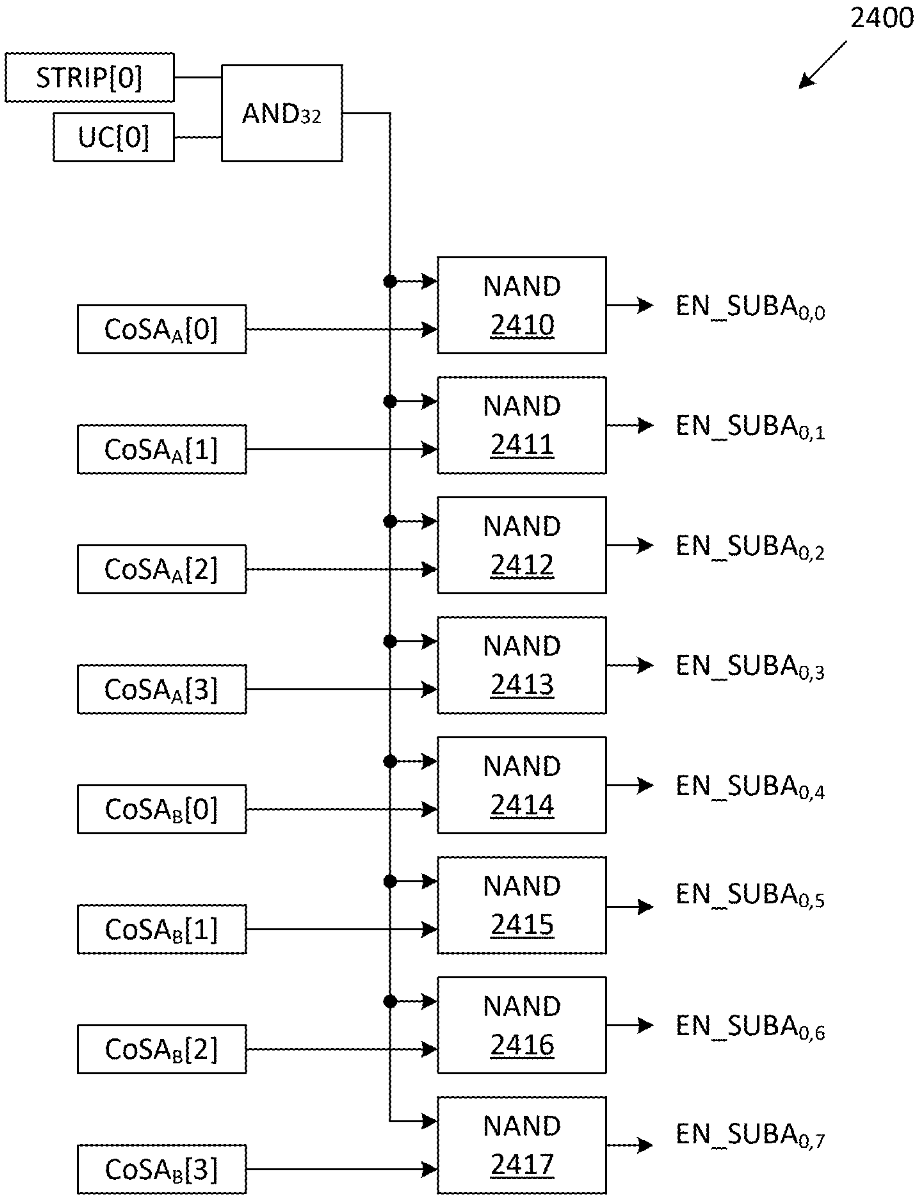
FIG. 24 is a diagram illustrating a sub-array decoder circuit associated with an MTDRAM strip of an MTDRAM unit cell in accordance with one embodiment of the present invention.

FIG. 24 illustrates a sub-array decoder circuit 2400 associated with strip $S_{(1,1)0}$ of unit cell $UC_{1,1}$ in accordance with one embodiment. In the described embodiment, the sub-array decoder circuit 2400 is centrally located within the strip $S_{(1,1)0}$, adjacent to the corresponding main word line decoder circuit $MWD_0$. It is understood that each strip of unit stack $US_1$ has a corresponding sub-array decoder circuit similar to sub-array decoder circuit 2400 (wherein each of these sub-array decoder circuits operates in response to a corresponding strip address bit and a corresponding unit cell address bit).

Sub-array decoder circuit 2400 includes eight NAND gates 2410-2417, as illustrated. Each of these NAND gates 2410-2417 is coupled to the output of AND gate $NAND_{32}$ (FIG. 23). Thus, sub-array decoder circuit 2400 is activated when the corresponding word line decoder circuit $MWD_0$ is activated. NAND gates 2410 to 2413 are also coupled to receive the sub-array column address signals $CoSA_A[0]$ to $CoSA_A[3]$, respectively. NAND gates 2414 to 2417 are also coupled to receive the sub-array column address signals $CoSA_B[0]$ to $CoSA_B[3]$, respectively. The outputs of NAND gates 2410 to 2417 provide the sub-array enable signals $EN\_SUBA_{0,0}$ to $EN\_SUBA_{0,7}$, respectively. As described above in connection with FIG. 7, the sub-array enable signals $EN\_SUBA_{0,0}$ to $EN\_SUBA_{0,7}$, are provided to enable the sub-word line driver circuits in the sub-arrays $SUBA_{0,0}$ to $SUBA_{0,7}$, respectively. In the described embodiments, the sub-array enable signals $EN\_SUBA_{0,0}$ to $EN\_SUBA_{0,7}$ are activated low (i.e., enable a corresponding sub-word line driver circuit when having a logic low voltage) in a manner consistent with that described in U.S. patent application Ser. No. 18/399,579.

At most, only one of the sub-array column address signals $CoSA_A[3:0]$ is activated high, such that only one (or none) of the $EN\_SUBA_{0,0}$, $EN\_SUBA_{0,1}$, $EN\_SUBA_{0,2}$ and $EN\_SUBA_{0,3}$ signals is activated (low) for any given access. Similarly, at most, only one of the sub-array column address signals $CoSA_B[3:0]$ is activated high, such that only one (or none) of the $EN\_SUBA_{0,4}$, $EN\_SUBA_{0,5}$, $EN\_SUBA_{0,6}$ and $EN\_SUBA_{0,7}$ signals is activated (low) for any given access.

For example, sub-array column address signals $CoSA_A[3:0]$ having a value of '0001' activates the $EN\_SUBA_{0,0}$ signal, thereby activating the sub-word line drivers in sub-array $SUBA_{0,0}$ (see, e.g., FIG. 7). Sub-array column address signals $CoSA_B[3:0]$ having a value of '0010' activates the $EN\_SUBA_{0,5}$ signal, thereby activating the sub-word line drivers in sub-array $SUBA_{0,5}$. If the sub-array column address signals $CoSA_A[3:0]$ have a value of '0000', then none of the sub-arrays $SUBA_{0,0}$, $SUBA_{0,1}$, $SUBA_{0,2}$, or $SUBA_{0,3}$, are activated (i.e., no data is read on the corresponding data channel $DATA\_A_1$). Similarly, sub-array column address signals $CoSA_B[3:0]$ having a value of '0000', result in no data being read on the corresponding data channel $DATA\_B_1$. The timing of the sub-array column address signals $CoSA_A[3:0]$ and $CoSA_B[3:0]$ are controlled to provide the desired timing of the sub-array enable signals $EN\_SUBA_{0,0}$ to $EN\_SUBA_{0,7}$. This timing is described in more detail in U.S. patent application Ser. No. 18/399,579, which is hereby incorporated by reference in its entirety.

As described above in connection with FIG. 7, each main word line is coupled to eight corresponding sub-word lines. For example, main word line $MWL_0$ is coupled to eight corresponding sub-word lines $SWL_{0,0}$ to $SWL_{7,0}$ via sub-word line driver circuits $SWD_{0,0}$ to $SWD_{7,0}$. The sub-word line address value $SWL_A[7:0]$ includes eight pre-decoded sub-word line address signals, each associated with one of the eight sub-word lines associated with the activated main word line for data channel $DATA\_A_1$. For example, if the instruction 2200 specifies the main word line $MWL_0$ of strip $S_{(1,1)0}$ of sub-array $SUBA_{0,0}$, then an activated sub-word line address signal $SWL_A[x]$ is used to activate the sub-word line $SWL_{x,0}$ associated with the activated main word line $MWL_0$. In the described embodiments, the sub-word line address signals $SWL_A[7:0]$ and $SWL_B[7:0]$ are 'activated' to a logic low state. More specifically, a sub-word line address value $SWL_A[7:0]$ having a value of '1111 1110' (i.e., $SWL_A[0]$ is activated) is used to activate the sub-word line $SWL_{0,0}$ associated with the activated main word line $MWL_0$.

Each of the sub-word line address values $SWLA_A[7:0]$ is provided to a corresponding sub-word line driver circuit associated with the corresponding sub-word line. For example, in FIG. 7, each sub-word line address value $SWLA_A[x]$ is provided to a corresponding sub-word line driver circuit $SWD_{x,0}$ (wherein x=0 to 7).

When a sub-word line driver circuit receives an activated sub-array enable signal EN_SUBA, an activated main word line signal, and an activated sub-word line address signal, the sub-word line driver circuit drives the corresponding sub-word line to a high state to implement an access to the bit cells coupled to the sub-word line. For example, if the instruction 2200 specifies the main word line $MWL_0$ of strip $S_{(1,1)0}$ of sub-array $SUBA_{0,0}$ within unit cell $UC_{1,1}$, and the sub-word line address value $SWL_A[7:0]$ specifies the sub-word line $SWL_{0,0}$ associated with the activated main word line $MWL_0$, then the $MWL_0$, $EN\_SUBA_{0,0}$ and $SWL_A[0]$ signals will all be activated, thereby enabling sub-word line driver $SWD_{0,0}$ to activate sub-word line $SWL_{0,0}$, thereby accessing bit cells $bc_{0,0}$ to $bc_{0,575}$. In one embodiment, the activated sub-word line address value $SWL_A[0]$ is controlled to transition to a logic high state, and then transition to a boosted logic high state partway through the access to sub-word line $SWL_{0,0}$. This process is described in more detail in U.S. patent application Ser. No. 18/399,579, which is hereby incorporated by reference in its entirety.

As described above in connection with FIGS. 7 and 8, data read from bit cells $bc_{0,0}$-$bc_{0,575}$ is latched into the corresponding primary sense amplifier sub-circuits $PSA_{0,0}$ and $PSA_{1,0}$ in response to the activated $EN\_SUBA_{0,0}$ signal.

Similarly, the sub-word line address value $SWL_B[7:0]$ is a pre-decoded address value that specifies one of the eight sub-word lines associated with the activated main word line within data channel $DATA\_B_1$. In the described embodiment, the sub-word line address value $SWL_B[7:0]$ is independent of the sub-word line address value $SWL_A[7:0]$, enabling different sub-word lines to be accessed in data channels $DATA\_A_1$ and $DATA\_B_1$. This advantageously provides flexibility in addressing the sub-arrays within these two data channels. In an alternate embodiment, a single sub-word line address value SWL[7:0] is used to select the sub-word line in both data channels $DATA\_A_1$ and $DATA\_B_1$. This embodiment advantageously reduces the number of TSVs required to implement unit stack $US_1$ by 8.

Instruction 2200 also includes a pre-decoded Y-address value Y-DEC[7:0] that selects one of eight 72-bit data values stored in the primary sense amplifier sub-circuits in the access, in the manner described above in connection with FIGS. 8-10.

Instruction 2200 also includes a read/write control bit (RW), which indicates whether the corresponding access is a read operation or a write operation.

Thus, the pre-decoded instruction 2200 requires 65 TSVs in the corresponding TSV region of the unit cell. When added to the 72 TSVs required to implement the two 36-bit data buses $DATA\_A_1$ and $DATA\_B_1$, and the TSV required to provide the clock signal CLK, the entire unit stack $US_1$ requires a total of 138 TSVs. In the alternate embodiment where both data channels $DATA\_A_1$ and $DATA\_B_1$ share a single sub-word line address, the unit stack $US_1$ only requires a total of 130 TSVs.

The dimensions of unit cell $UC_{1,1}$, along with the manner in which the TSVs of the unit cell $UC_{1,1}$ are laid out will now be described.

Unit Cell Height

In accordance with the embodiments described above, each MTDRAM bit cell of unit cell $UC_{1,1}$ (e.g., bit cell $bc_{0,0}$ of FIG. 7) has a vertical height along the Y-axis of 0.0243 microns (um). In the embodiment of FIG. 8, unit cell $UC_{1,1}$ includes 576 columns of bit cells per sub-array, and 8 sub-arrays per strip. In this embodiment, the height along the Y-axis required for the bit cells is about 112 microns (0.0243 um×576 bit cells/sub-array×8 sub-arrays/strip).

In the embodiment of FIG. 8, each strip of unit cell $UC_{1,1}$ includes 8 sub-word line driver circuits and one main word line driver circuit along the Y-axis. Assuming each sub-word line driver circuit has a height along the Y-axis of about 1.86 um, and the main word line driver circuit has a height along the Y-axis of about 7 um, then the height along the Y-axis required for the sub-word line driver circuits and the main word line driver circuit is about 22 um (1.855 um×8+7 um).

Thus, the total height of the unit cell $UC_{1,1}$ along the Y-axis is about 134 um (112+22). Assuming a TSV pitch of 2 um, a row of TSVs extending the height of the unit cell $UC_{1,1}$ may include up to about 67 TSVs.

Figure 25:
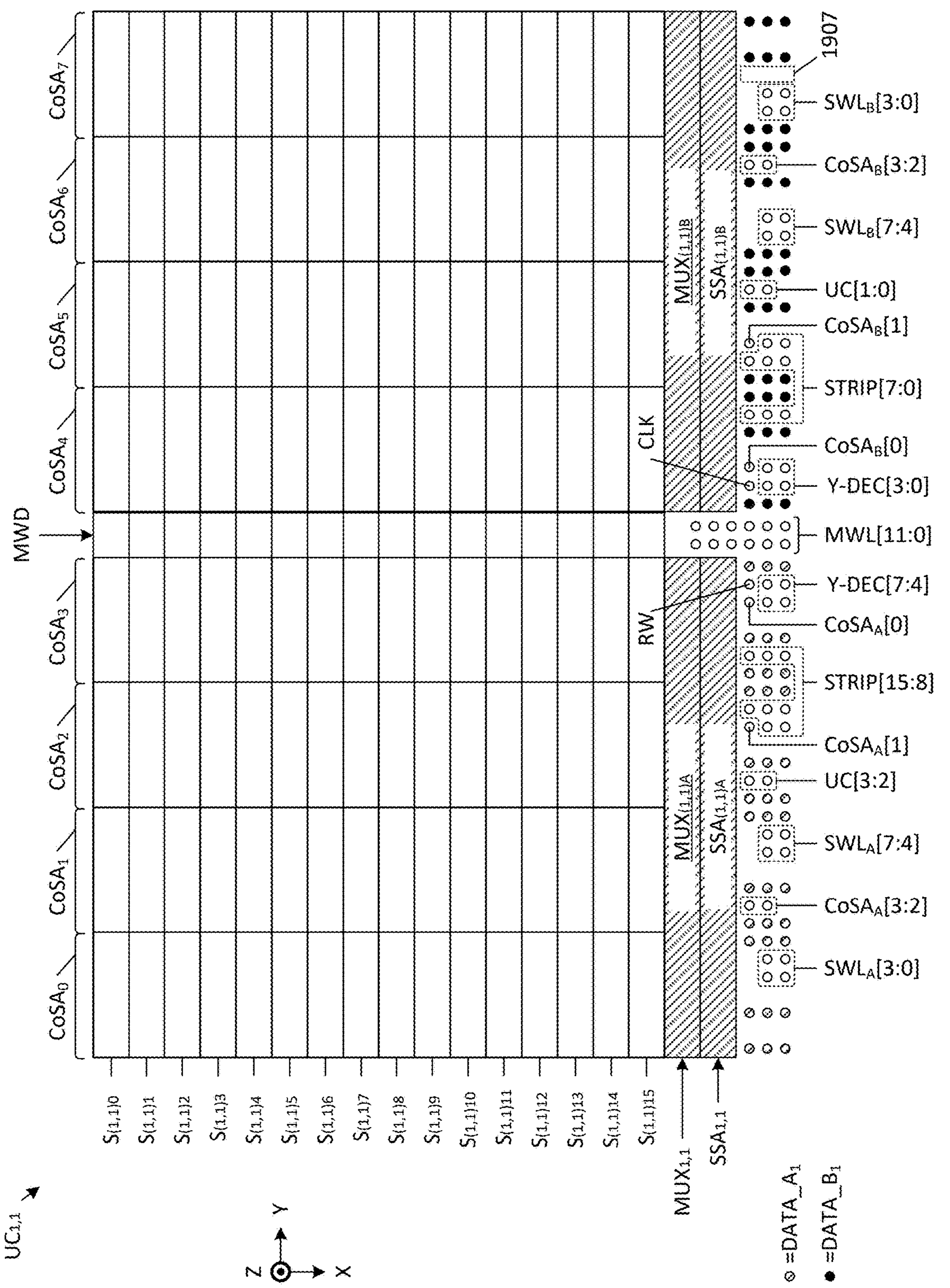
FIG. 25 is a diagram illustrating the layout of the TSVs required to service an MTDRAM unit stack having four MTDRAM unit cells in accordance with one embodiment of the present invention.

FIG. 25 is a block diagram illustrating the layout of the 137 TSVs required to service unit cell $UC_{1,1}$ in the manner described above. It is noted that unit cells $UC_{2,1}$, $UC_{3,1}$ and $UC_{4,1}$ have the same TSV pattern as unit cell $UC_{1,1}$ to facilitate the required connections of the corresponding unit stack $US_1$. The TSV pattern of FIG. 25 utilizes three rows of TSVs located adjacent to the secondary sense amplifier $SSA_{1,1}$. Each row of TSVs include 44 or fewer TSVs, easily allowing this TSV pattern to be located within the 134 um height of unit cell $UC_{1,1}$.

In the embodiment of FIG. 25, the twelve TSVs carrying the main word line address MWL[11:0] are centrally located (under the main word line driver circuits MWD). Six of these twelve TSVs are located in open space between the secondary sense amplifier circuits $SSA_{(1,1)A}$ and $SSA_{(1,1)B}$ and/or in open space between multiplexer circuits $MUX_{(1,1)A}$ and $MUX_{(1,1)B}$, as illustrated. The remaining six TSVs are located in the three rows of TSV located below the secondary sense amplifier $SSA_{1,1}$, as illustrated.

The 36 TSVs required to implement the $DATA\_A_1[35:0]$ bus are shown as shaded circles in FIG. 25. Note that these TSVs are evenly distributed along the width of the secondary sense amplifier circuit $SSA_{(1,1)A}$, wherein 9 bits of the $DATA\_A_1[35:0]$ bus are located along each of the four sub-array columns $CoSA_0$-$CoSA_3$, thereby minimizing signal delay and power.

The 36 TSVs required to implement the $DATA\_B_1[35:0]$ bus are shown as black-filled circles in FIG. 25. Note that these TSVs are evenly distributed along the width of the secondary sense amplifier circuit $SSA_{(1,1)B}$, wherein 9 bits of the $DATA\_B_1[35:0]$ bus are located along each of the four sub-array columns $CoSA_4$-$CoSA_7$.

The TSVs required to implement the UC[3:0] address values, the STRIP[15:0] address values, the $CoSA_A[3:0]$ and $CoSA_B[3:0]$ address values, the $SWL_A[7:0]$ and $SWL_B[7:0]$ address values, the Y-DEC[7:0] address values, the RW value and the CLK signal are distributed as illustrated by FIG. 25.

In accordance with one embodiment, the TSV pattern is selected such that most of the TSVs are centrally located within the unit cell $UC_{1,1}$ (along the Y-axis). That is, the TSV pattern is sparsely populated at the outer edges along the Y-axis (i.e., under sub-array columns $CoSA_0$-$CoSA_1$ and $CoSA_6$-$CoSA_7$). As described in more detail below, these sparsely populated TSV regions advantageously provide room for routing structures (which extend along the X-axis) on the underlying processor block $\mathbf{105}_1$.

Having determined the configuration of the TSVs of unit cell $UC_{1,1}$, the width of the unit cell $UC_{1,1}$ along the X-axis can be determined.

Unit Cell Width

In accordance with the embodiments described above, each MTDRAM bit cell of unit cell $UC_{1,1}$ (e.g., bit cell $bc_{0,0}$ of FIG. 7) has a width along the X-axis of 0.0383 um. In the embodiment of FIG. 8, unit cell $UC_{1,1}$ includes 256 rows of bit cells per strip, and 16 total strips. In this embodiment, the width along the X-axis required for the bit cells is about 156.88 microns (0.0383 um×256 bit cells/strip×16 strips/unit cell).

In the embodiment of FIG. 6, unit cell $UC_{1,1}$ includes 17 primary sense amplifier circuits $PSA_0$-$PSA_{16}$. Assuming each primary sense amplifier circuit has a width along the X-axis of about 2.65 um, then the width along the X-axis required for the primary sense amplifier circuits is about 45.05 um (2.65 um×17).

In the embodiment of FIG. 6, unit cell $UC_{1,1}$ also includes multiplexer $MUX_{1,1}$ and secondary sense amplifier circuit $SSA_{0,0}$. In one embodiment, the width of multiplexer $MUX_{1,1}$ and secondary sense amplifier circuit $SSA_{0,0}$ along the X-axis is about 10 um (based on the circuitry of FIGS. 14-20).

In accordance with the embodiment of FIG. 25, unit cell $UC_{1,1}$ requires three rows of TSVs, with a pitch of 2 um. Thus, the required width of the TSV set $TSV_{1,1}$ along the X-axis is about 6 um.

The total required width of unit cell $UC_{1,1}$ along the X-axis is therefore about 222 um (156.88 um+45.05 um+10 um+4 um+6 um) in the described embodiment.

Because the MTDRAM chip 101 includes 64 rows and 32 columns of unit cells $UC_{1,1}$-$UC_{1,2048}$ (FIG. 2), the total required width of chip 101 is about 7.1 mm (32×222 um) along the X-axis, and the total required height of chip 101 is about 8.6 mm (64×134 um) along the Y-axis. Thus, MTDRAM chip 101 has an advantageous size in view of conventional fabrication practices. This is due to the significant amount of signal pre-decoding being performed by the ASIC controller chip 105 for accesses to all four MTDRAM chips 101-104. Furthermore, obsolete functionality, such as self-refresh and other area-consuming features typically included in prior art DRAMs, is either removed completely or is implemented on the ASIC controller chip 105.

In alternate embodiments of the present invention, the number of sub-arrays per strip and the number of strips per unit cell can be modified to make the unit cell size larger or smaller, as desired. In a 'tiny cell' embodiment, the number of sub-arrays per strip is reduced from eight to four, and the number of strips per unit cell is reduced from sixteen to eight. This 'tiny cell' configuration increases the number of unit cells per chip from 2048 to 8192, thereby greatly increasing the addressable locations within the MTDRAM system.

The random access cycle time to the same strip is 4 ns, and the random access cycle time to 'legal' strips (i.e., strips that are not subject to pre-charging conditions as described above) is 1 ns. The nearly random access rate of MTDRAM system 100 (for 72-bit data) is therefore 1 GHz/channel×2 channels/unit stack×2048 unit stacks=4.096E+12. This nearly random access rate is about 12,800 times greater than the semi-random address rate of 3.2E+08 achieved by conventional HBM3 memory.

A MTDRAM system that implements the 'tiny cell' embodiment will exhibit a nearly random access rate of 1 GHz/channel×2 channels/unit stack×8192 unit stacks=1.6384E+13, which is about 51,200 times greater than the semi-random address rate of 3.2E+08 achieved by conventional HBM3 memory.

As described above, the data rate on the TSVs that implement the $DATA\_A_1$ and $DATA\_B_1$ channels is 2 Gb/sec/pin. This data rate is advantageously lower than the data rate of 5.2 Gb/sec/pin associated with a conventional HBM3 memory, advantageously resulting in significant power savings.

As described above, MTDRAM system 100 includes 72 TSVs to carry data signals per unit stack. Because MTDRAM system 100 includes 2048 unit stacks, a total of 147,456 TSVs are available to carry data in MTDRAM system 100. Because data is transmitted on each of these TSVs at a rate of 2 Gb/sec, the total data rate of MTDRAM system is 147,456×2 Gb/sec=294,912 Gb/sec. This total data rate is about 55 times greater than the total data rate of a conventional HBM3 memory system, which exhibits a total data rate of about 5,325 Gb/sec. This total data rate is also about 16 times greater than the total data rate of a conventional HBM3E memory system, which exhibits a total data rate of about 18,842 Gb/sec.

A MTDRAM system that implements the ‘tiny cell’ embodiment will include 8,192 unit stacks, with a total of 589,824 TSVs available to carry data. With data transmitted on each of these TSVs at a rate of 2 Gb/sec, the total data rate of a MTDRAM system the implements the ‘tiny cell’ embodiment is 589,824×2 Gb/sec=1,179,648 Gb/sec.

In accordance with other embodiments of the present invention, the single-ended sense amplifiers included in the primary sense amplifier circuits can have configurations other than those described above in connection with FIGS. 8, 11A and 11B.

Figure 26:
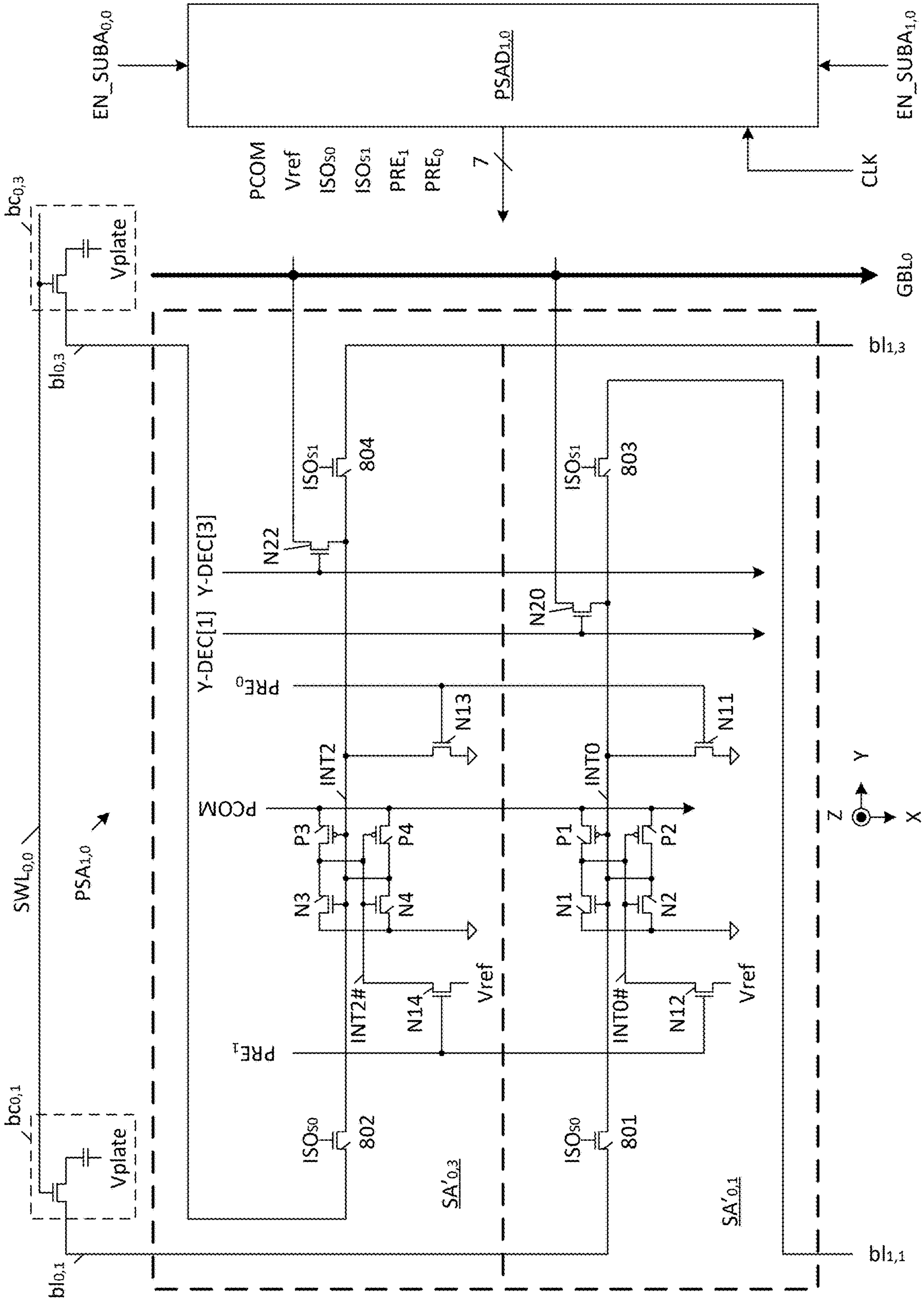
FIG. 26 is a circuit diagram of single-ended sense amplifiers of a primary sense amplifier circuit, in accordance with an alternate embodiment of the present invention.

FIG. 26 is a circuit diagram of single-ended sense amplifiers $SA'_{0,1}$ and $SA'_{0,3}$ of primary sense amplifier circuit $PSA_{1,0}$ in accordance with an alternate embodiment of the present invention. Single ended sense amplifiers $SA'_{0,1}$ and $SA'_{0,3}$ are similar to single ended sense amplifiers $SA_{0,1}$ and $SA_{0,3}$ (FIG. 8), with differences noted below. Single ended sense amplifiers $SA'_{0,1}$ and $SA'_{0,3}$ do not include the kick capacitors 821-824 of single ended sense amplifiers $SA_{0,1}$ and $SA_{0,3}$. In addition, single ended sense amplifiers $SA'_{0,1}$ and $SA'_{0,3}$ do not require the NCOM control signal (which is coupled to n-channel transistors N1-N4 of single ended sense amplifiers $SA_{0,1}$ and $SA_{0,3}$). Rather, the sources of n-channel transistors N1-N4 are simply connected to ground (0V) in single ended sense amplifiers $SA'_{0,1}$ and $SA'_{0,3}$. Advantageously, the primary sense amplifier driver circuit $PSAD_{1,0}$ of FIG. 26 does not need to generate the kick voltage signal Vk or the NCOM signal in the manner described above in connection with FIGS. 11A-11B.

The sources of n-channel pre-charge transistors N12 and N14 are coupled to receive a reference voltage signal Vref in accordance with the present embodiment of the invention. As described in more detail below, the n-channel pre-charge transistors N12 and N14 are controlled to apply the reference voltage signal Vref to the internal nodes INT0# and INT2#, respectively. Note that the primary sense amplifier driver circuit $PSAD_{1,0}$ of FIG. 26 generates the reference voltage signal Vref in the present embodiment.

Before describing the operation of single-ended sense amplifiers $SA'_{0,1}$ and $SA'_{0,3}$, the operating characteristics of a conventional dual-ended sense amplifier will be described for comparison purposes. A conventional dual-ended sense amplifier is coupled to a bit line of a bit cell being read, and also to a dummy bit line. This bit line and dummy bit line are pre-charged to an intermediate voltage that is half the logic ‘1’ voltage written to the bit cell. For example, if the logic ‘1’ voltage written to the bit cell is 1.1 Volts, then the bit line pre-charge voltage is 550 mV. The DRAM bit cell loses charge over time, and therefore must be periodically refreshed. In one example, the refresh interval of the DRAM bit cell is 32 msec, wherein the ‘1’ bit cell voltage stored by the bit cell drops by about 14% at the end of the 32 msec refresh interval. In the example described herein, the DRAM bit cell is refreshed by the time the logic ‘1’ bit cell voltage reaches 0.95 V.

The change in the bit line voltage (ΔV) during a read operation is defined by the following equation:

$$\Delta V=(V\text{bitcell}-V_{BLP})/(1+C_B/C_S),$$

wherein Vbitcell is the bit cell voltage stored by the DRAM bit cell at the time of the read operation (e.g., 1.1 to 0.95V), $V_{BLP}$ is the pre-charge voltage of the bit line (e.g., 0.55V), $C_B$ is the capacitance of the bit line, and $C_S$ is the capacitance of the DRAM bit cell. Common values for $C_B/C_S$ are 4, 6 and 8. Thus, in a conventional dual-ended sense amplifier, ΔV is about 80 mV, 57 mV and 44 mV (at the end of the 32 msec refresh interval) for $C_B/C_S$ values of 4, 6 and 8, respectively. Note that a bit line being read in one direction (e.g., being pulled up in response to a logic ‘1’ bit cell) may be located adjacent to other bit lines being read in the opposite direction (e.g., being pulled down in response to a logic ‘0’ bit cell). In this case, the voltage on a bit line being read in one direction can be pulled in the other direction due to bit line coupling. Common bit line coupling estimates include 15%, 25% and 35%. In the example given above for a conventional dual-ended sense amplifier, the above-described ΔV values of 80/57/44 mV would be adjusted down to 60/43/33 mV (for $C_B/C_S$ values of 4/6/8, respectively) for an adverse bit line coupling of 25%.

In accordance with one embodiment, the value of the reference voltage Vref implemented within the single-ended sense amplifiers $SA'_{0,1}$ and $SA'_{0,3}$ of FIG. 26 is selected to provide an equivalent ΔV with respect to the above-described dual-ended sense amplifier. In accordance with the present embodiment, the logic ‘0’ bit cell value is 0 Volts (e.g., bit line $bl_{0,1}$ is pulled down to 0 Volts to write a logic ‘0’ value to the corresponding bit cell $bc_{0,1}$). Thus, when reading a logic ‘0’ value from bit cell $bc_{0,1}$ (or $bc_{0,3}$), the voltage on the corresponding bit line $bl_{0,1}$ (or $bl_{0,3}$) will be equal to 0 Volts (without considering adverse bit line coupling). In order to obtain a ΔV value of 60/43/33 mV (to match the performance of the above-described dual-ended sense amplifier), the nominal value of Vref should be 60/43/33 mV (for DRAM systems with $C_B/C_S$=4/6/8, respectively). In this case, the nominal value of a logic ‘1’ value read on the bit line $bl_{0,1}$ (or $bl_{0,3}$) should be equal to 120/86/66 mV (i.e., 60/43/33 mV+60/43/33 mV=120/86/66 mV). To achieve read bit line voltages of 120/86/66 mV based on $C_B/C_S$ values of 4/6/8, the corresponding bit cell voltages must be at least 600/602/594 mV (i.e., 120/86/66 mV×(1+4)/(1+6)/(1+8)=600/602/594 mV). In order to ensure a minimum bit cell voltage of at least 600/602/594 mV at the end of a refresh interval, the DRAM bit cell should initially be written to a bit cell voltage that is about 14% greater, or 698/700/691 mV. In this instance, the maximum read bit line voltage (assuming the read operation occurs immediately after a refresh operation) is about 140/100/77 mV (i.e., 698/700/691 mV divided by (1+4)/(1+6)/(1+8)=140/100/77 mV).

Assuming that a bit line reading a logic ‘0’ value experiences 25% adverse bit line coupling from adjacent bit lines reading logic ‘1’ values, the bit line reading a logic ‘0’ value may be pulled up from 0 Volts to 35/25/19 mV (i.e., 140/100/77 mV×25%=35/25/19 mV). To compensate for this bit line coupling, the value of Vref can be adjusted upward to 95/68/52 mV (i.e., because the voltage level of a logic ‘0’ bit line can be pulled up from 0 Volts to 35/25/19 mV by adverse bit line coupling, the nominal value of Vref is adjusted upward from 60/43/33 mV by adding 35/25/19 mV to provide 95/68/52 mV). In this case, the nominal value of a logic ‘1’ value read on the bit line $bl_{0,1}$ (or $bl_{0,3}$) should be adjusted up to at least 155/111/85 mV (i.e., 95/68/52 mV+60/43/33 mV=155/111/85 mV) to maintain the specified ΔV values of 60/43/33 mV. To achieve read bit line voltages of 155/111/85 mV based on $C_B/C_S$ values of 4/6/8, the corresponding bit cell voltages must be at least 775/777/

765 mV (i.e., 155/111/85 mV×(1+4)/(1+6)/(1+8)=775/777/765 mV). In order to ensure a minimum bit cell voltage of at least 775/777/765 mV at the end of a refresh interval, the DRAM bit cell should initially be written to a bit cell voltage that is about 14% greater, or 901/904/890 mV. In this instance, the maximum read bit line voltage (assuming the read operation occurs immediately after a refresh operation) is about 180/129/99 mV for $C_B/C_S$ values of 4/6/8, respectively (i.e., 901/904/890 mV divided by (1+4)/(1+6)/(1+8)=180/129/99 mV).

Assuming 25% adverse bit line coupling from adjacent bit lines reading logic '1' values, a bit line reading a logic '0' value may be pulled up from 0 Volts to 45/32/25 mV (i.e., 180/129/99 mV×25%=45/32/25 mV). Again, to compensate for this bit line coupling, the value of Vref can be adjusted upward to 105/75/58 mV (i.e., because the voltage level of a logic '0' bit line can be pulled up from 0 Volts to 45/32/25 mV by adverse bit line coupling, the value of Vref is adjusted to 60/43/33 mV+45/32/25 mV=105/75/58 mV).

As described above, adjusting the value of Vref may necessitate adjusting the nominal voltage of a logic '1' value read on a bit line, the logic '1' bit cell voltage, and the bit cell coupling voltage (which in turn, necessitates adjusting the value of Vref). Over a plurality of iterations, these adjustments converge to a final set of values, wherein the final iteration is selected in view of the required accuracy of the particular application. In the present example, four iterations results in a bit line coupling voltage of 49/35/27 mV, a reference voltage Vref of 109/78/60 mV, a nominal logic '1' read bit line voltage of 169/121/93 mV and a full DRAM bit cell voltage of 983/985/973 mV (for $C_B/C_S$ of 4/6/8, respectively). Having determined these voltages (to establish a ΔV equivalency with a conventional dual-ended sense amplifier), the operation of single-ended sense amplifiers $SA'_{0,1}$ and $SA'_{0,3}$ will now be described.

In the examples provided below, read accesses are performed to bit cells $bc_{0,1}$ and $bc_{0,3}$ coupled to bit lines $bl_{0,1}$ and $bl_{0,3}$, respectively, wherein the bit cell $bc_{0,1}$ stores a logic '1' bit cell voltage, and the bit cell $bc_{0,3}$ stores a logic '0' bit cell voltage. Bit cells $bc_{0,1}$ and $bc_{0,3}$ are coupled to receive a common sub-word line signal $SWL_{0,0}$, as illustrated.

Figure 27:
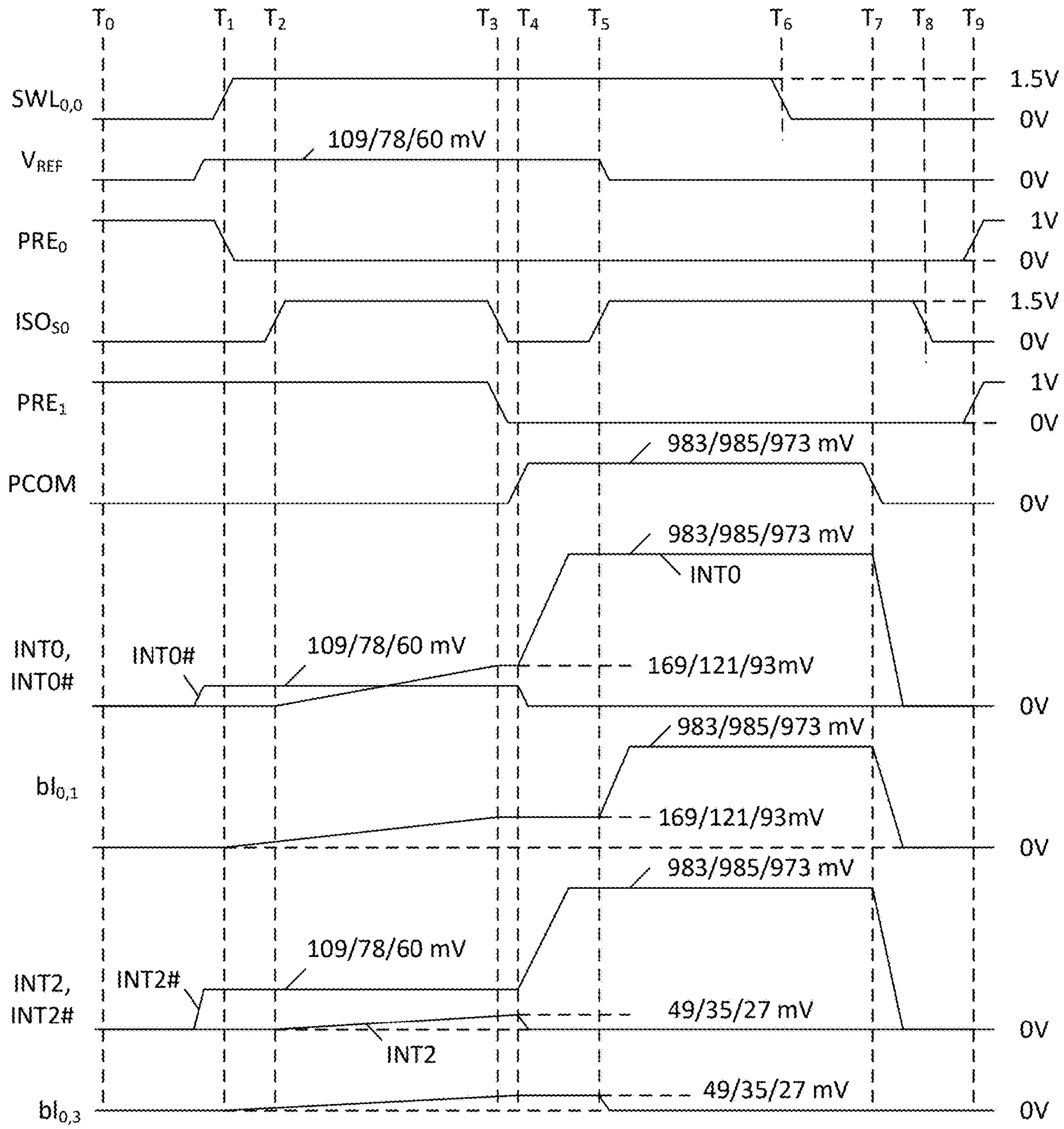
FIG. 27 is a waveform diagram illustrating signals associated with read accesses to bit cells coupled to the single-ended sense amplifiers of FIG. 26 in accordance with one embodiment of the present invention.

FIG. 27 is a waveform diagram illustrating signals associated with a read access to bit cells $bc_{0,1}$ and $bc_{0,3}$.

At time T0, the sub-word line $SWL_{0,0}$ is at a logic low state (0V) and the reference voltage signal Vref is at ground (0V). The pre-charge control voltages $PRE_0$ and $PRE_1$ are activated high (1V), thereby turning on the pre-charge transistors N11-N14. Under these conditions, the internal nodes INT0/INT0# and INT2/INT2# are all pulled down to ground. The $ISO_{S0}$ and $ISO_{S1}$ signals are deactivated low (0V), thereby isolating the single-ended sense amplifiers $SA_{0,1}$ and $SA_{0,3}$ from the bit lines $bl_{0,1}$ and $bl_{0,3}$ (and the bit lines $bl_{1,1}$ and $bl_{1,3}$). The PCOM signal is held at logic low state (0V) and the bit lines $bl_{0,1}$ and $bl_{0,3}$ are pre-charged to ground (0V).

The read operation starts at time T1. Just prior to time T1, the reference voltage signal Vref is driven to a predetermined positive voltage, thereby pre-charging the voltages on internal nodes INT0# and INT2# to the predetermined reference voltage Vref of 109/78/60 mV (for $C_B/C_S$ of 4/6/8, respectively). As described in more detail below, the read voltages developed on the bit lines $bl_{0,1}$ and $bl_{0,3}$ are compared with the reference voltage Vref within the sense amplifier circuits $SA'_{0,1}$ and $SA'_{0,3}$, respectively.

Because there is no/negligible current flow on bit lines reading a logic '0' value (because the bit lines are pre-charged to 0V, and remain near 0V during a read operation), there is no significant adverse bit line coupling associated with bit lines reading a logic '1' value. Thus, when reading a logic '1' value from bit cell $bc_{0,1}$ (or $bc_{0,3}$), in order to obtain a ΔV value of 60/43/33 mV (to match the performance of the above-described dual-ended sense amplifier), the voltage developed on the read bit line should therefore be at least as great as the sum of the Vref reference voltage of 109/78/60 mV plus the ΔV value of 60/43/33 mV, or 169/121/93 mV. A logic '1' bit read line voltage of 169/121/93 mV translates to a bit cell voltage of 845/847/837 mV for $C_B/C_S$=4/6/8 (i.e., 169/121/93 mV×(1+Cb/Cs)=845/847/837 mV). In order to ensure a minimum bit cell voltage of 845/847/837 mV at the end of a refresh interval, the bit cell should initially be written to a full bit cell voltage that is about 14% greater, or 983/985/973 mV (for $C_B/C_S$=4/6/8).

Returning to FIG. 27, at time T1, the sub-word line $SWL_{0,0}$ is activated high (1.5V). Under these conditions, read voltages are developed on the bit lines $bl_{0,1}$ and $bl_{0,3}$, wherein these read voltages are dependent upon the data values stored by the corresponding bit cells coupled to these bit lines. In the illustrated embodiment, bit line $bl_{0,1}$ begins to be pulled up from the bit line pre-charge voltage of 0V towards the logic '1' read bit line voltage level (e.g., 169/121/93 mV or more, as described above). Although bit line $bl_{0,3}$ should be held at a logic '0' value equal to 0 Volts, in a worst case situation, bit line $bl_{0,3}$ is surrounded by a plurality of adjacent bit lines all being pulled up to a logic "1" read voltage level. In this case, bit line $bl_{0,3}$ begins to be slightly pulled up from the bit line pre-charge voltage of 0V, due to adverse bit line coupling with the logic '1' read voltages being developed on adjacent bit line $bl_{0,1}$ and other adjacent bit lines. As described above, this adverse bit line coupling may pull up the voltage on bit line $bl_{0,s}$ to a voltage as high as about 49/35/27 mV (for $C_B/C_S$=4/6/8).

Also at time T1, the pre-charge control signal $PRE_0$ is deactivated low (0V), thereby turning off n-channel transistors N11 and N13, such that the internal nodes INT0 and INT2 are no longer actively pulled down to ground.

At time T2 (shortly after time T1), the $ISO_{S0}$ signal is activated high (1.5V), thereby turning on n-channel transistors 801 and 802, such that the read voltages developed on bit lines $bl_{0,1}$ and $bl_{0,3}$ are applied to internal nodes INT0 and INT2, respectively. Thus, as illustrated by FIG. 27, the voltage on internal node INT0 begins to increase toward the logic '1' read bit line voltage of 169/121/93 mV, and the voltage on internal node INT2 begins to increase toward 49/35/27 mV (in the worst case) due to adverse bit line coupling.

The voltages on nodes INT0 and INT2 are allowed to develop until time T3. By time T3, the voltages on bit line $bl_{0,1}$ and internal node INT0 have reached a read bit line voltage of at least 169/121/93 mV (described above), and the voltage on internal node INT2 reaches as high as 49/35/27 mV (worst case) due to adverse bit line coupling. At time T3, the pre-charge control signal $PRE_1$ is deactivated low, thereby turning off transistors N12 and N14, such that the internal nodes INT0# and INT2# are no longer actively driven to the reference voltage Vref of 109/78/60 mV.

Also at time T3, the $ISO_{S0}$ signal is deactivated low (0V), thereby turning off n-channel transistors 801 and 802, temporarily isolating bit lines $bl_{0,1}$ and $bl_{0,3}$ from the internal nodes INT0 and INT2, respectively.

At time T4 (immediately after de-activating the pre-charge control signal $PRE_1$ and the $ISO_{S0}$ signals), the PCOM signal is activated to the logic high bit cell voltage (983/985/973 mV), thereby activating the single ended sense amplifier circuits $SA_{0,1}$ and $SA_{0,3}$. Under these conditions, sense amplifier circuit $SA'_{0,1}$ amplifies the voltage difference between the signals on internal nodes INT0 and INT0#, and sense amplifier circuit $SA_{0,3}$ amplifies the voltage difference between the signals on internal nodes INT2 and INT2#. In the illustrated example, the voltage on internal node INT0 is at least 169/121/93 mV, and the reference voltage on node INT0# is 109/78/60 mV (for a ΔV of 60/43/33 mV). Within single-ended sense amplifier $SA'_{0,1}$, the relatively low voltage on internal node INT0# causes transistor P2 to turn on first as the PCOM voltage transitions high, which increases the differential voltage between internal nodes INT0 and INT0#, until the voltage on internal node INT0 becomes high enough to cause transistor N1 to turn on.

As a result, the voltage on internal node INT0 is pulled up to the full PCOM voltage of 983/985/973 mV, and the voltage on node INT0# is pulled down to ground (0V). Note that during this initial sensing phase, it is important to balance the capacitances of internal nodes INT0 and INT0#. Turning off isolation transistor 801 during this initial sensing phase temporarily decouples the capacitance of bit line $bl_{0,1}$ from internal node INT0, such that the capacitance of internal node INT0 more nearly matches the capacitance of INT0# during this initial sensing phase.

Similarly, sense amplifier circuit $SA_{0,3}$ amplifies the voltage difference between the signals on internal nodes INT2 and INT2#. In the illustrated example, the voltage on internal node INT2 is 49/35/27 mV due to worst case adverse bit line coupling of adjacent logic '1' bit lines, and the reference voltage on internal node INT2# is 109/78/60 mV (for a ΔV of 60/43/33 mV). Within single-ended sense amplifier $SA_{0,3}$, the relatively low voltage on internal node INT2 causes transistor P3 to turn on first as the PCOM voltage transitions high, which increases the differential voltage between internal nodes INT2 and INT2#, until the voltage on the internal node INT2# becomes high enough to cause transistor N4 to turn on. As a result, the voltage on internal node INT2# is pulled up to the full PCOM voltage of 983/985/973 mV, and the voltage on node INT2 is pulled down to ground (0V).

At time T5 (after a full signal swing of 983/985/973 mV is developed across each pair of internal nodes INT0/INT0# and INT2/INT2#), the $ISO_{S0}$ signal is re-activated high (1.5V), thereby turning on isolation transistors 801 and 802 and re-coupling bit lines $bl_{0,1}$ and $bl_{0,3}$ to internal nodes INT0 and INT2, respectively. Under these conditions, bit lines $bl_{0,1}$ and $bl_{0,3}$ are driven to 983/985/973 mV and 0V, respectively, thereby refreshing the data values in the corresponding bit cells $bc_{0,1}$ and $bc_{0,3}$, respectively. Although the example of FIG. 27 shows that the isolation transistors 801 and 802 are re-activated after the full signal swing of 983/985/973 mV has been developed across each pair of internal nodes INT0/INT0# and INT2/INT2#, in an alternate embodiment, the isolation transistors 801 and 802 are re-activated when the signal swing across each pair of internal nodes is less than the full signal swing of 983/985/973 mV, but large enough to overcome the capacitances introduced by bit lines $bl_{0,1}$ and $bl_{0,3}$ when the isolation transistors 801 and 802 are re-activated. Also at time T5, the reference voltage signal Vref is driven to ground (for power savings).

At time T6, the sub-word line $SWL_{0,0}$ is deactivated, thereby turning off the access transistors of bit cells $bc_{0,1}$ and $bc_{0,3}$ (isolating the bit lines $bl_{0,1}$ and $bl_{0,3}$ from the cell capacitors of bit cells $bc_{0,1}$ and $bc_{0,3}$). At this time, the data values read from bit cells $bc_{0,1}$ and $bc_{0,3}$ have been restored to these bit cells.

At time T7, the PCOM control signal is driven to ground. As a result, the INT0 and INT2# voltages are also driven to ground. At this time, the INT0 node is still coupled to bit line $bl_{0,1}$ (through isolation transistor 801), so the voltage on bit line $bl_{0,1}$ is also driven to ground. Bit line $bl_{0,3}$ remains at ground during this time, such that bit lines $bl_{0,1}$ and $bl_{0,3}$ are both pre-charged to ground.

At time T8, the $ISO_{S0}$ voltage is driven to ground, turning off isolation transistors 801 and 802, and isolating the primary sense amplifiers $SA'_{0,1}$ and $SA'_{0,3}$ from bit lines $bl_{0,1}$ and $bl_{0,3}$. At time T9, the pre-charge control voltages $PRE_0$ and $PRE_1$ are driven from ground to 1V to pre-charge the sense amplifiers $SA'_{0,1}$ and $SA'_{0,3}$, wherein INT0, INT0#, INT2 and INT2# are actively pulled to ground by transistors N11, N12, N13, and N14, respectively.

The single-ended sense amplifier specified by FIG. 27 provides bit line $CV^2f$ power savings of at least about 20% when compared with the conventional dual-ended sense amplifier, when reading a logic '1' value. That is, the bit line $CV^2f$ power of the single-ended sense amplifier of FIG. 27 divided by $CV^2f$ power of a dual-ended sense amplifier is at least equal to (0.985×0.985)/(1.1×1.1), or 0.80. The single-ended sense amplifier specified by FIG. 27 provides power savings of 100% when compared with a conventional dual-ended sense amplifier, when reading a logic '0' value (because the bit line being read is maintained at/near ground for the entire read operation, thereby consuming no/negligible power). Assuming that read operations, on average, include half logic '1' values and half logic '0' values, the single-ended sense amplifier specified by FIG. 27 achieves an average power savings of about 60% (100%×50+20%×50=60%), or a power reduction of about 2.5×, with respect to a conventional dual-ended sense amplifier.

Note that in the embodiment illustrated by FIG. 27, the isolation transistors 801-802 (as well as the transistor driving the sub-word line $SWL_{0,0}$) must be thick oxide transistors that can be overdriven such that the read voltages developed on the bit lines can be provided to the sense amplifier latches, and the full positive voltages developed by the sense amplifier latches can be driven onto the bit lines. Embodiments described below advantageously do not require the thick oxide transistors of the embodiment specified by FIG. 27.

First Alternate Embodiment

In a first alternate embodiment, the n-channel transistors N1-N4 and the p-channel transistors P1-P4 are fabricated in accordance with MST technology, which includes a superlattice channel extending between source and drain regions of these transistors. This technology is described in more detail in commonly owned U.S. Pat. Nos. 10,109,342 and 10,107,854, and commonly owned U.S. patent application Ser. No. 18/311,465, which are hereby incorporated by reference in their entirety. Fabricating transistors N1-N4 and P1-P4 with MST technology advantageously allows these transistors to exhibit more precisely defined threshold voltages. As a result, sense amplifiers that implement transistors fabricated with MST technology (hereinafter referred to as 'MST sense amplifiers') can more reliably detect a specific bit cell voltage. As a result, the variation of ΔV values capable of being reliably sensed by MST sense amplifiers $SA'_{0,1}$ and $SA'_{0,3}$ are significantly reduced (e.g., about half). Thus, while non-MST sense amplifiers (e.g., the sense amplifiers described above in connection with the embodiment of FIG. 27) may exhibit a ΔV value of 60/43/33 mV, MST sense amplifiers (e.g., the sense amplifiers described below in connection with the embodiment of FIG. 28) advantageously exhibit an improved ΔV value range of about 30/21/16 mV (for $C_B/C_S$ values of 4/6/8, respectively). That is, the MST sense amplifiers are able to reliably operate at a ΔV value range that is about half of the ΔV value range of a non-MST sense amplifier.

Figure 28:
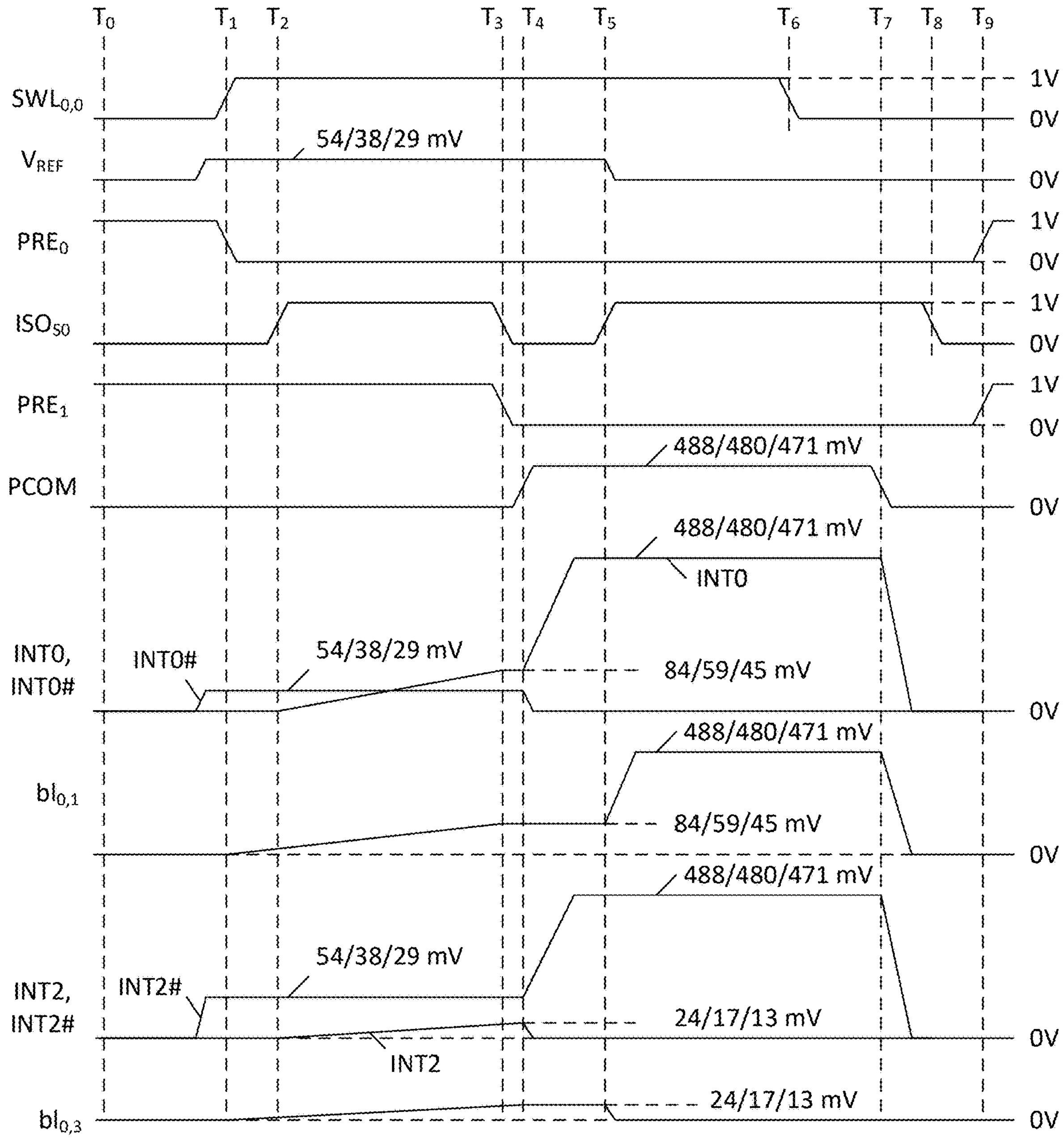
FIG. 28 is a waveform diagram illustrating signals associated with read accesses to bit cells coupled to single-ended sense amplifiers including MST transistors in accordance with a first alternate embodiment of the present invention.

FIG. 28 is a waveform diagram illustrating signals associated with read accesses to bit cells $bc_{0,1}$ and $bc_{0,3}$, in a first alternate embodiment wherein the n-channel transistors N1-N4 and p-channel transistors P1-P4 are fabricated to include superlattice channel in accordance with MST technology (i.e., sense amplifiers $SA'_{0,1}$ and $SA'_{0,3}$ are MST sense amplifiers).

The waveform diagram of FIG. 28 is similar to the waveform diagram of FIG. 27, with differences noted below. Because the waveform diagram of FIG. 28 corresponds with the use of MST sense amplifiers having a ΔV value of 30/21/16 mV, the nominal value of Vref should initially be 30/21/16 mV. Assuming 25% adverse bit line coupling from adjacent bit lines being pulled up to a logic '1' voltage level, the adjusted value of Vref can be calculated as 54/38/29 mV (over three iterations using the method described above). More specifically, the voltage level of a logic '0' read bit line can be pulled up from 0 Volts to 24/17/13 mV by adverse 25% bit line coupling, such that the adjusted value of Vref is equal to 30/21/16 mV+24/17/13 mV, or 54/38/29 mV (for $C_B/C_S$ values of 4/6/8, respectively).

When reading a logic '1' value from bit cell $bc_{0,1}$ (or $bc_{0,3}$), in order to obtain a ΔV value of 30/21/16 mV, the voltage developed on the read bit line should therefore be at least as great as the Vref reference voltage of 54/38/29 mV plus the ΔV value of 30/21/16 mV, or 84/59/45 mV at the end of the refresh interval.

The logic '1' read bit line voltage of 84/59/45 mV translates to bit cell voltages of 420/413/405 mV for $C_B/C_S$=4/6/8 (i.e., 84/59/45 mV×(1+Cb/Cs)=420/413/405 mV). In order to ensure a minimum bit cell voltage of 420/413/405 mV at the end of a refresh interval, the bit cell should initially be written to a bit cell voltage that is about 14% greater, or 488/480/471 mV. Because the logic '1' bit cell voltage is only 488/480/471 mV, the isolation transistors 801-802 (and the transistor driving the sub-word line voltage $SWL_{0,0}$) can be implemented conventional logic transistors, and do not need to be thick oxide transistors (as required in the embodiment of FIG. 27). In addition, the sub-word line voltage $SWL_{0,0}$ (and $ISO_{S0}$ and $ISO_{S1}$ voltages) can be reduced to a voltage of 1V or lower. More specifically, the sub-word line voltage $SWL_{0,0}$ (and $ISO_{S0}$ and $ISO_{S1}$ voltages) only needs to be high enough to ensure that the logic '1' bit cell voltage of 488/480/471 mV is written back to the bit cell.

The waveform diagram of FIG. 28 illustrates the adjusted reference voltage Vref of 54/38/29 mV, the adjusted worst case bit line coupling voltage of 24/17/13 mV, the logic '1' read bit line voltage of 84/59/45 mV, and the logic '1' bit cell voltage of 488/480/471 mV achieved due to the use of MST sense amplifiers. The timing of the various signals is the same as that described above in connection with the waveform diagram of FIG. 27.

The single-ended sense amplifier specified by FIG. 28 provides bit line $CV^2f$ power savings of about 80% when compared with the conventional dual-ended sense amplifier, when reading a logic '1' value. That is, the bit line $CV^2f$ power of the single-ended sense amplifier of FIG. 28 divided by $CV^2f$ power of a dual-ended sense amplifier is equal to at least (0.488×0.488)/(1.1×1.1), or 0.20. The single-ended sense amplifier specified by FIG. 28 provides power savings of 100% when compared with a conventional dual-ended sense amplifier, when reading a logic '0' value (because the bit line being read is maintained at/near ground for the entire read operation, thereby consuming no/negligible power). Assuming that read operations, on average, include half logic '1' values and half logic '0' values, the single-ended sense amplifier specified by FIG. 28 achieves an average power savings of 90% (100%×50+80%×50=90%), or a power reduction of about 10×, with respect to a conventional dual-ended sense amplifier.

Second Alternate Embodiment

Figure 29:
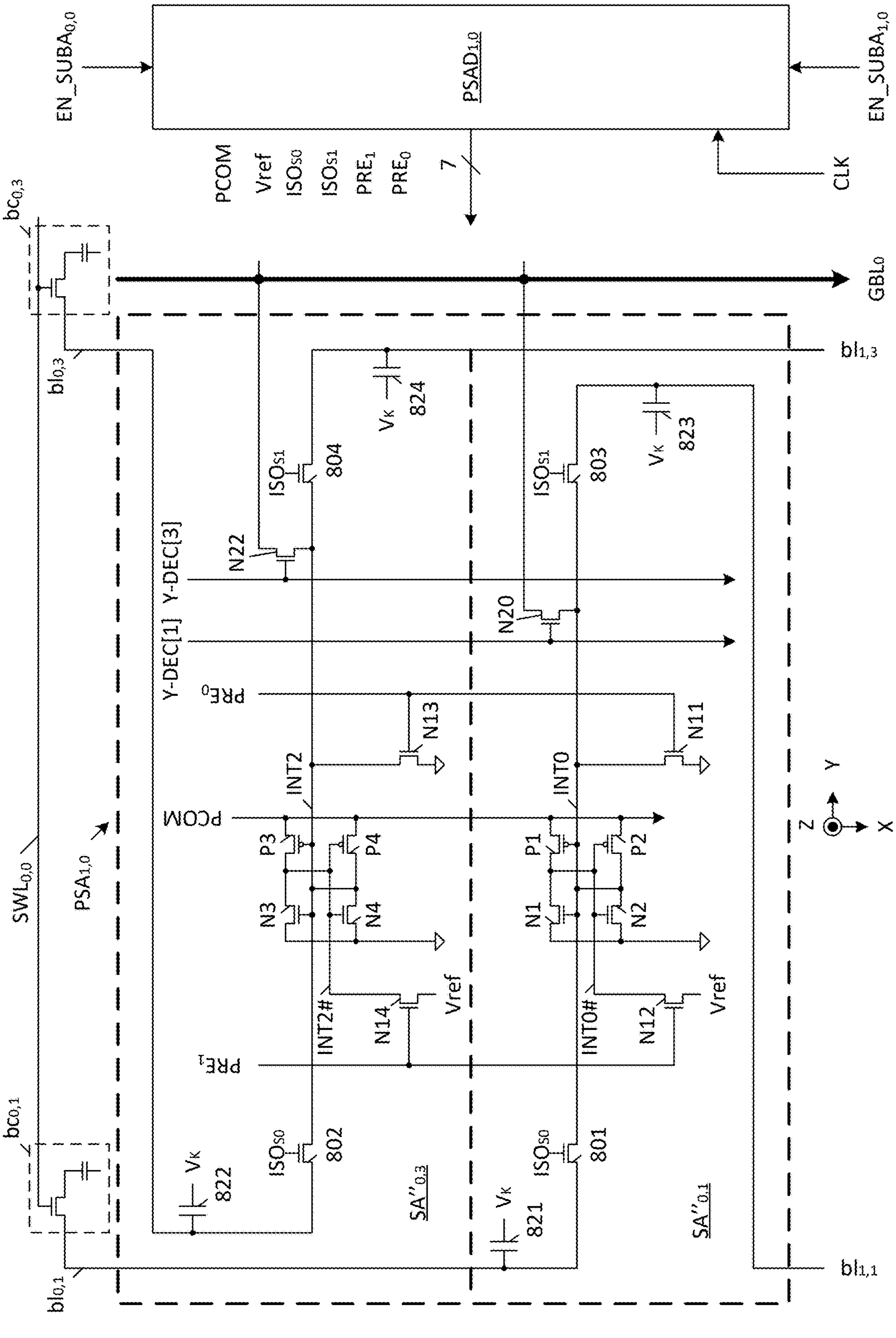
FIG. 29 is a circuit diagram of single-ended MST sense amplifiers including kick capacitors in accordance with a second alternate embodiment of the present invention.

FIG. 29 is a circuit diagram of single-ended MST sense amplifiers $SA''_{0,1}$ and $SA''_{0,3}$ in accordance with a second alternate embodiment of the present invention. Single-ended MST sense amplifiers $SA''_{0,1}$ and $SA''_{0,3}$ are similar to single-ended sense amplifiers $SA'_{0,1}$ and $SA'_{0,3}$ (FIG. 26), with differences noted below. Within single-ended MST sense amplifiers $SA''_{0,1}$ and $SA''_{0,3}$, n-channel transistors N1-N4 and the p-channel transistors P1-P4 are fabricated in accordance with MST technology (i.e., with superlattice channels extending between the source and drain regions of these transistors), such that the single-ended MST sense amplifiers $SA''_{0,1}$ and $SA''_{0,3}$ exhibit a ΔV value range of 30/21/16 mV (in the manner described above in connection with FIG. 28). In addition, single-ended MST sense amplifiers $SA''_{0,1}$ and $SA''_{0,3}$ include kick capacitors 821, 822, 823 and 824, which are coupled to bit lines $bl_{0,1}$, $bl_{0,3}$, $bl_{1,1}$ and $bl_{1,3}$, respectively.

Figure 30:
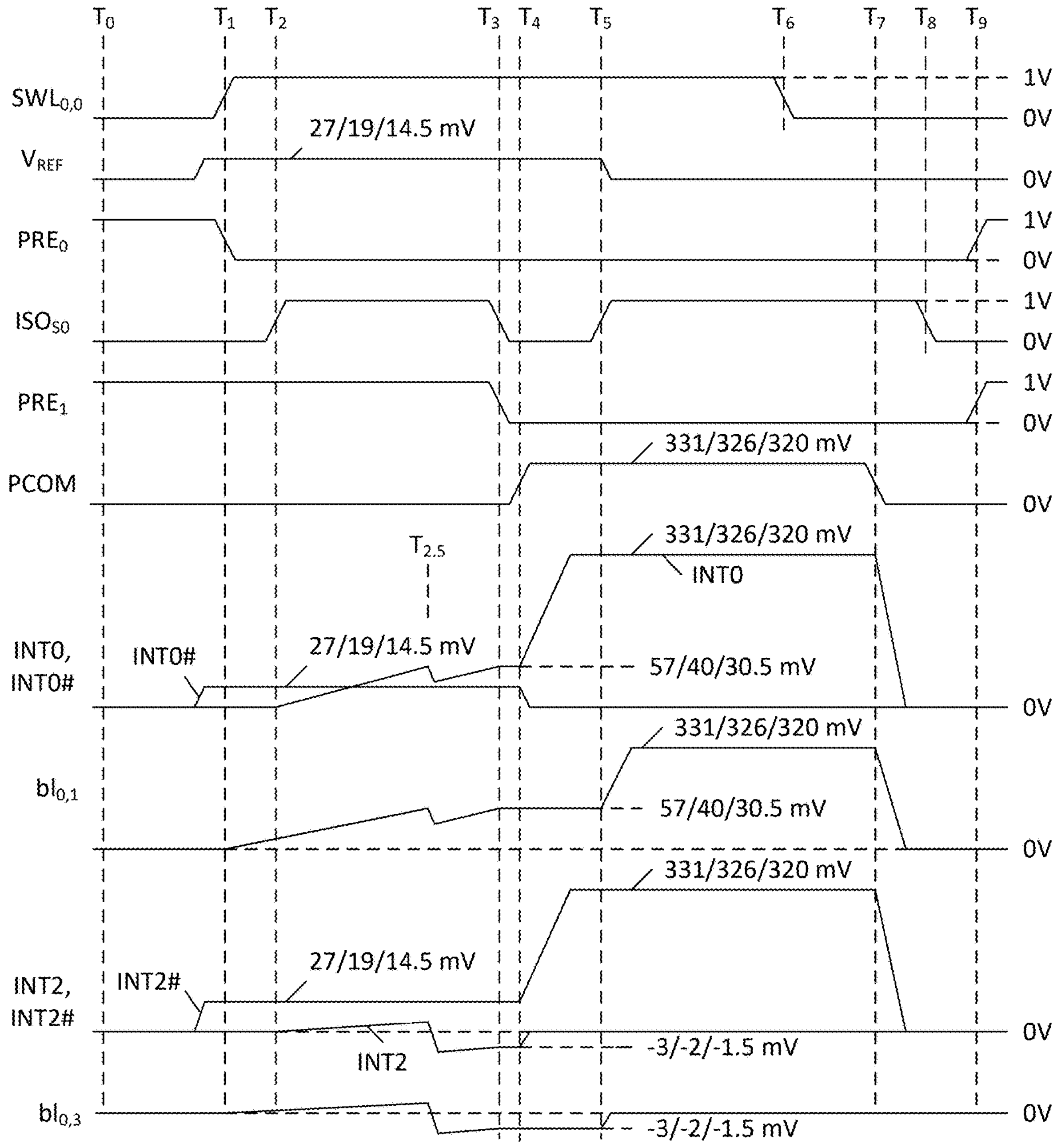
FIG. 30 is a waveform diagram illustrating signals associated with read accesses to bit cells coupled to the single-ended sense amplifiers of FIG. 29 in accordance with the second alternate embodiment of the present invention.

FIG. 30 is a waveform diagram illustrating signals associated with read accesses to bit cells $bc_{0,1}$ and $bc_{0,3}$ in single-ended MST sense amplifiers $SA''_{0,1}$ and $SA''_{0,3}$ in accordance with the second alternate embodiment of the present invention. The waveform diagram of FIG. 30 is similar to the waveform diagram of FIG. 28, with differences noted below.

Because the waveform diagram of FIG. 28 corresponds with the use of MST sense amplifiers having a ΔV value of 30/21/16 mV, the nominal value of Vref should initially be 30/21/16 mV. Assuming 25% adverse bit line coupling from adjacent bit lines being pulled up to a logic '1' voltage level, the adjusted value of Vref can be calculated as 54/38/29 mV (over three iterations using the method described above). More specifically, the voltage level of a logic '0' read bit line can be pulled up from 0 Volts to 24/17/13 mV by adverse 25% bit line coupling, such that the adjusted value of Vref is equal to 30/21/16 mV+24/17/13 mV, or 54/38/29 mV (for CB/Cs values of 4/6/8, respectively).

Moreover, in the embodiment of FIGS. 29-30, each of the kick capacitors 821-824 is designed to kick down the voltage on the associated bit lines by half of the adjusted Vref reference voltage of 54/38/29 mV during read operations. More specifically, kick capacitors 821 and 822 are selected to kick down the voltages on bit lines $bl_{0,1}$ and $bl_{0,3}$, respectively, by −27/−19/−14.5 mV during read accesses to bit cells $bc_{0,1}$ and $bc_{0,3}$. As a result, the reference voltage Vref required by the single-ended MST sense amplifiers $SA''_{0,1}$ and $SA''_{0,3}$ is similarly reduced from 54/38/29 mV to 27/19/14.5 mV (i.e., 54/38/29 mV−27/19/14.5 mV=27/19/14.5 mV). In the embodiment of FIGS. 29-30, the kick capacitors are controlled to kick down the voltages on bit lines $bl_{0,1}$ and $bl_{0,3}$ between time T2 and time T3 (i.e., at time T2.5). In one embodiment, the kick capacitors are switched on as close to time T3 as possible.

Given a reference voltage Vref of 27/19/14.5 mV, the logic '1' bit line read voltage required by the single-ended MST sense amplifiers $SA''_{0,1}$ and $SA''_{0,3}$ to obtain a ΔV value range of 30/21/16 mV is 57/40/30.5 mV (i.e., 30/21/16 mV+27/19/14.5 mV=57/40/30.5 mV). These logic '1' bit line read voltages are illustrated in FIG. 30. Note that these logic '1' bit line read voltages provide the appropriate ΔV value of 30/21/16 mV when compared to the reference voltage Vref of 27/19/14.5 mV.

The logic '1' bit line read voltage of 57/40/30.5 mV translates to bit cell voltages of 285/280/275 mV for $C_B/C_S$=4/6/8 (i.e., 57/40/30.5 mV×(1+Cb/Cs)=285/280/275 mV). In order to ensure a minimum bit cell voltage of 285/280/275 mV at the end of a refresh interval, the bit cell should initially be written to a bit cell voltage that is about 14% greater, or 331/326/320 mV. Because the logic '1' bit cell voltage is only 331/326/320 mV, the isolation transistors 801-802 (and the transistor driving the sub-word line voltage $SWL_{0,0}$) can be implemented conventional logic transistors, and do not need to be thick oxide transistors (as required in the embodiment of FIG. 27). In addition, the sub-word line voltage $SWL_{0,0}$ (and the $ISO_{S0}$ and $ISO_{S1}$ voltages) can be reduced to a voltage of 1V or lower. More specifically, the sub-word line voltage $SWL_{0,0}$ (and the $ISO_{S0}$ and $ISO_{S1}$ voltages) only needs to be high enough to ensure that the logic '1' bit cell voltage of 331/326/320 mV is written to the bit cell.

As described above, the voltage level of a logic '0' bit line (e.g., bit line $bl_{0,3}$ in the example of FIG. 29) can be pulled up from 0 Volts to 24/17/13 mV due to adverse 25% bit line coupling. Because the kick capacitor 822 kicks down the voltages on bit line $bl_{0,3}$ by −27/19/14.5 mV a during read access to bit cells $bc_{0,3}$, the logic '0' bit line read voltage is adjusted to −3/−2/−1.5 mV (i.e., 24/17/13 mV−27/19/14.5 mV=−3/−2/−1.5 mV). These logic '0' bit line read voltages are illustrated in FIG. 30. Note that these logic '0' bit line read voltages provide the appropriate ΔV value of 30/21/16 mV when compared to the reference voltage Vref of 27/19/14.5 mV. Because there is no/negligible current flow on bit lines reading a logic '0' value (because the bit lines are pre-charged to 0V, and remain near 0V during a read operation), there is no significant adverse bit line coupling associated with bit lines reading a logic '1' value.

The single-ended sense amplifier specified by FIGS. 29-30 provides bit line $CV^2f$ power savings of at least about 91% when compared with the conventional dual-ended sense amplifier, when reading a logic '1' value. That is, the bit line $CV^2f$ power of the single-ended sense amplifier of FIG. 30 divided by $CV^2f$ power of a dual-ended sense amplifier is at least (0.331×0.331)/(1.1×1.1), or 0.091. The single-ended sense amplifier specified by FIG. 30 provides power savings of 100% when compared with a conventional dual-ended sense amplifier, when reading a logic '0' value (because the bit line being read is maintained near ground for the entire read operation, thereby consuming no/negligible power). Assuming that read operations, on average, include half logic '1' values and half logic '0' values, the single-ended sense amplifier specified by FIG. 30 achieves an average power savings of 95.5% (100%×50+91%×50=95.5%), or a power reduction of about 22×, with respect to a conventional dual-ended sense amplifier.

Note that the single-ended sense amplifiers $SA''_{0,1}$ and $SA''_{0,3}$ of FIGS. 29-30 are controlled in a manner similar to the single-ended sense amplifiers $SA'_{0,1}$ and $SA'_{0,3}$ of FIGS. 26-28. That is, the timing of the $SWL_{0,0}$, Vref, $PRE_0$, $ISO_{S0}$, $PRE_1$ and PCOM signals is consistent throughout the operation of these single-ended sense amplifiers.

Third Alternate Embodiment

Figure 31:
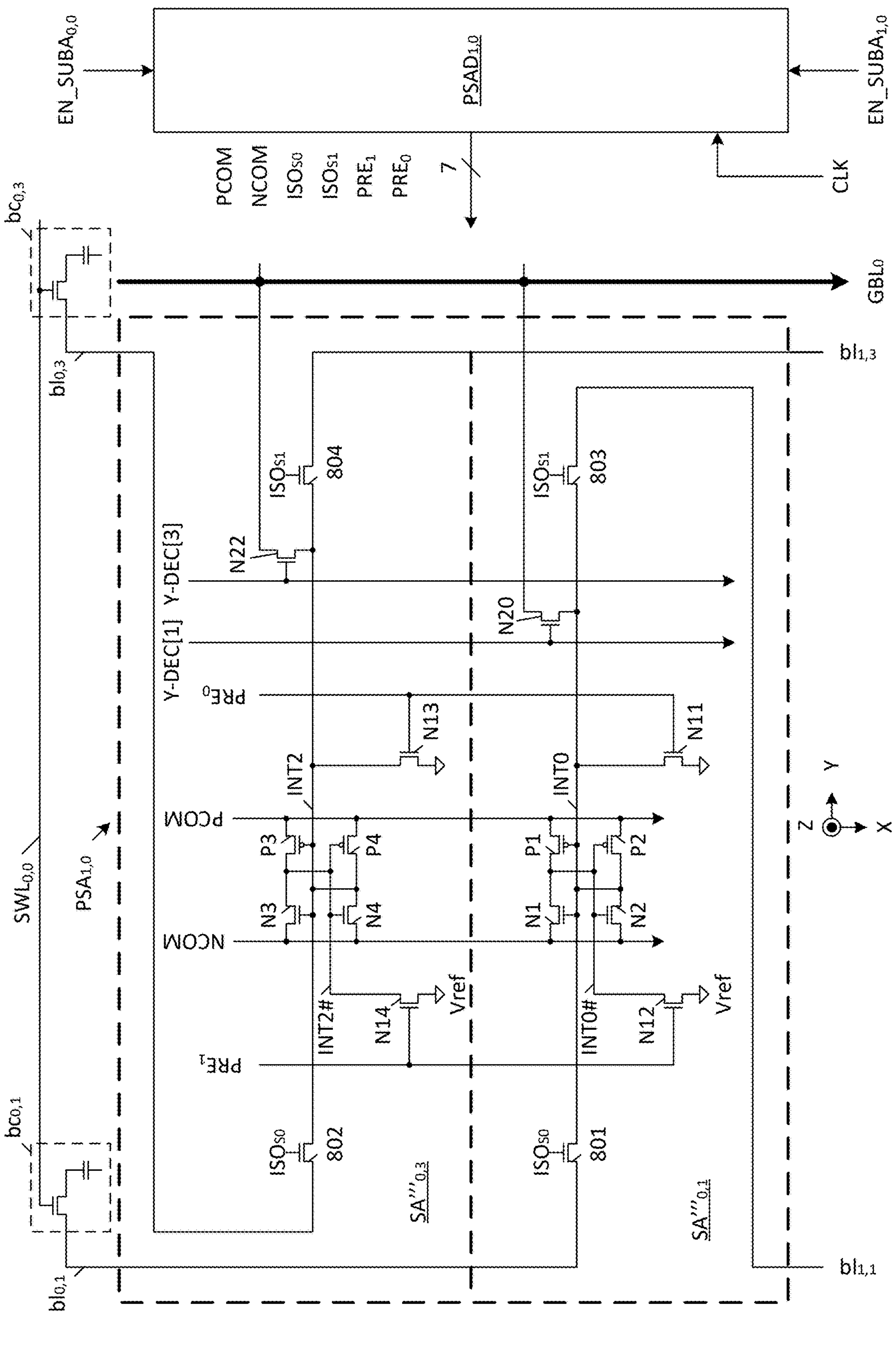
FIG. 31 is a circuit diagram of single-ended MST sense amplifiers including a grounded reference voltage and a negative logic ‘0’ bit cell voltage in accordance with a third alternate embodiment of the present invention.

FIG. 31 is a circuit diagram of single-ended MST sense amplifiers $SA'''_{0,1}$ and $SA'''_{0,3}$ in accordance with a third alternate embodiment of the present invention. Single-ended MST sense amplifiers $SA'''_{0,1}$ and $SA'''_{0,3}$ are similar to single-ended sense amplifiers $SA'_{0,1}$ and $SA'_{0,3}$ (FIG. 26), with similarities and differences noted below.

Within single-ended MST sense amplifiers $SA'''_{0,1}$ and $SA'''_{0,3}$, n-channel transistors N1-N4 and the p-channel transistors P1-P4 are fabricated in accordance with MST technology (including superlattice channels that extend between source and drain regions of these transistors), such that the single-ended MST sense amplifiers $SA'''_{0,1}$ and $SA'''_{0,3}$ exhibit a ΔV value range of 30/21/16 mV (for $C_B/C_S$=4/6/8, respectively).

Figure 32:
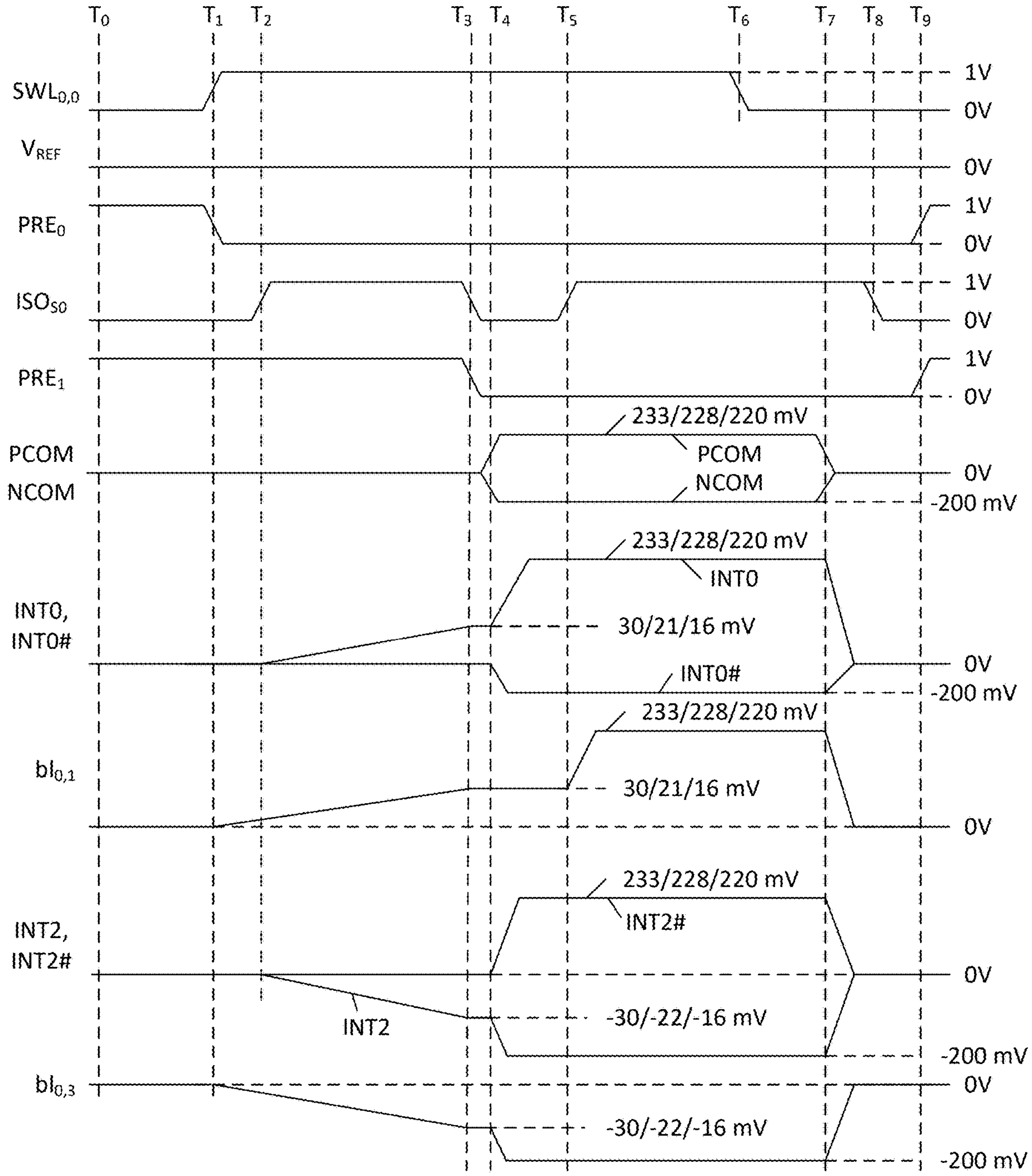
FIG. 32 is a waveform diagram illustrating signals associated with read accesses to bit cells coupled to the single-ended sense amplifiers of FIG. 31 in accordance with the third alternate embodiment of the present invention.

Within single-ended sense amplifiers $SA'''_{0,1}$ and $SA'''_{0,3}$, the reference voltage Vref is set to ground (0V), and the sources of n-channel transistors N1-N4 are coupled to receive an NCOM control signal from primary sense amplifier driver $PSAD_{1,0}$ (rather than ground). In addition, the logic '0' bit cell voltage is set to −200 mV (instead of 0V). As shown in FIG. 32, the logic '0' bit cell voltage of −200 mV is achieved by pulling the NCOM control signal down to −200 mV during the sensing operations.

FIG. 32 is a waveform diagram illustrating signals associated with read accesses to bit cells $bc_{0,1}$ and $bc_{0,3}$ in single-ended MST sense amplifiers $SA'''_{0,1}$ and $SA'''_{0,3}$ in accordance with the third alternate embodiment of the present invention. The waveform diagram of FIG. 32 is similar to the waveform diagram of FIG. 28, with differences noted below.

Having specified a nominal '0' bit cell voltage of −200 mV, nominal logic '0' read bit line voltages are −40/−29/−22 mV for $C_B/C_S$ values of 4/6/8 (i.e., −200 mV÷(1+$C_B/C_S$)=−40/−29/−22 mV for $C_B/C_S$ values of 4/6/8). Assuming that a bit line reading a logic '0' value experiences 25% adverse bit line coupling from a plurality of adjacent bit lines reading logic '1' values, a bit line reading a logic '0' value may be pulled up by 10/7/6 mV (i.e., 40/29/22 mV×0.25) That is, a logic '0' read bit line voltage will be pulled up to −30/−22/−16 mV. Note that with the reference voltage Vref set at 0 Volts, the logic '0' read bit line voltages of −30/−22/−16 mV meet the specified ΔV values of the single-ended sense amplifiers $SA'''_{0,1}$ and $SA'''_{0,3}$ (i.e., ΔV=30/21/16 mV).

As described above, the reference voltage Vref is set to ground in the present embodiment. In order to obtain a ΔV value of 30/21/16 mV for a logic '1' read data value, the nominal value of a logic '1' value read on the bit line $bl_{0,1}$ (or $bl_{0,3}$) should at least be equal to 30/21/16 mV (i.e., 0 mV+30/21/16 mV=30/21/16 mV). Assuming 25% adverse bit line coupling from adjacent bit lines being pulled down to a logic '0' read value (i.e., a negative voltage level), the nominal value of a logic '1' value read on the bit line $bl_{0,1}$ (or $bl_{0,3}$) should therefore be adjusted to 40/28/21 mV (i.e., 30/21/16 mV divided by 0.75=40/28/21 mV) to compensate for this adverse bit line coupling. A logic '1' bit line voltage of 40/28/21 mV translates to bit cell voltages of 200/196/189 mV for $C_B/C_S$ values of 4/6/8 (i.e., 40/28/21 mV×(1+$C_B/C_S$)=200/196/189 mV). In order to ensure a minimum bit cell voltage of 200/196/189 mV at the end of a refresh interval, the bit cell should initially be written to a bit cell voltage that is about 14% greater, or 233/228/220 mV. Because the logic '1' bit cell voltage is only 233/228/220 mV, the isolation transistors 801-802 (and the transistor driving the sub-word line voltage $SWL_{0,0}$) can be implemented conventional logic transistors, and do not need to be thick oxide transistors. More specifically, the sub-word line voltage $SWL_{0,0}$ (and $ISO_{S0}$ and $ISO_{S1}$ voltages) only needs to be high enough to ensure that the logic '1' bit cell voltage of 233/228/220 mV is written to the bit cell.

The single-ended sense amplifier specified by FIGS. 31-32 provides bit line $CV^2f$ power savings of about 95.5% when reading a logic '1' value (compared with the conventional dual-ended sense amplifier). That is, the logic '1' bit line $CV^2f$ power of the single-ended sense amplifier of FIG. 30 divided by the logic '1' bit line $CV^2f$ power of a dual-ended sense amplifier is equal to (0.233×0.233)/(1.1×1.1), or 0.045.

The single-ended sense amplifier specified by FIGS. 31-32 provides bit line $CV^2f$ power savings of about 96.7% when reading a logic '0' value (compared with the conventional dual-ended sense amplifier). That is, the logic '0' bit line $CV^2f$ power of the single-ended sense amplifier of FIG. 30 divided by the logic '0' bit line $CV^2f$ power of a dual-ended sense amplifier is equal to (−0.200×−0.200)/(1.1'1.1), or 0.033.

Assuming that read operations, on average, include half logic '1' values and half logic '0' values, the single-ended sense amplifier specified by FIG. 31 achieves an average power savings of 96.1% (95.5%×50+96.7%×50=96.1%), or a power reduction of about 26×, with respect to a conventional dual-ended sense amplifier.

Note that the single-ended sense amplifiers $SA'''_{0,1}$ and $SA'''_{0,3}$ of FIGS. 30-31 are controlled in a manner similar to the single-ended sense amplifiers $SA'_{0,1}$ and $SA'_{0,3}$ of FIGS. 26-28. That is, the timing of the $SWL_{0,0}$, $PRE_0$, $ISO_{S0}$, $PRE_1$ and PCOM signals is consistent throughout the operation of these single-ended sense amplifiers. Note that when the single-ended sense amplifiers $SA'''_{0,1}$ and $SA'''_{0,3}$ are enabled at time T4 (i.e., when the PCOM signal is driven from 0V to 233/228/220 mV), the NCOM signal is driven from 0V down to a negative voltage of −200 mV. This advantageously allows the INT2 node and the bit line $bl_{0,3}$ to be driven to −200 mV to properly refresh the bit cell voltage of bit cell $bc_{0,3}$.

Fourth Alternate Embodiment

Figure 33:
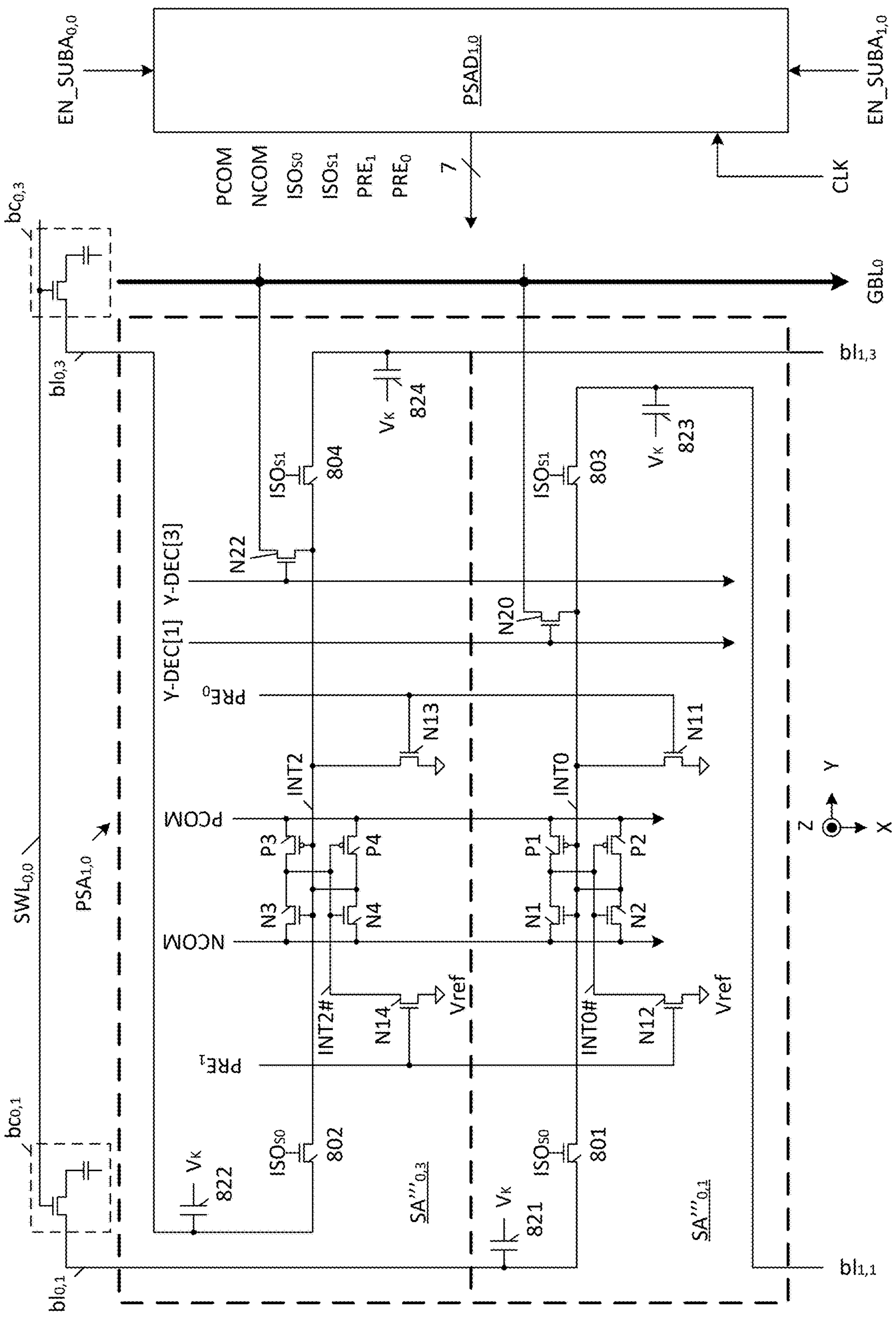
FIG. 33 is a circuit diagram of single-ended MST sense amplifiers including a grounded reference voltage, a negative logic ‘0’ bit cell voltage and kick capacitors in accordance with a fourth alternate embodiment of the present invention.

FIG. 33 is a circuit diagram of single-ended MST sense amplifiers $SA''''_{0,1}$ and $SA''''_{0,3}$ in accordance with a fourth alternate embodiment of the present invention. Single-ended MST sense amplifiers $SA''''_{0,1}$ and $SA''''_{0,3}$ are similar to single-ended sense amplifiers $SA'''_{0,1}$ and $SA'''_{0,3}$ (FIG. 31), with similarities and differences noted below.

Within single-ended MST sense amplifiers $SA''''_{0,1}$ and $SA''''_{0,3}$, n-channel transistors N1-N4 and the p-channel transistors P1-P4 are fabricated in accordance with MST technology (including superlattice channels that extend between source and drain regions of these transistors), such that the single-ended MST sense amplifiers $SA''''_{0,1}$ and $SA''''_{0,3}$ exhibit a ΔV value range of 30/21/16 mV.

Within single-ended sense amplifiers $SA''''_{0,1}$ and $SA''''_{0,3}$, the reference voltage Vref is set to ground (0V), and the NCOM control signal is pulled down to −100 mV (instead of −200 mV) to activate the single-ended sense amplifiers $SA''''_{0,1}$ and $SA''''_{0,3}$. Thus, the logic '0' bit cell voltage is set to −100 mV (instead of −200 mV).

In addition, single-ended MST sense amplifiers $SA''''_{0,1}$ and $SA''''_{0,3}$ include kick capacitors 821, 822, 823 and 824, which are coupled to bit lines $bl_{0,1}$, $bl_{0,3}$, $bl_{1,1}$ and $bl_{1,3}$, respectively. As described in more detail below, each of the kick capacitors 821-824 is designed to kick down the voltage on the associated bit lines during read operations.

Figure 34:
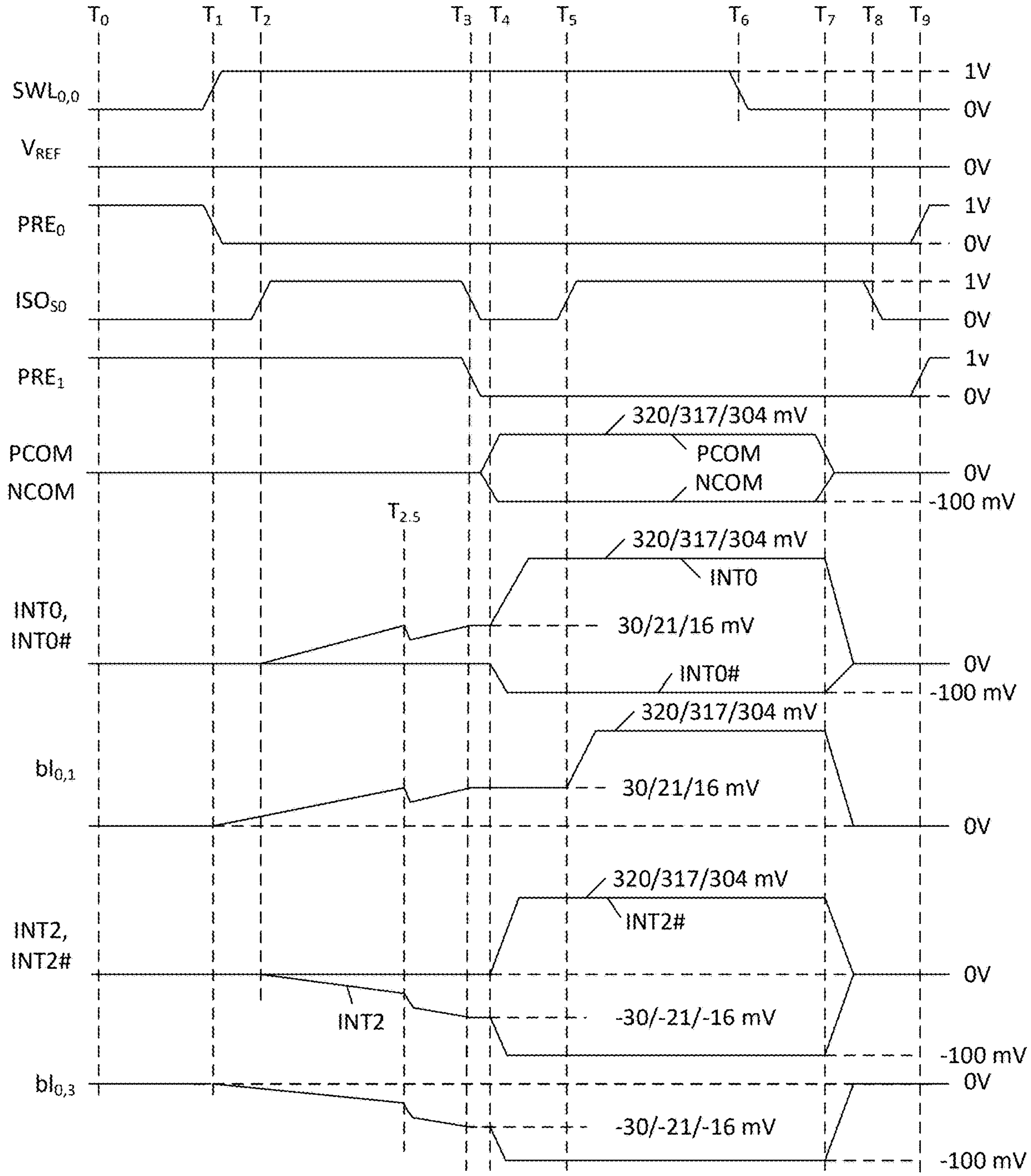
FIG. 34 is a waveform diagram illustrating signals associated with read accesses to bit cells coupled to the single-ended sense amplifiers of FIG. 33 in accordance with the fourth alternate embodiment of the present invention.

FIG. 34 is a waveform diagram illustrating signals associated with read accesses to bit cells $bc_{0,1}$ and $bc_{0,3}$ in single-ended MST sense amplifiers $SA''''_{0,1}$ and $SA''''_{0,3}$ in accordance with the fourth alternate embodiment of the present invention. The waveform diagram of FIG. 34 is similar to the waveform diagram of FIG. 32, with differences noted below.

Having specified a nominal '0' bit cell voltage of −100 mV, nominal logic '0' read bit line voltages are −20/−14/−11 mV for $C_B/C_S$ values of 4/6/8 (i.e., −100 mV÷(1+$C_B/C_S$)=−20/−14/−11 mV for $C_B/C_S$ values of 4/6/8). Assuming that a bit line reading a logic '0' value experiences 25% adverse bit line coupling from a plurality of adjacent bit lines reading logic '1' values, a bit line reading a logic '0' value may be pulled up by 5/4/3 mV (i.e., 20/14/11 mV×0.25) That is, a logic '0' read bit line voltage will be pulled up to −15/−10/−8 mV. Note that with a reference voltage Vref equal to 0 Volts, these logic '0' read bit line voltages do not meet the specified ΔV values of the single-ended sense amplifiers $SA''''_{0,1}$ and $SA''''_{0,3}$ (i.e., ΔV=30/21/16 mV). In order to obtain the ΔV values of 30/21/16 mV required to read a logic '0' read data value, the switched kick capacitors 821-822 are activated to kick the voltages on the corresponding bit lines $bl_{0,1}$ and $bl_{0,3}$ down by −15/−11/−8 mV for $C_B/C_S$ values of 4/6/8, respectively. As a result, the logic '0' bit line voltage is kicked down from −15/−10/−8 mV to −30/−21/−16 mV (i.e., −15/−10/−8 mV−15/11/8 mV=−30/−21/−16 mV), thereby meeting the specified ΔV values of the single-ended sense amplifiers $SA''''_{0,1}$ and $SA''''_{0,3}$ (i.e., ΔV=30/21/16 mV). In the embodiment of FIGS. 33-34, the kick capacitors 821-822 are controlled to kick the voltages on bit lines $bl_{0,1}$ and $bl_{0,3}$ between time T2 and time T3 (i.e., at time T2.5). In one embodiment, the kick capacitors are switched on as close to time T3 as possible.

As described above, the reference voltage Vref is set to ground in the present embodiment. In order to obtain a ΔV value of 30/21/16 mV for a logic '1' read data value, the nominal value of a logic '1' value read on the bit line $bl_{0,1}$ (or $bl_{0,3}$) should at least be equal to 30/21/16 mV (i.e., 0 mV+30/21/16 mV=30/21/16 mV). Assuming 25% adverse bit line coupling from adjacent bit lines being pulled down to a logic '0' read value (i.e., a negative voltage level), the nominal value of a logic '1' value read on the bit line $bl_{0,1}$ (or $bl_{0,3}$) should therefore be adjusted to 40/28/21 mV (i.e., 30/21/16 mV divided by 0.75=40/28/21 mV) to compensate for this adverse bit line coupling. The nominal value of a logic '1' value read on the bit line $bl_{0,1}$ (or $bl_{0,3}$) should also be adjusted upward by 15/11/8 mV to compensate for the kick down voltages applied by kick capacitors 821-822. More specifically, the nominal value of a logic '1' value read on the bit line $bl_{0,1}$ (or $bl_{0,3}$) should therefore be adjusted to 55/39/29 mV (i.e., 40/28/21 mV+15/11/8 mV=55/39/29 mV) to compensate for kick capacitor voltages.

A logic '1' bit line voltage of 55/39/29 mV translates to bit cell voltages of 275/273/261 mV for $C_B/C_S$ values of 4/6/8 (i.e., 55/39/29 mV×(1+$C_B/C_S$)=275/273/261 mV). In order to ensure a minimum bit cell voltage of 275/273/261 mV at the end of a refresh interval, the bit cell should initially be written to a bit cell voltage that is about 14% greater, or 320/317/304 mV. Because the logic '1' bit cell voltage is only 320/317/304 mV, the isolation transistors 801-802 (and the transistor driving the sub-word line voltage $SWL_{0,0}$) can be implemented conventional logic transistors, and do not need to be thick oxide transistors. More specifically, the sub-word line voltage $SWL_{0,0}$ (and $ISO_{S0}$ and $ISO_{S1}$ voltages) only needs to be high enough to ensure that the logic '1' bit cell voltage of 320/317/304 mV is written to the bit cell.

The single-ended sense amplifier specified by FIGS. 33-34 provides bit line $CV^2f$ power savings of about 91.5% when reading a logic '1' value (compared with the conventional dual-ended sense amplifier). That is, the logic '1' bit line $CV^2f$ power of the single-ended sense amplifier of FIG. 30 divided by the logic '1' bit line $CV^2f$ power of a dual-ended sense amplifier is equal to (0.320×0.320)/(1.1×1.1), or 0.085.

The single-ended sense amplifier specified by FIGS. 31-32 provides bit line $CV^2f$ power savings of about 99.2% when reading a logic '0' value (compared with the conventional dual-ended sense amplifier). That is, the logic '0' bit line $CV^2f$ power of the single-ended sense amplifier of FIG. 30 divided by the logic '0' bit line $CV^2f$ power of a dual-ended sense amplifier is equal to (−0.100×−0.100)/(1.1×1.1), or 0.008.

Assuming that read operations, on average, include half logic '1' values and half logic '0' values, the single-ended sense amplifier specified by FIG. 31 achieves an average power savings of 95.4% (91.5%×50+99.2%×50=95.4%), or a power reduction of about 22×, with respect to a conventional dual-ended sense amplifier.

Note that the single-ended sense amplifiers $SA''''_{0,1}$ and $SA''''_{0,3}$ of FIGS. 33-34 are controlled in a manner similar to the single-ended sense amplifiers $SA''_{0,1}$ and $SA''_{0,3}$ of FIGS. 29-30. That is, the timing of the $SWL_{0,0}$, $PRE_0$, $ISO_{S0}$, $PRE_1$ and PCOM signals is consistent throughout the operation of these single-ended sense amplifiers. Note that when the single-ended sense amplifiers $SA''''_{0,1}$ and $SA''''_{0,3}$ are enabled at time T4 (i.e., when the PCOM signal is driven from 0V to 320/317/304 mV), the NCOM signal is driven from 0V down to a negative voltage of −100 mV. This advantageously allows the INT2 node and the bit line $bl_{0,3}$ to be driven to −100 mV to properly refresh the bit cell voltage of bit cell $bc_{0,3}$.

In the embodiments described above, the voltage required to be applied to the capacitor plate of the DRAM bit cells $bc_{0,1}$ and $bc_{0,3}$ (i.e., Vplate) is significantly reduced, because the logic '1' bit cell voltage is significantly reduced. In the embodiments described above, the bit cell voltage is reduced from 1.1V (for a conventional dual-ended sense amplifier) to about 985 mV (for the single-ended sense amplifier of FIGS. 26-27), about 488 mV (for the single-ended sense amplifier of FIG. 28), about 331 mV (for the single-ended sense amplifier of FIGS. 29-30), about 233 mV (for the single-ended sense amplifier of FIGS. 31-32), and about 320 mV (for the single-ended sense amplifier of FIGS. 33-34). Assuming capacitor plate voltage Vplate is half of the bit cell voltage, the capacitor plate voltage can be reduced from 550 mV (for a conventional dual-ended sense amplifier) to about 493 mV, 244 mV, 166 mV, 117 mV and 160 mV for the single-ended sense amplifiers of the above described embodiments. The reduced voltages across the DRAM bit cell capacitors may advantageously enable the use of different capacitor materials/structures within the DRAM bit cells. In addition, the single-ended sense amplifiers described above enable the fabrication of a DRAM bit cell having a $4F^2$ unit cell area because there are no dummy bit lines running through the bit cell array/sense amplifier region.

Although the invention has been described in connection with several embodiments, it is understood that this invention is not limited to the embodiments disclosed, but is capable of various modifications, which would be apparent to a person skilled in the art. Accordingly, the present invention is limited only by the following claims.

I claim:

1. A method of operating a single-ended sense amplifier comprising:

pre-charging a bit line to ground;

coupling a first internal node of a latch circuit to ground, and coupling a second internal node of the latch circuit to a reference voltage;

activating a word line voltage applied to a gate of an access transistor of a DRAM bit cell, thereby coupling a cell capacitor of the DRAM bit cell to the bit line, thereby developing a read voltage on the bit line, wherein the bit line is isolated from the latch circuit when the word line voltage is initially activated;

de-coupling the first internal node of the latch circuit from ground; then coupling the bit line to the first internal node of the latch circuit, wherein the read voltage developed on the bit line is applied to the first internal node of the latch circuit; then de-coupling the second internal node of the latch circuit from the reference voltage, and isolating the bit line from the first internal node of the latch circuit; then activating the latch circuit, wherein the activated latch circuit amplifies a difference between the read voltage on the first internal node of the latch circuit and the reference voltage on the second internal node of the latch circuit, resulting in a read data voltage being stored on the first internal node of the latch circuit; then re-coupling the bit line to the first internal node of the latch circuit, wherein the read data voltage on the first internal node of the latch circuit is applied to the bit line.

2. The method of claim 1, wherein the latch circuit comprises:

a first transistor having a source coupled to a first voltage supply node, a gate coupled to the first internal node, and a drain coupled to the second internal node;

a second transistor having a source coupled to the first voltage supply node, a gate coupled to the second internal node, and a drain coupled to the first internal node;

a third transistor having a source coupled to a second voltage supply node, a gate coupled to the first internal node, and a drain coupled to the second internal node; and a fourth transistor having a source coupled to the second voltage supply node, a gate coupled to the second internal node, and a drain coupled to the first internal node, wherein activating the latch circuit comprises increasing a voltage applied to the first voltage supply node from ground to a positive bit cell voltage.

3. The method of claim 2, further comprising holding the second voltage supply node at ground.

4. The method of claim 3, further comprising, applying a control voltage to the second voltage supply node, wherein the control voltage transitions between ground and a negative voltage.

5. The method of claim 1, wherein the reference voltage is a positive voltage.

6. The method of claim 5, wherein the reference voltage is less than or equal to 109 mV.

7. The method of claim 5, wherein the reference voltage is less than or equal to 54 mV.

8. The method of claim 5, wherein the reference voltage is less than or equal to 27 mV.

9. The method of claim 5, further comprising applying a negative kick voltage to the bit line after coupling the bit line to the first internal node of the latch circuit, but before activating the latch circuit.

10. The method of claim 1, wherein the reference voltage is ground.

11. The method of claim 10, further comprising applying a negative kick voltage to the bit line after coupling the bit line to the first internal node of the latch circuit, but before activating the latch circuit.

12. The method of claim 1, wherein the read data voltage is a positive voltage less than or equal to 985 mV.

13. The method of claim 1, wherein the read data voltage is a positive voltage less than or equal to 488 mV.

14. The method of claim 1, wherein the read data voltage is a positive voltage less than or equal to 331 mV.

15. The method of claim 1, wherein the DRAM bit cell has a logic low bit cell voltage of 0 Volts, and the read voltage developed on the bit line has a maximum logic low voltage specified by the logic low bit cell voltage of 0 Volts plus a positive voltage coupling of the bit line with one or more adjacent bit lines when the DRAM bit cell has a logic low bit cell voltage, and wherein the reference voltage is selected such that the latch circuit reliably pulls the first internal node to ground when the first internal node is at the maximum logic low voltage and the second internal node is at the reference voltage.

16. The method of claim 15, wherein the difference between the maximum logic low voltage and the reference voltage is equal to a first voltage difference, wherein the DRAM bit cell has a logic high bit cell voltage corresponding with the read data voltage, wherein the read data voltage is selected such that the read voltage developed on the bit line has a minimum logic high voltage equal to or greater than the reference voltage plus the first voltage difference when the DRAM bit cell has a logic high bit cell voltage, wherein the latch circuit reliably pulls the first internal node to the read data voltage when the first internal node is at the minimum logic high voltage and the second internal node is at the reference voltage.

17. A single-ended sense amplifier comprising:

a latch circuit comprising:

a first transistor having a source coupled to a first voltage supply node, a gate coupled to a first internal node, and a drain coupled to a second internal node;

a second transistor having a source coupled to the first voltage supply node, a gate coupled to the second internal node, and a drain coupled to the first internal node;

a third transistor having a source coupled to a second voltage supply node, a gate coupled to the first internal node, and a drain coupled to the second internal node; and a fourth transistor having a source coupled to the second voltage supply node, a gate coupled to the second internal node, and a drain coupled to the first internal node;

a first pre-charge transistor having a drain coupled to the first internal node, a source coupled to receive a ground supply voltage and a gate coupled to receive a first pre-charge control signal;

a second pre-charge transistor having a drain coupled to the second internal node, a source coupled to receive a reference voltage, and a gate coupled to receive a second pre-charge control signal, different than the first pre-charge control signal; and a first isolation transistor coupling the first internal node to a first bit line, wherein the first bit line is further coupled to a first dynamic random access memory cell in a first DRAM array.

18. The single-ended sense amplifier of claim 17, wherein the second voltage supply node pulls the sources of the third and fourth transistors to ground.

19. The single-ended sense amplifier of claim 17, wherein a control voltage applied to the second voltage supply node transitions between ground and a negative voltage.

20. The single-ended sense amplifier of claim 17, wherein the reference voltage is a positive voltage.

21. The single-ended sense amplifier of claim 20, wherein the reference voltage is less than or equal to 109 mV.

22. The single-ended sense amplifier of claim 17, wherein the reference voltage is ground.

23. The single-ended sense amplifier of claim 17, wherein the first voltage supply node transitions between ground and 985 mV or less during a read access to the DRAM cell.

24. The single-ended sense amplifier of claim 17, wherein the latch circuit, the first pre-charge transistor, the second pre-charge transistor and the isolation transistor are the only circuit elements used to sense, amplify and latch a read voltage developed on the first bit line.

25. The single-ended sense amplifier of claim 17, further comprising a second isolation transistor coupling the first internal node to a second bit line, wherein the second bit line is further coupled to a second DRAM cell in a second DRAM array, wherein the first and second isolation transistors are not turned on at the same time.

26. The single-ended sense amplifier of claim 17, wherein the first, second, third and fourth transistors of the latch circuit each include a superlattice channel extending between source and drain regions of these transistors.

27. The single-ended sense amplifier of claim 17, further comprising a switched kick capacitor coupled to the first bit line.

28. The single-ended sense amplifier of claim 27, wherein the switched kick capacitor is activated to kick down a read voltage on the first bit line during a read access to the first DRAM cell.

29. The single-ended sense amplifier of claim 28, wherein the read voltage on the first bit line is negative if the first DRAM cell stores a logic low data value, and positive if the first DRAM cell stores a logic high data value.

30. The single-ended sense amplifier of claim 29, wherein the reference voltage is ground and the first DRAM cell has a negative bit cell voltage when storing a logic low data value.

* * * * *